US012805116B2

(12) United States Patent
Ohsawa et al.

(10) Patent No.: US 12,805,116 B2
(45) Date of Patent: Nov. 17, 2026

(54) LIGHT-EMITTING DEVICE, DISPLAY DEVICE, AND ELECTRONIC DEVICE

(71) Applicant: Semiconductor Energy Laboratory Co., Ltd., Atsugi (JP)

(72) Inventors: Nobuharu Ohsawa, Zama (JP); Hiromitsu Kido, Atsugi (JP); Satoshi Seo, Sagamihara (JP); Hideko Yoshizumi, Atsugi (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 253 days.

(21) Appl. No.: 18/382,079

(22) Filed: Oct. 20, 2023

(65) Prior Publication Data

US 2024/0172465 A1 May 23, 2024

(30) Foreign Application Priority Data

Oct. 28, 2022 (JP) ................................ 2022-173651

(51) Int. Cl.

*H10K 50/00* (2023.01)
*H10K 50/12* (2023.01)
*H10K 101/10* (2023.01)

(52) U.S. Cl.

CPC ....... *H10K 50/121* (2023.02); *H10K 2101/10* (2023.02)

(58) Field of Classification Search

CPC .. H10K 50/121; H10K 2101/10; H10K 50/11; H10K 85/649; H10K 85/351; H10K 50/00; H10K 2101/20

See application file for complete search history.

(56) References Cited

U.S. PATENT DOCUMENTS 12,195,655 B2 * 1/2025 Camardello ......... C09K 11/617
2010/0117521 A1 5/2010 Yersin et al.

(Continued)

FOREIGN PATENT DOCUMENTS

CN 107331783 A 11/2017
WO WO-2021/116234 6/2021

OTHER PUBLICATIONS

Turro.N et al., "The Franck-Condon Principle and Absorption Spectra of Organic Molecules13", Modern Molecular Photochemistry of Organic Molecules, Feb. 10, 2010, pp. 204-208, University Science Books.

(Continued)

*Primary Examiner* — Ismail A Muse
(74) *Attorney, Agent, or Firm* — Eric J. Robinson; Robinson Intellectual Property Law Office, P.C.

(57) ABSTRACT

A light-emitting device with high emission efficiency, reliability, and color purity is to be provided. The light-emitting device includes a first electrode, a second electrode, and an organic compound layer. The organic compound layer is between the first electrode and the second electrode and includes a light-emitting layer. The light-emitting layer includes a first substance and a second substance. The second substance causes light emission from a doublet excited state. The doublet excited level of the second substance is lower than the singlet excited level of the first substance and is higher than the triplet excited level of the first substance. The second substance emits light.

18 Claims, 34 Drawing Sheets

(56) References Cited

U.S. PATENT DOCUMENTS

| | | | | |
|---|---|---|---|---|
| 2013/0240933 | A1* | 9/2013 | Yamazaki | C09K 11/06 257/98 |
| 2019/0097152 | A1* | 3/2019 | Seo | H10K 85/342 |
| 2023/0109185 | A1* | 4/2023 | Friend | H10K 85/657 257/40 |
| 2023/0238768 | A1* | 7/2023 | Nitta | A61B 1/00105 372/43.01 |
| 2023/0282772 | A1* | 9/2023 | Seo | H10H 20/822 |
| 2024/0298455 | A1* | 9/2024 | Ohsawa | H10K 85/633 |
| 2025/0151610 | A1* | 5/2025 | Tsunoi | C09K 11/06 |

OTHER PUBLICATIONS

Wang.L et al., "Review on the Electroluminescence Study of Lanthanide Complexes", Adv. Optical Mater. (Advanced Optical Materials), Jun. 4, 2019, vol. 7, No. 11, pp. 1801256-1-1801256-49.

Zhan.G et al., "Highly Efficient and Air-Stable Lanthanide EuII Complex: New Emitter in Organic Light Emitting Diodes", Angew. Chem. Int. Ed. (Angewandte Chemie International Edition), Oct. 19, 2020, vol. 59, No. 43, pp. 19011-19015.

Tanaka.D et al., "Ultra High Efficiency Green Organic Light-Emitting Devices", Jpn. J. Appl. Phys. (Japanese Journal of Applied Physics) , Dec. 22, 2006, vol. 46, No. 1, pp. L10-L12, The Japan Society of Applied Physics.

Wang.L et al., "Deep-blue organic light-emitting diodes based on a doublet d-f transition cerium(III) complex with 100% exciton utilization efficiency", Light: Science & Applications, Sep. 8, 2020, vol. 9, p. 9pages.

Zhao.Z et al., "Efficient rare earth cerium(III) complex with nanosecond d-f emission for blue organic light-emitting diodes", National Science Review, Feb. 2, 2021, vol. 8, No. 2, p. 6pages.

Li.J et al., "Highly efficient and air-stable Eu(II)-containing azacryptates ready for organic light-emitting diodes", Nature Communications, Oct. 15, 2020, vol. 11, pp. 5218-1-5218-8.

* cited by examiner

9171

9172

9173

9200

9201

9201

9201

LIGHT-EMITTING DEVICE, DISPLAY DEVICE, AND ELECTRONIC DEVICE

BACKGROUND OF THE INVENTION

1. Field of the Invention

One embodiment of the present invention relates to an organic compound, an organic semiconductor element, a light-emitting device, a photodiode sensor, a display module, a lighting module, a display device, an electronic device, a lighting device, and an electronic device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a lighting device, a power storage device, a memory device, an image capturing device, a driving method thereof, and a manufacturing method thereof.

2. Description of the Related Art

Light-emitting devices (also referred to as organic EL elements) including organic compounds and utilizing electroluminescence (EL) have been put into more practical use. In the basic structure of such light-emitting devices, an organic compound layer containing a light-emitting material is located between a pair of electrodes. Carriers are injected by application of voltage to the device, and recombination energy of the carriers is used, whereby light emission can be obtained from the light-emitting material.

Since such light-emitting devices are of self-luminous type, display devices in which the light-emitting devices are used for pixels have higher visibility than liquid crystal display devices and do not need a backlight. Display devices that include such light-emitting devices are also highly advantageous in that they can be thin and lightweight. Moreover, such light-emitting devices also have a feature of extremely fast response speed.

Since light-emitting layers of such light-emitting devices can be successively formed in a planar shape, planar light emission can be achieved. This feature is difficult to realize with point light sources typified by incandescent lamps and LEDs or linear light sources typified by fluorescent lamps; thus, the light-emitting devices also have great potential as planar light sources, which can be used for lighting devices and the like.

Display devices or lighting devices that include light-emitting devices are suitable for a variety of electronic devices as described above, and research and development of light-emitting devices have progressed for better characteristics.

For example, Non-Patent Document 1 reports a light-emitting device that includes a lanthanoid complex as a light-emitting dopant.

REFERENCE

Non-Patent Document

[Non-Patent Document 1] Liding Wang and six others, "Review on the Electroluminescence Study of Lanthanide Complexes", Advanced Optical Materials, 2019, 7, 1801256

SUMMARY OF THE INVENTION

An object of one embodiment of the present invention is to provide a light-emitting device having high emission efficiency. Another object of one embodiment of the present invention is to provide a highly reliable light-emitting device. Another object of one embodiment of the present invention is to provide a high-color-purity light-emitting device. Another object of one embodiment of the present invention is to provide any of a low-power-consumption display device, a low-power-consumption electronic device, and a low-power-consumption lighting device. Another object of one embodiment of the present invention is to provide any of a highly reliable display device, a highly reliable electronic device, and a highly reliable lighting device. Another object of one embodiment of the present invention is to provide any of a high-color-purity display device, a high-color-purity electronic device, and a high-color-purity lighting device.

It is only necessary that at least one of the above-described objects be achieved in the present invention.

One embodiment of the present invention is a light-emitting device including a first electrode, a second electrode, and an organic compound layer, in which the organic compound layer is between the first electrode and the second electrode; the organic compound layer includes a light-emitting layer; the light-emitting layer contains a first substance and a second substance; the second substance causes light emission from a doublet excited state; a doublet excited level of the second substance is lower than a singlet excited level of the first substance and higher than a triplet excited state of the first substance; and the second substance emits light.

Another embodiment of the present invention is a light-emitting device including a first electrode, a second electrode, and an organic compound layer, in which the organic compound layer is between the first electrode and the second electrode; the organic compound layer includes a light-emitting layer; the light-emitting layer contains a first substance and a second substance; the second substance causes light emission from a doublet excited state; and an emission edge on the short wavelength side of a PL spectrum of the second substance at a room temperature is located at a shorter wavelength than an emission edge on the short wavelength side of a PL spectrum of a phosphorescent component in the first substance at a temperature within a range from 4 K to 77 K and is located at a longer wavelength than an emission edge on the short wavelength side of a PL spectrum of the first substance at the room temperature.

Another embodiment of the present invention is a light-emitting device including a first electrode, a second electrode, and an organic compound layer, in which the organic compound layer is between the first electrode and the second electrode; the organic compound layer includes a light-emitting layer; the light-emitting layer contains a first substance and a second substance; the second substance causes light emission from a doublet excited state; and an absorption edge of an absorption spectrum of the second substance is located at a shorter wavelength than an emission edge on the short wavelength side of a PL spectrum of a phosphorescent component in the first substance at a temperature within a range from 4 K to 77 K and is located at a longer wavelength than an emission edge on the short wavelength side of a PL spectrum of the first substance at a room temperature.

Another embodiment of the present invention is a light-emitting device including a first electrode, a second electrode, and an organic compound layer, in which the organic compound layer is between the first electrode and the second electrode; the organic compound layer includes a light-emitting layer; the light-emitting layer contains a first substance and a second substance; the second substance causes light emission from a doublet excited state; and an absorption edge of an absorption spectrum of the second substance is located at a shorter wavelength than an emission edge on the short wavelength side of a PL spectrum of a phosphorescent component in the first substance at a temperature within a range from 4 K to 77 K and is located at a longer wavelength than an absorption edge of an absorption spectrum of the first substance.

Another embodiment of the present invention is a light-emitting device including a first electrode, a second electrode, and an organic compound layer, in which the organic compound layer is between the first electrode and the second electrode; the organic compound layer includes a light-emitting layer; the light-emitting layer contains a first substance, a second substance, and a third substance; the second substance causes light emission from a doublet excited state; a doublet excited level of the second substance is lower than a singlet excited level of the first substance and higher than a triplet excited level of the first substance; the third substance causes light emission from a singled excited state; a singlet excited level of the third substance is lower than the doublet excited level of the second substance; and emission is obtained from the third substance.

Another embodiment of the present invention is a light-emitting device with the above structure, in which a triplet excited level of the third substance is higher than the triplet excited level of the first substance.

Another embodiment of the present invention is a light-emitting device including a first electrode, a second electrode, and an organic compound layer, in which the organic compound layer is between the first electrode and the second electrode; the organic compound layer includes a light-emitting layer; the light-emitting layer contains a first substance, a second substance, and a third substance; the second substance causes light emission from a doublet excited state; an emission edge on the short wavelength side of a PL spectrum of the second substance at a room temperature is located at a shorter wavelength than an emission edge on the short wavelength side of a PL spectrum of a phosphorescent component in the first substance at a temperature within a range from 4 K to 77 K and is located at a longer wavelength than an emission edge on the short wavelength side of a PL spectrum of the first substance at the room temperature; the third substance causes light emission from a singlet excited state; an emission edge on the short wavelength side of a PL spectrum of the third substance at the room temperature is located at a longer wavelength than the emission edge on the short wavelength side of the PL spectrum of the second substance at the room temperature; and emission is obtained from the third substance.

Another embodiment of the present invention is a light-emitting device including a first electrode, a second electrode, and an organic compound layer, in which the organic compound layer is between the first electrode and the second electrode; the organic compound layer includes a light-emitting layer; the light-emitting layer contains a first substance, a second substance, and a third substance; the second substance causes light emission from a doublet excited state; an absorption edge of an absorption spectrum of the second substance is located at a shorter wavelength than an emission edge on the short wavelength side of a PL spectrum of a phosphorescent component in the first substance at a temperature within a range from 4 K to 77 K and is located at a longer wavelength than an emission edge on the short wavelength side of a PL spectrum of the first substance at a room temperature; the third substance causes light emission from a singlet excited state; an absorption edge of an absorption spectrum of the third substance is located at a longer wavelength than the absorption edge of the absorption spectrum of the second substance; and emission is obtained from the third substance.

Another embodiment of the present invention is a light-emitting device including a first electrode, a second electrode, and an organic compound layer, in which the organic compound layer is between the first electrode and the second electrode; the organic compound layer includes a light-emitting layer; the light-emitting layer contains a first substance, a second substance, and a third substance; the second substance causes light emission from a doublet excited state; an absorption edge of an absorption spectrum of the second substance is located at a shorter wavelength than an emission edge on the short wavelength side of a PL spectrum of a phosphorescent component in the first substance at a temperature within a range from 4 K to 77 K and is located at a longer wavelength than an absorption edge of an absorption spectrum of the first substance; the third substance causes light emission from a singlet excited state; an absorption edge of an absorption spectrum of the third substance is located at a longer wavelength than the absorption edge of the absorption spectrum of the second substance; and emission is obtained from the third substance.

Another embodiment of the present invention is a light-emitting device with the above structure, in which an emission edge on the short wavelength side of a PL spectrum of the third substance at a temperature within a range from 4 K to 77 K is located at a shorter wavelength than the emission edge on the short wavelength side of the PL spectrum of a phosphorescent component in the first substance at a temperature within a range from 4 K to 77 K.

Another embodiment of the present invention is a light-emitting device with the above structure, in which the second substance causes light emission from a doublet excited state based on f-d transition.

Another embodiment of the present invention is a light-emitting device with the above structure, in which the second substance is an organic complex containing a rare earth element.

Another embodiment of the present invention is a light-emitting device with the above structure, in which the second substance is an organic complex containing trivalent cerium.

Another embodiment of the present invention is a light-emitting device with the above structure, in which the third substance exhibits thermally activated delayed fluorescence.

Another embodiment of the present invention is a display device including any of the above light-emitting devices.

Another embodiment of the present invention is an electronic device that includes the above light-emitting device and at least one of a sensor, an operation button, a speaker, and a microphone.

Another embodiment of the present invention is a lighting device that includes the above light-emitting device and a housing.

According to one embodiment of the present invention, a light-emitting device having high emission efficiency can be provided. Alternatively, according to one embodiment of the present invention, a highly reliable light-emitting device can be provided. Alternatively, any of a low-power-consumption display device, a low-power-consumption electronic device, and a low-power-consumption lighting device can be provided. Alternatively, any of a highly reliable display device, a highly reliable electronic device, and a highly reliable lighting device can be provided.

Note that the description of these effects does not preclude the existence of other effects. One embodiment of the present invention does not necessarily have all these effects. Other effects will be apparent from and can be derived from the description of the specification, the drawings, the claims, and the like.

DETAILED DESCRIPTION OF THE INVENTION

Figure 1A:
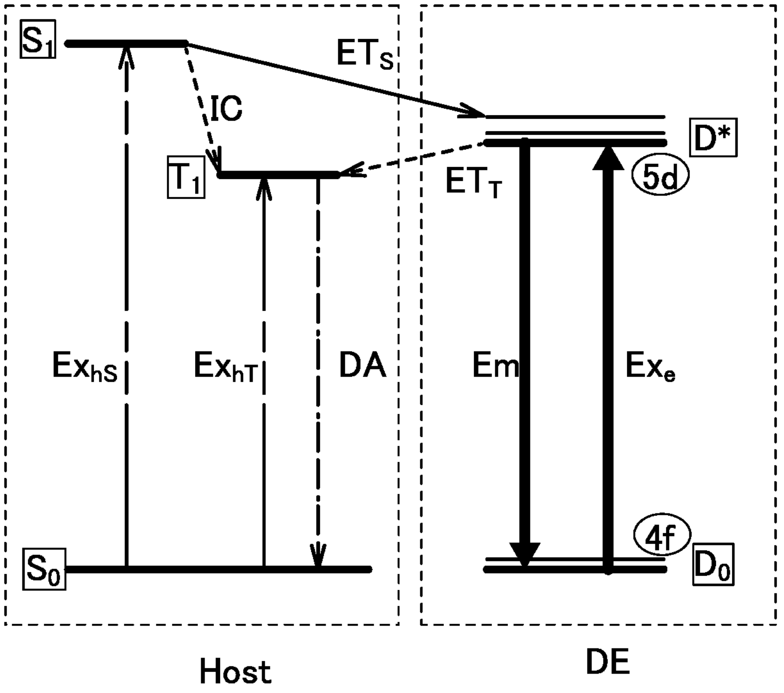
FIGS. 1A and 1B are energy band diagram of a light-emitting device of one embodiment of the present invention.

Embodiments of the present invention will be described in detail below with reference to the drawings. Note that the embodiments of the present invention are not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

In this specification and the like, a device formed using a metal mask or a fine metal mask (FMM) is sometimes referred to as a device having a metal mask (MM) structure. In this specification and the like, a device formed without using a metal mask or an FMM is sometimes referred to as a device having a metal maskless (MML) structure.

Embodiment 1

It is a long time since displays (organic EL displays) that include organic EL elements (hereinafter also referred to as light-emitting devices) as display elements were put into practical use. These displays are usually provided with pixels emitting light with at least three colors of red, green, and blue to achieve full-color display.

These pixels are provided with light-emitting devices for the respective emission colors. In a display fabricated by a side-by-side method, or what is called a separate coloring method, light-emitting devices include light-emitting substances corresponding to the respective emission colors of the pixels.

As light-emitting substances used for the above light-emitting devices, a fluorescent material emitting light at the time of returning from a singlet excited state to a singlet ground state, a phosphorescent material emitting light at the time of returning from a triplet-excited state to the singlet ground state, a thermally activated delayed fluorescence (TADF) material emitting light at the time of returning from the singlet excited state to the singlet ground state through a process of reverse intersystem crossing from the triplet excited state to the singlet excited state, and the like have been mainly used and researched actively.

It is known that in organic EL devices in which excitation occurs by current, the theoretical limit of the internal quantum efficiency of a light-emitting device using a fluorescent material, which can utilize only a singlet excited state for light emission, is 25% since the generation probability ratio of a singlet excited state to that of a triplet excited state is 1:3. By contrast, a phosphorescent material can convert a singlet excited state into a triplet excited state through intersystem crossing and thus enables a light-emitting device with an internal quantum efficiency of 100% theoretically, which allows the light-emitting device to have higher emission efficiency than the case of using the fluorescent material. This is why phosphorescent materials are used as a light-emitting substance in many red- and green-light-emitting devices in currently commercialized organic EL displays.

However, even in displays using phosphorescent materials for red and green light-emitting devices, in many cases, a fluorescent material inferior in efficiency to the phosphorescent materials is used for a blue-light-emitting device. A reason for this lies in not efficiency but reliability. Generally, light-emitting devices using a phosphorescent material as a blue-light-emitting substance have short lifetimes and have difficulty in achieving high reliability.

For the above, there are mainly two causes. The first cause is that, assuming considering one material for both cases of the triplet state and the singlet state, the energy of the triplet state of the material is lower than the energy of the singlet state thereof. Since blue light emission needs high energy, in order to obtain blue light emission from a triplet excited state, a phosphorescent material having a higher triplet excited level than materials for the other two colors is necessary. In such a phosphorescent material, generally, a singlet excited level is further higher than the triplet excited level, which is likely to be unstable. In the case where a host material is used for dispersing light-emitting substances in a light-emitting layer, the host material is required to be a substance having a triplet excited level and a singlet excited level higher than those of the light-emitting substance. Thus, the range of choices for materials is narrow, and it is difficult to obtain a material with good performance.

The second cause is that a phosphorescent material has a long emission lifetime (also referred to as phosphorescence lifetime or exciton lifetime). Transition from a triplet excited state to a singlet ground state is spin-forbidden, whereas transition from a singlet excited state to a singlet ground state is spin-allowed; thus, the phosphorescence lifetime (~μs) is much longer than the fluorescence lifetime (~ns). A long phosphorescence lifetime means a long lifetime of a triplet exciton. Therefore, in a phosphorescent light-emitting device, a light-emitting substance keeps being in a high-energy excited state for a long time, which promotes deterioration of the light-emitting substance or nearby substances.

As described above, the energy of the triplet excited state of a blue phosphorescent material is higher than the energies of the triplet excited states of a red and green phosphorescent materials; thus, a blue phosphorescent device is significantly influenced by the long exciton lifetime of the light-emitting substance to be still inhibited from having reliability high enough for practical use, compared to a red or green phosphorescent device.

Incidentally, the TADF material, which causes light emission from a singlet excited state and has a triplet excited level extremely close to a singlet excited level, allows reverse intersystem crossing and conversion of triplet excitation energy into singlet excitation energy. Accordingly, a light-emitting device using the TADF material can achieve an internal quantum efficiency of 100% theoretically, like a light-emitting device using a phosphorescent substance. However, a blue-light-emitting device using the TADF material suffers from the problem of a high triplet excited level like a blue-light-emitting device using a phosphorescent material; thus, there is a difficulty in performance and choice of a host material. Furthermore, the exciton lifetime in the blue-light-emitting device is long because reverse intersystem crossing is forbidden; thus, achieving high reliability is now difficult as in a blue phosphorescent device.

An organic complex containing a rare earth element and emitting light through 4f-5d transition, which is transition between an f orbital and a d orbital, is known. Many rare earth elements form light emission through 4f-4f transition, which is parity-forbidden, to have a long exciton lifetime (~ms). Meanwhile, some rare earth element ions, e.g., $Ce^{3+}$, $Sm^{2+}$, $Eu^{2+}$, $Tm^{2+}$, and $Yb^{2+}$, enable their organic complexes to emit light from an excited state based on 4f-5d transition. F-d transition is parity-allowed and is thus relatively rapid, so that organic complexes containing any of these ions have a relatively short exciton lifetime (~μs).

Both the ground state and the excited state of the organic complex containing $Ce^{3+}$ ($4f^1$) are doublet, whereby the organic complex emits light from the doublet excited state. In other words, the transition between the ground state and the excited state of the organic complex containing $Ce^{3+}$ ($4f^1$) is both parity-allowed and spin-allowed, enabling a shorter exciton lifetime (~ns). From the above, the organic complex containing $Ce^{3+}$ ($4f^1$) is a light-emitting substance less likely to cause deterioration of its own or nearby substances promoted by high-energy excitons, which is a problem in phosphorescent materials or TADF materials.

As described above, since both the ground state and the excited state of the organic complex containing $Ce^{3+}$ ($4f^1$) are doublet, the organic complex containing $Ce^{3+}$ ($4f^1$) is not subjected to the restriction of the spin selection rule even in the case of current excitation and can generate a doublet excited state with a probability of 100%. Thus, like phosphorescent materials, the organic complex containing $Ce^{3+}$ ($4f^1$) is a light-emitting substance enabling formation of a light-emitting device with extremely high emission efficiency.

Note that the energy transfer from the doublet state to the triplet state is forbidden, which is a main feature of using the organic complex containing $Ce^{3+}$ ($4f^1$) as a light-emitting substance for a light-emitting device.

The mechanisms of intermolecular energy transfer are roughly classified into the Forster mechanism and the Dexter mechanism. The energy transfer by the Forster mechanism is allowed in the case where electron transition at the time when an energy donor in an excited state returns to the ground state and electron transition at the time when a light-emitting substance in the ground state turns into an excited state are both allowed transition. Thus, as the energy transfer from a host material (organic compound emitting fluorescent light) to a light-emitting substance in the doublet state by the Forster mechanism, only transfer from the singlet excited state of the host material is allowed, and the energy transfer from the triplet excited state does not occur. This is because a fluorescent organic compound usually exhibits an extremely weak or no emission spectrum corresponding to a triplet excited state at room temperature. As the energy transfer from the light-emitting substance in the doublet excited state to another fluorescent material (organic compound emitting fluorescent light) by the Forster mechanism, only transfer to the singlet state of the fluorescent material is allowed, and the energy transfer to the triplet state does not occur. This is because a fluorescent organic compound usually exhibits an extremely weak or no absorption spectrum corresponding to a triplet excited state. Note that the organic compound generally refers to a fluorescent material; accordingly, a host material is a fluorescent material unless a phosphorescent material is intentionally selected.

Energy transfer by the Dexter mechanism is allowed under conditions where the total spin multiplicity is the same before and after energy transfer. The excited state and the ground state of the organic complex containing $Ce^{3+}$ ($4f^1$) are doublet (excited state: D*, ground state: $D_0$). In addition, the ground state of an organic material is generally a singlet state ($S_0$). Accordingly, when the energy is transferred from a host material to a light-emitting substance in the doublet ground state by the Dexter mechanism, the energy transfer from a singlet excited state ($S_1$) of the host material is allowed. In other words, also in the case of the energy transfer by the Dexter mechanism, the energy transfer from the triplet excited state ($T_1$) of the host material (the fluorescent material) to the doublet state of a light-emitting substance is forbidden and does not occur. Furthermore, when the energy is transferred from the light-emitting substance in the doublet excited state to another fluorescent material (organic compound emitting fluorescent light) by the Dexter mechanism, the transfer to a singlet state of the another fluorescent material (organic compound emitting fluorescent light) is only allowed (see the following expressions). In other words, also in the case of the energy transfer by the Dexter mechanism, the energy transfer from the doublet excited state to the triplet state of the another fluorescent material (organic compound emitting fluorescent light) is forbidden and does not occur. Although the energy transfer to the lowest excited states ($S_1$ and $T_1$) of the fluorescent material is assumed here, the same description applies to the case of considering energy transfer to a higher excited state.

$$D^*+S_0 \rightarrow D_0+S_1 \text{ (Allowed)}$$

$$D^*+S_0 \rightarrow D_0+T_1 \text{ (Forbidden)}$$

$$S_1+D_0 \rightarrow S_0+D^* \text{ (Allowed)}$$

$$T_1+D_0 \rightarrow S_0+D^* \text{ (Forbidden)}$$

Also in the case of $Eu^{2+}$, whose excited state is octet or sextet and whose ground state is octet, in energy transfer to a fluorescent material and energy transfer from the fluorescent material, the energy transfer to/from the triplet excited state forbidden and does not occur either.

As described above, as the energy transfer between the substance causing light emission from the doubled excited state (organic complex containing $Ce^{3+}$ ($4f^1$)) and the host material or another fluorescent material (organic compound emitting fluorescent light), the energy transfer between the doublet state and the singlet state is only allowed, and the energy transfer between the doublet state and the triplet state is forbidden by both of the main energy transfer mechanisms of the Förster mechanism and the Dexter mechanism.

In other words, the present inventors and the like have focused on a fact that the energy transfer does not occur in a light-emitting device using a substance causing light emission from a doublet excited state as a light-emitting substance even when a triplet excited level of a host material is lower than a doublet excited level of a doublet light-emission substance.

According to the fact, unlike in the case of a phosphorescent light-emitting device, in the light-emitting device using a substance causing light emission from a doublet excited state as a light-emitting substance, it is not necessary to select a material whose triplet excited level is higher than an excited level of the light-emitting substance, as a host material. Consequently, in the light-emitting device using a substance causing light emission from a doublet excited state as a light-emitting substance, it is possible to use, as a host material, an organic compound comparatively stable at substantially the same degree as that in a light-emitting device using a fluorescent material as a light-emitting substance, which allows a highly reliable light-emitting device to be provided.

Since in the light-emitting device using a fluorescent material as a light-emitting substance, the triplet excited state of the fluorescent material does not contribute to light emission, it is important to inhibit energy transfer from an excited state of a host material or an energy donor to a triplet excited state of a fluorescent material, for achieving a light-emitting device with high emission efficiency.

However, in a light-emitting device using a fluorescent material as a light-emitting substance and a substance causing light emission from a doublet excited state as an energy donor, the energy transfer from the doublet excited state to the triplet excited state of the fluorescent material does not occur even when the triplet excited level of the fluorescent material is lower than the doublet excited level of the doublet light-emitting substance. Thus, it is not necessary to select a material whose triplet excited level is higher than an excited level of a substance causing light emission from a doublet excited state, as a fluorescent material. Consequently, it is possible to use a more stable organic compound as a host material in a light-emitting device using a substance causing light emission from a doublet excited state as an energy donor and using a fluorescent material as a light-emitting substance, which allows a highly reliable light-emitting device to be provided.

As for excited levels, energy at an absorption edge of an absorption spectrum or an emission edge on the short wavelength side of a photoluminescence (PL) spectrum at room temperature (e.g., approximately 290 K to 300 K (17° C. to 27° C.), preferably around 298 K (25° C.)) can be regarded as energy of a singlet excited level and energy of a doublet excited level, and energy at an emission edge on the short wavelength side of a phosphorescent spectrum (phosphorescent component) of a PL spectrum at a low temperature (any temperature ranging from 4 K to 77 K) can be regarded as energy of a triplet excited level.

Measurement of each of the spectra can be performed with samples either in a thin-film state or in a solution state. Note that when the spectra themselves are compared, the samples have the same form, i.e., all the samples are in a thin-film state or all the samples are in a solution state. In other words, when a PL spectrum at room temperature and a PL spectrum at a low temperature (any of 4 K to 77 K) are compared, the comparison is preferably performed using the samples having the same form of a thin-film state or solution state.

In the case where the measurement is performed with a sample in a solution state, as a solvent, hexane, benzene, toluene, diethyl ether, ethyl acetate, chloroform, chlorobenzene, dichloromethane, 2-methyltetrahydrofuran (2-MeTHF), or the like can be used; it is preferable to use toluene, dichloromethane, or 2-MeTHF. Furthermore, in observation of a phosphorescent component at a low temperature, a mixed solvent where iodobenzene:dichloromethane:toluene=20%:40%:40%, or the like may be used, in which case a favorable glass state can be formed.

Note that in observation of the phosphorescent component in a solution state, the measurement is preferably performed at 77 K that is temperature of liquid nitrogen. In observation of the phosphorescent component in a thin-film state, the measurement is preferably performed at a temperature in a range from 4 K to 10 K because the temperature of the liquid helium is 4 K.

In other words, in the light-emitting device of one embodiment of the present invention, an emission edge on the short wavelength side of a PL spectrum, at room temperature, of a substance causing light emission from a doublet excited level included in the light-emitting layer can be located at a shorter wavelength than an emission edge on the shorter wavelength side than a PL spectrum of a host material at a low temperature, and can be located at a longer wavelength than an emission edge on the short wavelength side of a PL spectrum of the host material at room temperature. Note that an emission edge on the short wavelength side of an EL spectrum of the light-emitting device can be considered as the same as the emission edge on the short wavelength side of a PL spectrum, at room temperature, of a substance causing light emission from a doublet excited state.

Alternatively, in the light-emitting device of one embodiment of the present invention, an absorption edge of an absorption spectrum of a substance causing light emission from a doublet excited level included in the light-emitting layer can be located at a shorter wavelength than an emission edge on the short wavelength side of a PL spectrum of a host material at any temperature ranging from 4 K to 77 K, and can be located at a longer wavelength than an emission edge on the short wavelength side of a PL spectrum of the host material at room temperature.

Alternatively, in the light-emitting device of one embodiment of the present invention, an absorption edge of an absorption spectrum of a substance causing light emission from a doublet excited level included in a light-emitting layer can be located at a shorter wavelength than an emission edge on the short wavelength side of a PL spectrum of a host material at any temperature ranging from 4 K to 77 K, and can be located at a longer wavelength than an absorption edge of an absorption spectrum of the host material.

Note that an organic complex containing $Ce^{3+}$ ($4f^1$) can obtain excited energy sufficient for blue light emission and accordingly can be used as a blue-light-emitting material.

As described above, the organic complex containing $Ce^{3+}$ ($4f^1$) has the following features: having a short exciton lifetime, suppressing deterioration; not subjected to the restriction of the spin selection rule, allowing 100-percent theoretical internal quantum efficiency; capable of using a host material with a low triplet excited level; and capable of emitting blue light. Thus, a light-emitting device using the organic complex containing $Ce^{3+}$ ($4f^1$) can be a blue-light-emitting device with favorable reliability.

To obtain a D* level, a $S_1$ level, or a $T_1$ level of an organic compound, the $S_1$ level or the D* level can be energy of the wavelength at the intersection of the horizontal axis (wavelength) or the base line and a tangent to the fluorescence spectrum at a point where the slope of the spectrum at a peak on the shorter wavelength side has a maximum value, and the $T_1$ level can be energy of the wavelength at the intersection of the horizontal axis (wavelength) or the base line and a tangent to the phosphorescence spectrum at a point where the slope of the spectrum at a peak on the shorter wavelength side has a maximum value (see Daisaku TANAKA et al., "*Ultra High Efficiency Green Organic Light-Emitting Devices*", *Japanese Journal of Applied Physics*, Vol. 46, No. 1, 2007, pp. L10-L12, for example). When the v=0→v=0 transition (0→0 band) between vibrational levels of the ground state and the excited state is clearly observed from a fluorescent spectrum or a phosphorescent spectrum, the D* level, the $S_1$ level, or the $T_1$ level of an organic compound can be calculated using the 0→0 band (Nicholas J. Turro, V. Ramamurthy, J. C. Scaiano, "PRINCIPLES OF MOLECULAR PHOTOCHEMISTRY", supervised and translated by H. Inoue and O. Ito, Maruzen Publishing Co., Ltd., 2013 Jul. 30, pp. 165-169). In this specification, the former method of drawing a tangent is employed to calculate the levels. In the case where the levels are compared with each other, those calculated by the same method are used.

The longest-wavelength absorption edge in an absorption spectrum can be determined from a Tauc plot, with an assumption of direct transition, of a measured absorption spectrum of a target substance in the form of a thin-film state or a thin film in which a matrix material is doped with the target substance. In other words, other than measurement in a thin-film state, a polymer matrix material such as polymethylmethacrylate (abbreviation: PMMA) or a low-molecular wide-gap host material such as 1,3-bis(N-carbazolyl) benzene (abbreviation: mCP) may be doped with the target substance for the measurement. Alternatively, an absorption spectrum of a solution may be measured and an absorption edge may be calculated from the intersection of the horizontal axis (wavelength) or the base line and a tangent drawn at a point of the absorption spectrum where the slope of the longest-wavelength peak or shoulder peak is negatively steepest. For comparison of the levels, those calculated by the same method are used; absorption spectra of a solution is preferably used for high accuracy. There is no particular limitation on a solvent of the solution as long as the same solvent is used for the comparison. A solvent with relatively low polarity, such as toluene or chloroform, is preferred.

FIG. 1A shows an energy transfer diagram of a light-emitting device of one embodiment of the present invention.

In the light-emitting device of one embodiment of the present invention including a host material (Host) and a substance causing light emission from a doublet excited state (DE), the energy level of the lowest singlet excited level ($S_1$) of the host material (Host) is higher than that of the lowest doublet excited level (D*) of the substance causing light emission from a doublet excited state (DE), and the energy level of the lowest triplet excited level ($T_1$) of the host material (Host) is lower than that of the lowest doublet excited level (D*) of the substance causing light emission from a doublet excited state (DE). Thus, a stable substance whose lowest triplet excited level ($T_1$) is low can be used as the host material (Host), and a light-emitting device with favorable reliability can be provided. In addition, the range of choices for materials is widened, and a substance with more appropriate characteristics can be used as the host material (Host), whereby characteristics of the light-emitting device are improved.

In the light-emitting device with the above-described structure, with energy generated by recombination of carriers in the substance causing light emission from a doublet excited state (DE), 4f electrons at the ground state ($D_0$) of the substance causing light emission from a doublet excited state (DE) are excited to the 5d orbital, whereby the lowest doublet excited level (D*) is formed (route $Ex_e$).

The lowest doublet excited level (D*) generated in the above manner emits light when returning to the ground state ($D_0$) (route Em). In the light-emitting device of one embodiment of the present invention, the energy level of the lowest singlet excited level ($S_1$) of the host material (Host) is higher than that of the lowest doublet excited level (D*), and the energy transfer from the lowest doublet excited level (D*) to the lowest triplet excited level ($T_1$) (route $ET_T$) is forbidden; accordingly all the energy of the generated lowest doublet excited level (D*) can be extracted as light emission. Therefore, the light-emitting device of one embodiment of the present invention can have extremely high emission efficiency.

In the light-emitting device of one embodiment of the present invention, routes (route $Ex_{hS}$ and route $Ex_{hT}$) exist. In such routes, the host material (Host) is excited with the energy generated by recombination of carriers in the host material (Host), whereby the lowest singlet excited level ($S_1$) and the lowest triplet excited level ($T_1$) are formed.

In this case, the lowest singlet excited level ($S_1$) and the lowest triplet excited level ($T_1$) are generated at a ratio of 1:3. The energy transfer from the lowest singlet excited level ($S_1$) to the lowest doublet excited level (D*) is allowed; thus, the energy of the lowest singlet excited level ($S_1$) is transferred to the lowest doublet excited level (D*) (route ETs) and emits light (route Em). At this time, the energy transfer from the lowest singlet excited level ($S_1$) to the lowest triplet excited level ($T_1$) (a route IC) is forbidden and does not occur. In other words, the lowest singlet excited level ($S_1$) energy of the host material (Host) can be converted into light emission effectively. Meanwhile, the generated lowest triplet excited level ($T_1$) does not contribute to light emission and is subjected to non-radiative deactivation (route DA), thereby causing energy loss. Therefore, in the light-emitting device of the present invention, carriers are preferably recombined in the substance causing light emission from a doublet excited state (DE), which is a light-emitting substance.

In the light-emitting layer, the HOMO of the host material is preferably low for recombination of carriers in the substance causing light emission from a doublet excited state (DE), and the host material is selected so that the HOMO of the host material is lower than the HOMO of a material included in a layer (hole-transport layer) in contact with the light-emitting layer on the anode side. In such a structure, holes are easily injected to the substance causing light emission from a doublet excited state (DE), which is a light-emitting substance, when holes are injected from the hole-transport layer to the light-emitting layer, so that the carriers can be recombined in the substance causing light emission from a doublet excited state (DE).

As described above, the probability of generating the lowest doublet excited level (D*) from the doublet ground state ($D_0$) by current excitation can be 100% in theory. Thus, the light-emitting device can achieve 100-percent theoretical internal quantum efficiency by recombination of carriers in the substance causing light emission from a doublet excited state (DE).

As described above, the light-emitting device of one embodiment of the present invention has features of achieving 100-percent theoretical internal quantum efficiency, being capable of using a host material with a low triplet excited level, and being capable of emitting blue light. Furthermore, deterioration is less likely to occur due to a short exciton lifetime, which allows the light-emitting device to have higher emission efficiency. Thus, a blue-light-emitting device with favorable reliability can be provided.

Figure 1B:
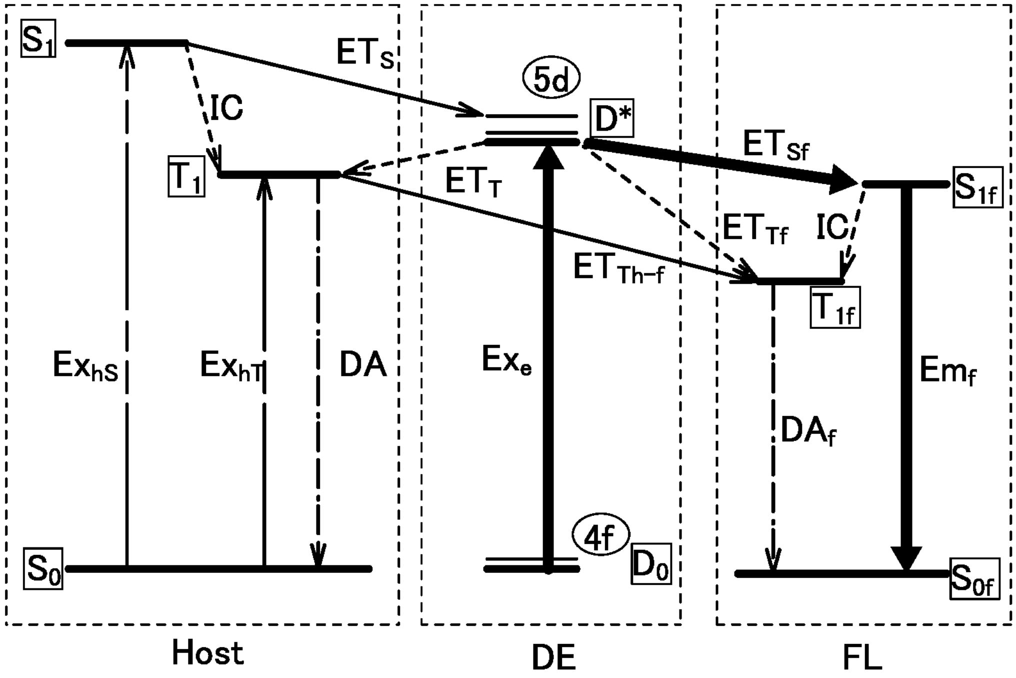

In addition, the light-emitting device of one embodiment of the present invention may have a structure, as illustrated in FIG. 1B, where a fluorescent material (substance emitting light on the basis of the transfer from the singlet excited state to the singlet ground state: FL) emits light by the energy transfer from the substance causing light emission from a doublet excited state (DE) to the fluorescent material (FL) (route $Em_f$). In this case, the light-emitting device is formed so that the doublet excited energy of the substance causing light emission from a doublet excited state (DE) is larger than the singlet excited energy of the fluorescent material (FL).

As described, the energy transfer to the triplet excited state (route $ET_{Tf}$) does not occur from the doublet excited state, and only the energy transfer to the singlet excited state (route $ET_{Sf}$) occurs. Therefore, the energy transfer to the triplet excited state ($T_{1f}$), which does not contribute to light emission of the fluorescent material (FL), does not occur from the substance causing light emission from a doublet excited state (DE), and the excited energy can be converted into light emission by the fluorescent material efficiently.

In terms of energy transfer from any of energy donors to a fluorescent material, a variety of energy transfers from a TADF material or a phosphorescent material to a fluorescent material have been studied. The energy transfers have an essential problem of causing undesirable energy transfer to a triplet excited state of a fluorescent material. That is, Dexter transfer from the triplet excited state of the TADF material to the triplet excited state of the fluorescent light-emitting substance is allowed, and so is Dexter transfer from the triplet excited state of the phosphorescent material to the triplet excited state of the fluorescent light-emitting substance. By contrast, when energy is transferred to a fluorescent light-emitting substance from the above-described substance causing light emission from a doublet excited state (DE: typically, an organic complex of $Ce^{3+}$ ($4f^1$)), for example, undesirable energy transfer to the triplet excited state of the fluorescent material (route $ET_{Tf}$) is inhibited; thus, energy transfer in such a form has a distinguishing characteristic.

This means that in one embodiment of the present invention, all the excitons that are generated in a light-emitting layer can be in the doublet excited state before energy transfer and the excitation energy can be transferred to a fluorescent light-emitting substance. That is, one embodiment of the present invention, which utilizes energy transfer to a fluorescent material from a substance causing light emission from a doublet excited state (a typical example of which is an organic complex of $Ce^{3+}$ ($4f^1$)), overcomes the spin selection rule to achieve an internal quantum efficiency of 100%.

The study of fluorescent materials have a long history, and many substances with chromaticity and color purity suitable for display usage have been developed. As a fact, there are abundant fluorescent materials having an emission spectrum with a narrower half width than an emission spectrum of an organic complex of $Ce^{3+}$ ($4f^1$). Therefore, with a structure where the fluorescent material (FL) emits light by the energy transfer from the substance causing light emission from a doublet excited state (DE) to the fluorescent material (FL), a light-emitting device with favorable color purity can be provided.

Such a structure is achieved when the half width of the emission spectrum of the fluorescent material (FL) is made smaller than that of the emission spectrum of the substance causing light emission from a doublet excited state (DE). Thus, one embodiment of the present invention is a light-emitting device in which the half width of the emission spectrum of the fluorescent material (FL) is smaller than the half width of the emission spectrum of the substance causing light emission from a doublet excited state (DE, typically, an organic complex of $Ce^{3+}$ ($4f^1$)). Note that as the emission spectra for comparing half widths, the photoluminescence (PL) spectra of the substances are used. Samples whose PL spectra are measured and compared may be in the form of a thin film or a solution, but are preferably in the form of a solution for examining the state of an isolated molecule. There is no particular limitation on a solvent of the solution as long as the same solvent is used for the comparison. A solvent with relatively low polarity, such as toluene or chloroform, is preferred.

In general, a blue fluorescent substance is relatively stable because light emission occurs from a singlet excited state, and plenty kinds of blue fluorescent substances exist. With a structure where the fluorescent material (FL) emits light by the energy transfer from the substance causing light emission from a doublet excited state (DE) to the fluorescent material (FL), a light-emitting device with favorable color purity and better reliability can be provided.

As the substance causing light emission from a doublet excited state (DE), a substance creating a broad emission spectrum exists. Although there is a disadvantage in terms of color purity when the substance is used as a light-emitting substance, such a broad spectrum is advantageous when the substance is used as an energy transfer medium. Specifically, because of its breadth, the emission spectrum (PL spectrum) of the substance causing light emission from a doublet excited state (DE) overlaps with the longest-wavelength absorption band of the fluorescent material (FL) even when the maximum peak in the emission spectrum of the substance is located at a wavelength longer than the wavelength of the peak of the absorption band (the longest-wavelength peak or shoulder peak of the absorption spectrum) of the fluorescent material, enabling efficient energy transfer. In such a state, the driving voltage can be further reduced. Therefore, in one embodiment of the present invention, the maximum peak in the emission spectrum (PL spectrum) of the substance causing light emission from a doublet excited state (DE) is preferably located at a wavelength longer than the wavelength of the longest-wavelength peak or shoulder peak in the absorption spectrum of the fluorescent material (FL). In that case, the driving voltage can be reduced and the light-emitting device can have a longer lifetime even when emitting high-energy light such as blue light.

From the same perspective, it is further preferable that in one embodiment of the present invention, the maximum peak in the emission spectrum (PL spectrum) of the substance causing light emission from a doublet excited state (DE) be located at a wavelength longer than the wavelength of the maximum peak in the emission spectrum (PL spectrum) of the fluorescent material (FL). In that case, the driving voltage can be considerably reduced and the light-emitting device can have a longer lifetime even when emitting high-energy light such as blue light. Note that energy transfer does not occur when the emission spectrum (PL spectrum) of the substance that emits light from the doublet excited state (DE) is located at too long a wavelength at this time; thus, it is preferable that the emission spectrum (PL spectrum) of the substance that emits light from the doublet excited state (DE) overlap with the absorption spectrum of the fluorescent material (FL). As the PL spectrum and the absorption spectrum, those measured using a solution are preferably used. There is no particular limitation on a solvent of the solution as long as the same solvent is used for the comparison. A solvent with relatively low polarity, such as toluene or chloroform, is preferred. Alternatively, a spectrum of a thin film may be used. In that case, a polymer matrix material such as PMMA or a low-molecular wide-gap host material such as mCP may be doped with the target material and measurement of an absorption spectrum or a PL spectrum may be performed.

Note that when excitons are formed in the fluorescent material (FL) in advance, the triplet excited level, which cannot be used for light emission in this light-emitting device, is generated; thus, in the light-emitting device of one embodiment of the present invention, excitons are preferably generated in the substance causing light emission from a doublet excited state (DE) before ones are generated in the fluorescent material (FL). It is thus preferable that in the light-emitting device of one embodiment of the present invention, the proportion of the substance causing light emission from a doublet excited state (DE) is higher than that of the fluorescent material (FL) in the light-emitting layer. Specifically, the mass ratio of the substance causing light emission from a doublet excited state (DE) to the fluorescent material (FL) is 2 or more, preferably 5 or more, further preferably 10 or more, still further preferably 20 or more.

As described above, the light-emitting device of one embodiment has features of achieving 100-percent theoretical internal quantum efficiency, being capable of using a host material with a low triplet excited level, and being capable of emitting blue light with a favorable color purity. Furthermore, deterioration is less likely to occur due to short exciton lifetime, which allows the light-emitting device to have higher emission efficiency. Thus, a blue-light-emitting device with favorable reliability can be provided.

Examples of the substance causing light emission from a doublet excited state (DE) can include an organic complex of $Ce^{3+}$ ($4f^1$). To obtain blue to green light emission, a ligand having a molecular structure with a high triplet excitation energy level is preferably included. For example, an organic compound having a six-membered heterocycle or a five-membered heterocycle can be used. It is particularly preferable to use an organic compound having an imidazole ring, a pyrazole ring, a triazole ring, a pyrazine ring, or a triazine ring, and it is further preferable to use a boron compound having a pyrazine ring or a triazine ring.

As a substance that can be used in one embodiment of the present invention, as described above, the following substance shown below can be used, for example.

[Chemical Formula 1]

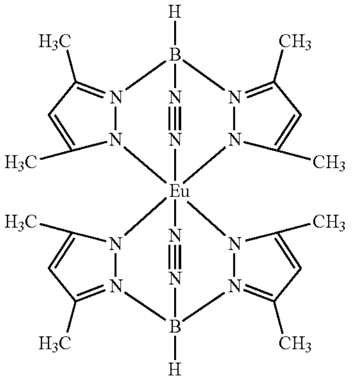

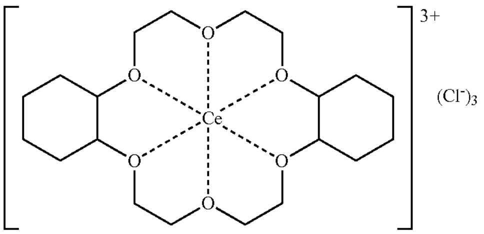

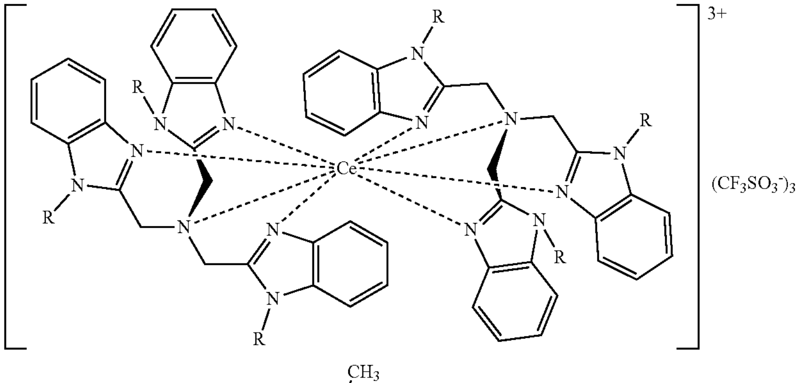

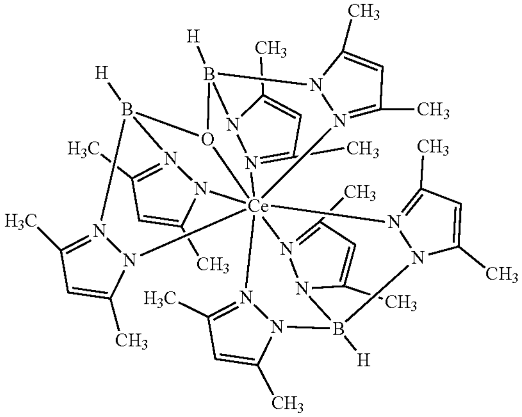

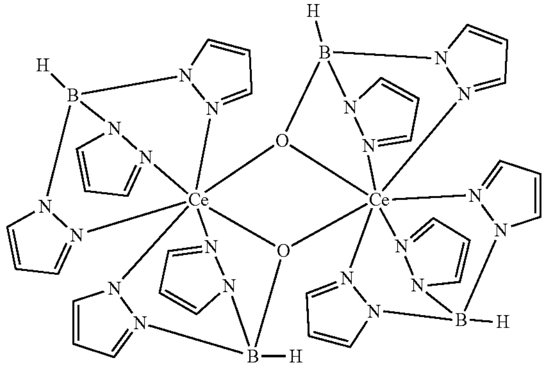

-continued

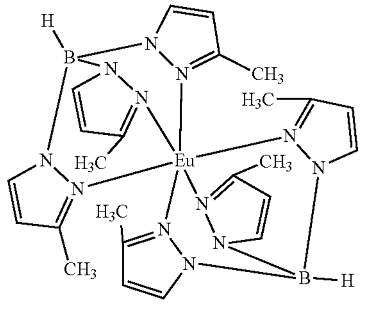

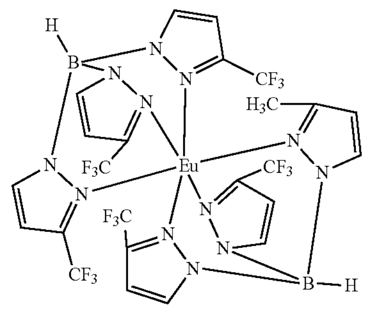

[Chemical Formula 2]

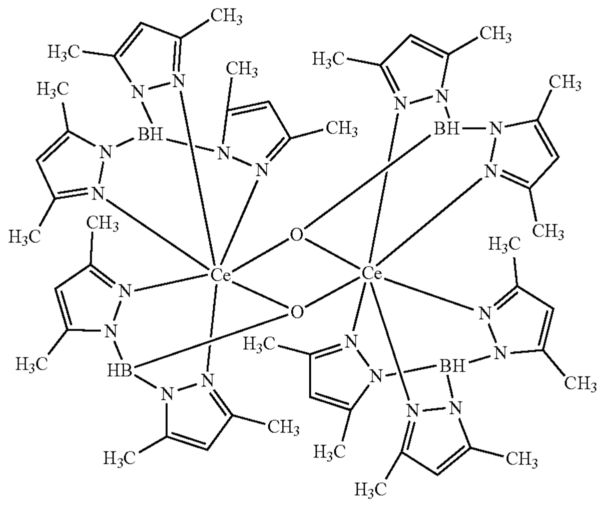

It is also possible to use an organic metal complex represented by General Formula (G1).

[Chemical Formula 3]

(G1)

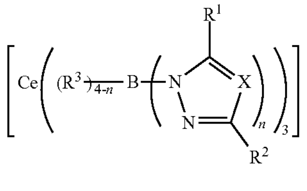

In General Formula (G1), X represents carbon or nitrogen, and the carbon is bonded to any one of hydrogen, deuterium, a substituted or unsubstituted alkyl group having 1 to 10 carbon atoms, a substituted or unsubstituted cycloalkyl group having 3 to 10 carbon atoms, and a substituted or unsubstituted aryl group having 6 to 30 carbon atoms. Furthermore, $R^1$ to $R^3$ each independently represent any one of hydrogen, deuterium, a substituted or unsubstituted alkyl group having 1 to 10 carbon atoms, a substituted or unsubstituted cycloalkyl group having 3 to 10 carbon atoms, and a substituted or unsubstituted aryl group having 6 to 30 carbon atoms. Furthermore, n is an integer greater than or equal to 1 and less than or equal to 4. The borate ligands may be the same or different from each other. Furthermore, n of one borate ligand may be the same as or different from n of another borate ligand. In the case where n is two or less, X of one borate ligand may be the same as or different from X of another borate ligand. In the case where n is two or less, $R^1$ to $R^3$ of one borate ligand may be the same as or different from respective $R^1$ to $R^3$ of another borate ligand.

Note that in General Formula (G1) above, X preferably represents nitrogen.

In General Formula (G1) above, the sum of three n's is preferably greater than or equal to 7 and less than or equal to 9, and is further preferably 8.

A metal complex represented by General Formula (G3) below can also be used.

[Chemical Formula 4]

(G3)

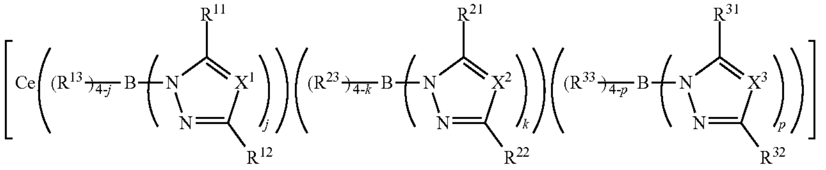

In General Formula (G3), $X^1$ to $X^3$ each independently represent carbon or nitrogen, and the carbons are each independently bonded to any one of hydrogen, deuterium, a substituted or unsubstituted alkyl group having 1 to 10 carbon atoms, a substituted or unsubstituted cycloalkyl group having 3 to 10 carbon atoms, and a substituted or unsubstituted aryl group having 6 to 30 carbon atoms. Furthermore, $R^{11}$ to $R^{13}$, $R^{21}$ to $R^{23}$, and $R^{31}$ to $R^{33}$ each independently represent any one of hydrogen, deuterium, a substituted or unsubstituted alkyl group having 1 to 10 carbon atoms, a substituted or unsubstituted cycloalkyl group having 3 to 10 carbon atoms, and a substituted or unsubstituted aryl group having 6 to 30 carbon atoms. Furthermore, j, k, and p are each independently an integer greater than or equal to 1 and less than or equal to 4. In the case where j is two or more, $X^1$'s may be the same or different from each other. In the case where k is two or more, $X^2$'s may be the same or different from each other. In the case where p is two or more, $X^3$'s may be the same or different from each other. In the case where j is two or less, each of $R^{11}$'s to $R^{13}$'s may be the same or different from each other. In the case where k is two or less, each of $R^{21}$'s to $R^{23}$'s may be the same or different from each other. In the case where p is two or less, each of $R^{31}$'s to $R^{33}$'s may be the same or different from each other.

In General Formula (G3) above, j is preferably an integer greater than or equal to 1 and less than or equal to 3.

In General Formula (G3) above, $X^1$ preferably represents nitrogen.

It is possible to use a metal complex represented by General Formula (G5) below.

[Chemical Formula 5]

(G5)

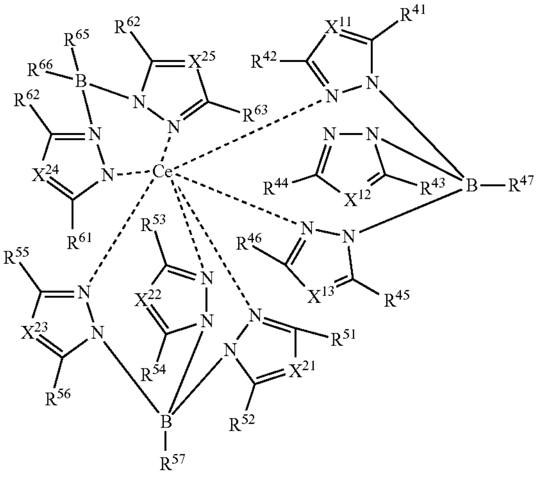

In General Formula (G5), $X^{11}$ to $X^{13}$ and $X^{21}$ to $X^{25}$ each independently represent carbon or nitrogen, and the carbons are each independently bonded to any one of hydrogen, deuterium, a substituted or unsubstituted alkyl group having 1 to 10 carbon atoms, a substituted or unsubstituted cycloalkyl group having 3 to 10 carbon atoms, and a substituted or unsubstituted aryl group having 6 to 30 carbon atoms. Furthermore, $R^{41}$ to $R^{47}$, $R^{51}$ to $R^{57}$, and $R^{61}$ to $R^{66}$ each independently represent any one of hydrogen, deuterium, a substituted or unsubstituted alkyl group having 1 to 10 carbon atoms, a substituted or unsubstituted cycloalkyl group having 3 to 10 carbon atoms, and a substituted or unsubstituted aryl group having 6 to 30 carbon atoms.

Specific examples of the alkyl group having 1 to 10 carbon atoms in General Formulae (G1), (G3), and (G5) above include a methyl group, an ethyl group, a propyl group, an isopropyl group, a butyl group, a sec-butyl group, an isobutyl group, a tert-butyl group, a pentyl group, an isopentyl group, a sec-pentyl group, a tert-pentyl group, a neopentyl group, a hexyl group, an isohexyl group, a sec-hexyl group, a tert-hexyl group, a neohexyl group, a 3-methylpentyl group, a 2-methylpentyl group, a 2-ethylbutyl group, a 1,2-dimethylbutyl group, and a 2,3-dimethylbutyl group. In the case where the alkyl group having 1 to 10 carbon atoms includes a substituent, the substituent is an alkyl group having 1 to 4 carbon atoms, a cycloalkyl group having 3 to 6 carbon atoms, or an aryl group having 6 to 13 carbon atoms.

Specific examples of the cycloalkyl group having 3 to 10 carbon atoms in General Formulae (G1), (G3), and (G5) above include a cyclopropyl group, a cyclobutyl group, a methylcyclobutyl group, a cyclopentyl group, a methylcyclopentyl group, an isopropylcyclopentyl group, a tert-butylcyclopropyl group, a cyclohexyl group, a methylcyclohexyl group, an isopropylcyclohexyl group, a tert-butylcyclohexyl group, a cycloheptyl group, a methylcycloheptyl group, an isopropylcycloheptyl group, a cyclooctyl group, a methylcyclooctyl group, an isopropylcycloheptyl group, a cyclononyl group, a methylcyclononyl group, and a cyclodecyl group. In the case where the cycloalkyl group having 3 to 10 carbon atoms includes a substituent, the substituent is an alkyl group having 1 to 4 carbon atoms, a cycloalkyl group having 3 to 6 carbon atoms, or an aryl group having 6 to 13 carbon atoms.

Examples of the aryl group having 6 to 30 carbon atoms in General Formulae (G1), (G3), and (G5) above include a phenyl group, an o-tolyl group, an m-tolyl group, a p-tolyl group, a mesityl group, an o-biphenyl group, an m-biphenyl group, a p-biphenyl group, a 1-naphthyl group, a 2-naphthyl group, a fluorenyl group, a 9,9-dimethylfluorenyl group, a 9,9-diphenylfluorenyl group, a spirofluorenyl group, a phenanthrenyl group, a terphenyl group, an anthracenyl group, and a fluoranthenyl group. In the case where the aryl group having 6 to 30 carbon atoms includes a substituent, the substituent is an alkyl group having 1 to 4 carbon atoms, a cycloalkyl group having 3 to 6 carbon atoms, or an aryl group having 6 to 13 carbon atoms.

Among organic metal complexes represented by General Formulae (G1), (G3), and (G5) above, a compound represented by the following structural formula is preferred.

[Chemical Formula 6]

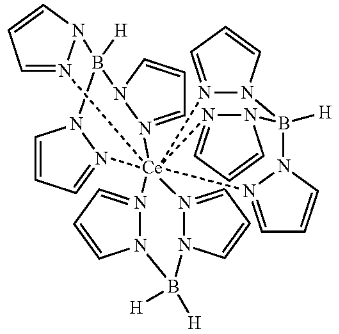

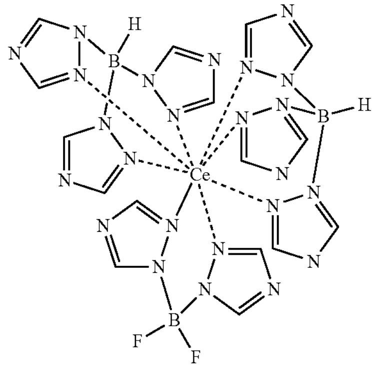

This embodiment can be freely combined with any of the other embodiments.

Embodiment 2

Figure 2A:
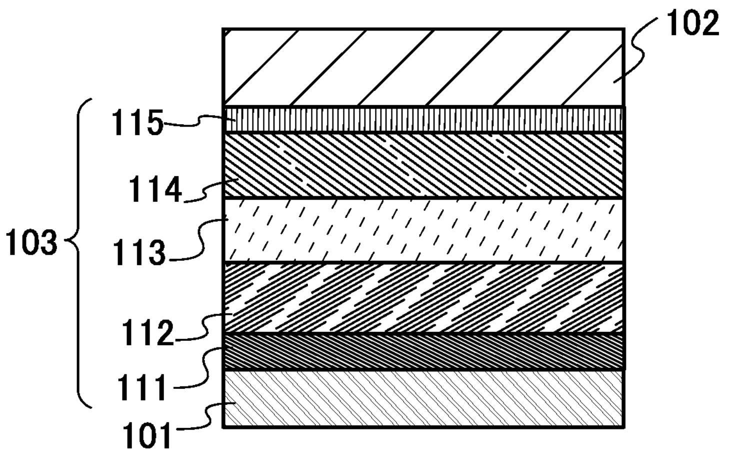
FIGS. 2A to 2C are schematic views of light-emitting devices of one embodiment of the present invention.

In this embodiment, light-emitting devices of one embodiment of the present invention will be described in detail. FIG. 2A illustrates the light-emitting device of one embodiment of the present invention. The light-emitting device of one embodiment of the present invention includes an organic compound layer 103 between a first electrode 101 and a second electrode 102. The organic compound layer 103 includes at least a light-emitting layer 113. The organic compound layer 103 may further include a functional layer other than the light-emitting layer 113. Although the exemplary structure illustrated in FIG. 2A further includes a hole-injection layer 111, a hole-transport layer 112, an electron-transport layer 114, and an electron-injection layer 115, a carrier-blocking layer, an exciton-blocking layer, an exciton-blocking layer, a charge-generation layer, or the like may be included.

In this embodiment, the case where the first electrode 101 and the second electrode 102 respectively function as an anode and a cathode is described with reference to drawings; however, the first electrode 101 and the second electrode 102 may respectively function as a cathode and an anode.

The first electrode 101 as the anode is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Films of such conductive metal oxides are usually formed by a sputtering method, but may be formed by application of a sol-gel method or the like. For example, a film of indium oxide-zinc oxide is formed by a sputtering method using a target in which 1 wt % to 20 wt % zinc oxide is added to indium oxide. Furthermore, a film of indium oxide containing tungsten oxide and zinc oxide (IWZO) can be formed by a sputtering method using a target in which 0.5 wt % to 5 wt % tungsten oxide and 0.1 wt % to 1 wt % zinc oxide are added to indium oxide. Alternatively, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used. Graphene can also be used. Note that when a composite material described later is used for the layer that is in contact with the anode, an electrode material can be selected regardless of its work function.

The hole-injection layer 111 contains a substance having an acceptor property. Either an organic compound or an inorganic compound can be used as the substance having an acceptor property.

As the substance having an acceptor property, it is possible to use a compound having an electron-withdrawing group (e.g., a halogen group or a cyano group); for example, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene)malononitrile can be used. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group, a halogen group such as a fluoro group, or the like) has a very high electron-accepting property and thus is preferable. Specific examples include α,α',α''-1,2,3-cyclopropanetriylidenetris[4-cyano-2,3,5,6-tetrafluorobenzeneacetonitrile], α,α',α''-1,2,3-cyclopropanetriylidenetris[2,6-dichloro-3,5-difluoro-4-(trifluoromethyl)benzeneacetonitrile], and α,α',α''-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. Alternatively, the hole-injection layer 111 can be formed using a phthalocyanine-based compound or complex such as phthalocyanine (abbreviation: $H_2$Pc) or copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis[4-bis(3-methylphenyl)aminophenyl]-N,N'-diphenyl-4,4'-diaminobiphenyl (abbreviation: DNTPD), or a high molecular compound such as poly(3,4-ethylenedioxythiophene)/polystyrenesulfonic acid (abbreviation: PEDOT/PSS). The substance having an acceptor property can extract electrons from an adjacent hole-transport layer (or hole-transport material) by application of an electric field.

Alternatively, a composite material in which a material having a hole-transport property contains any of the aforementioned substances having an acceptor property can be used for the hole-injection layer 111. By using a composite material in which a material having a hole-transport property contains an acceptor substance, a material used to form an electrode can be selected regardless of its work function. In other words, besides a material having a high work function, a material having a low work function can be used for the anode.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the material having a hole-transport property used for the composite material preferably has a hole mobility of $1\times10^{-6}$ $cm^2/Vs$ or higher. Organic compounds that can be used as the material having a hole-transport property in the composite material are specifically given below.

Examples of the aromatic amine compound that can be used for the composite material include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-bis(3-methylphenyl)aminophenyl]-N,N'-diphenyl-4,4'-diaminobiphenyl (abbreviation: DNTPD), and 1,3,5-tris[N-(4-diphenylaminophenyl)-N-phenylamino]benzene (abbreviation: DPA3B). Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), and 1,4-bis[4-(N-carbazolyl)phenyl]-2,3,5,6-tetraphenylbenzene.
Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon may have a vinyl skeleton. Examples of the aromatic hydrocarbon including a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples include high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

The material having a hole-transport property used for the composite material further preferably has any of a carbazole skeleton, a dibenzofuran skeleton, a dibenzothiophene skeleton, and an anthracene skeleton. In particular, an aromatic amine including a substituent that has a dibenzofuran ring or a dibenzothiophene ring, an aromatic monoamine that has a naphthalene ring, or an aromatic monoamine in which a 9-fluorenyl group is bonded to the nitrogen of the amine through an arylene group may be used. Note that the material with a hole-transport property preferably has an N,N-bis(4-biphenyl)amino group to enable fabricating a light-emitting device having a long lifetime. Specific examples of the material having a hole-transport property include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(biphenyl-4-yl)-9,9'-spirobi[9H-fluoren]-2-amine (abbreviation: BBASF), N,N-bis(biphenyl-4-yl)-9,9'-spirobi[9H-fluoren]-4-amine (abbreviation: BBASF(4)), N-(biphenyl-2-yl)-N-(9,9-dimethyl-9H-fluoren-2-yl)-9,9'-spirobi[9H-fluoren]-4-amine (abbreviation: oFBiSF), N-(biphenyl-4-yl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

It is further preferable that the material having a hole-transport property and used in the composite material have a relatively deep HOMO level higher than or equal to −5.7 eV and lower than or equal to −5.4 eV. Using the material with a hole-transport property which has a relatively deep HOMO level in the composite material makes it easy to inject holes into the hole-transport layer 112 and to obtain a light-emitting device having a long lifetime.

Note that mixing the above composite material with a fluoride of an alkali metal or an alkaline earth metal (the proportion of fluorine atoms in a layer using the mixed material is preferably higher than or equal to 20%) can lower the refractive index of the layer. This also enables a layer with a low refractive index to be formed in the organic compound layer 103, leading to higher external quantum efficiency of the light-emitting device.

The formation of the hole-injection layer 111 can improve the hole-injection property, which allows the light-emitting device to be driven at a low voltage. In addition, the organic compound having an acceptor property is easy to use because it is easily deposited by evaporation.

The hole-transport layer 112 is formed using a material having a hole-transport property. The material having a hole-transport property preferably has a hole mobility of $1\times10^{-6}$ $cm^2/Vs$ or higher.

Examples of the organic compound that can be used for the hole-transport layer 112 include compounds having an aromatic amine skeleton, such as 4,4'-bis[N-(1-naphthyl)-N-phenylamino]biphenyl (abbreviation: NPB), N,N'-diphenyl-N,N'-bis(3-methylphenyl)-4,4'-diaminobiphenyl (abbreviation: TPD), N,N'-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. Note that any of the substances given as examples of the organic compound that can be used for the composite material in the hole-injection layer 111 can also be suitably used as the material included in the hole-transport layer 112.

Note that the organic compound used for the hole-transport layer 112 is preferably an aromatic amine having an alkyl group, in which case the refractive index of the hole-transport layer 112 can be lowered and light extraction efficiency can be improved. It is further preferable to use an organic compound having a plurality of alkyl groups in one molecule. Preferable examples of such a material include N,N-bis(4-cyclohexylphenyl)-9,9-dimethyl-9H-fluoren-2-amine (abbreviation: dchPAF), N-[(4'-cyclohexyl)biphenyl-4-yl]-N-(4-cyclohexylphenyl)-9,9-dimethyl-9H-fluoren-2-amine (abbreviation: chBichPAF), N,N-bis(4-cyclohexylphenyl)-N-(spiro[cyclohexane-1,9'-[9H]fluoren]-2'-yl)amine (abbreviation: dchPASchF), N-[(4'-cyclohexyl)biphenyl-4-yl]-N-(4-cyclohexylphenyl)-N-(spiro[cyclohexane-1,9'-[9H]fluoren]-2'-yl)amine (abbreviation: chBichPASchF), N-(4-cyclohexylphenyl)bis(spiro[cyclohexane-1,9'-[9H]fluoren]-2'-yl)amine (abbreviation: SchFBlchP), N-[(3',5'-ditertiarybutyl)biphenyl-4-yl]-N-(4-cyclohexylphenyl)-9,9-dimethyl-9H-fluoren-2-amine (abbreviation: mmtBuBichPAF), N,N-bis(3',5'-ditertiarybutylbiphenyl-4-yl)-9,9-dimethyl-9H-fluoren-2-amine (abbreviation: dmmtBuBiAF), N-(3,5-ditertiarybutylphenyl)-N-(3',5'-ditertiarybutylbiphenyl-4-yl)-9,9-dimethyl-9H-fluoren-2-amine (abbreviation: mmtBuBimmtBuPAF), N,N-bis(4-cyclohexylphenyl)-9,9-dipropyl-9H-fluoren-2-amine (abbreviation: dchPAPrF), N-[(3',5'-dicyclohexyl)biphenyl-4-yl]-N-(4-cyclohexylphenyl)-9,9-dimethyl-9H-fluoren-2-amine (abbreviation: mmchBichPAF), N-(3,3",5,5"-tetra-t-butyl-1,1':3,1"-terphenyl-5'-yl)-N-(4-cyclohexylphenyl)-9,9-dimethyl-9H-fluoren-2-amine (abbreviation: mmtBumTPchPAF), N-(4-cyclododecylphenyl)-N-(4-cyclohexylphenyl)-9,9-dimethyl-9H-fluoren-2-amine (abbreviation: CdoPchPAF), N-(3,3",5,5"-tetra-t-butyl-1,1':3,1"-terphenyl-5'-yl)-N-phenyl-9,9-dimethyl-9H-fluoren-2-amine (abbreviation: mmtBumTPFA), N-(biphenyl-4-yl)-N-(3,3",5,5"-tetra-t-butyl-1,1':3,1"-terphenyl-5'-yl)-9,9-dimethyl-9H-fluoren-2-amine (abbreviation: mmtBumTPFBi), N-(biphenyl-2-yl)-N-(3,3",5,5"-tetra-t-butyl-1,1':3',1"-terphenyl-5'-yl)-9,9-dimethyl-9H-fluoren-2-amine (abbreviation: mmtBumTPoFBi), N-[(3,3',5'-tri-t-butyl)biphenyl-5-yl]-N-(4-cyclohexylphenyl)-9,9-dimethyl-9H-fluoren-2-amine (abbreviation: mmtBumBichPAF), N-(biphenyl-2-yl)-N-[(3,3',5'-tri-t-butyl)biphenyl-5-yl]-9,9-dimethyl-9H-fluoren-2-amine (abbreviation: mmtBumBioFBi), N-(4-tert-butylphenyl)-N-(3,3",5,5"-tetra-t-butyl-1,1':3',1"-terphenyl-5'-yl)-9,9-dimethyl-9H-fluoren-2-amine (abbreviation: mmtBumTPtBuPAF), N-(3,3",5',5"-tetra-tert-butyl-1,1':3',1"-terphenyl-5-yl)-N-phenyl-9,9-dimethyl-9H-fluoren-2-amine (abbreviation: mmtBumTPFA-02), N-(biphenyl-4-yl)-N-(3,3",5',5"-tetra-tert-butyl-1,1':3',1"-terphenyl-5-yl)-

9,9-dimethyl-9H-fluoren-2-amine (abbreviation: mmtBumTPFBi-02), N-(biphenyl-2-yl)-N-(3,3",5',5"-tetra-tert-butyl-1,1':3',1"-terphenyl-5-yl)-9,9-dimethyl-9H-fluoren-2-amine (abbreviation: mmtBumTPoFBi-02), N-(4-cyclohexylphenyl)-N-(3,3",5',5"-tetra-tert-butyl-1,1':3',1"-terphenyl-5-yl)-9,9-dimethyl-9H-fluoren-2-amine (abbreviation: mmtBumTPchPAF-02), N-(biphenyl-2-yl)-N-(3",5',5"-tri-tert-butyl-1,1':3',1"-terphenyl-5-yl)-9,9-dimethyl-9H-fluoren-2-amine (abbreviation: mmtBumTPoFBi-03), N-(4-cyclohexylphenyl)-N-(3",5',5"-tri-tert-butyl-1,1':3',1"-terphenyl-5-yl)-9,9-dimethyl-9H-fluoren-2-amine (abbreviation: mmtBumTPchPAF-03), N-(biphenyl-2-yl)-N-(3",5',5"-tri-tert-butyl-1,1':3',1"-terphenyl-4-yl)-9,9-dimethyl-9H-fluoren-2-amine (abbreviation: mmtBumTPoFBi-04), N-(4-cyclohexylphenyl)-N-(3",5',5"-tri-tert-butyl-1,1':3',1"-terphenyl-4-yl)-9,9-dimethyl-9H-fluoren-2-amine (abbreviation: mmtBumTPchPAF-04), N-(biphenyl-2-yl)-N-(3,3",5"-tri-tert-butyl-1,1':4',1"-terphenyl-5-yl)-9,9-dimethyl-9H-fluoren-2-amine (abbreviation: mmtBumTPoFBi-05), N-(4-cyclohexylphenyl)-N-(3,3",5"-tri-tert-butyl-1,1':4',1"-terphenyl-5-yl)-9,9-dimethyl-9H-fluoren-2-amine (abbreviation: mmtBumTPchPAF-05), and N-(3',5'-ditertiarybutylbiphenyl-4-yl)-N-(biphenyl-2-yl)-9,9-dimethyl-9H-fluoren-2-amine (abbreviation: mmtBuBioFBi).

Alternatively, the organic compound used for the hole-transport layer 112 preferably has a fluorene skeleton or a spirofluorene skeleton.

Alternatively, the organic compound used for the hole-transport layer 112 preferably has a carbazole skeleton.

The organic compound in the hole-transport layer 112 preferably has a HOMO level in the range of −5.45 eV to −5.20 eV, in which case a property of hole injection from the hole-injection layer or the anode can be favorable. This enables the light-emitting device to be driven at a low voltage.

The light-emitting layer 113 contains a host material and a substance causing light emission from the doublet excited level (typically, an organic complex containing $Ce^{3+}$ ($4f^1$)) as a light-emitting substance. The light-emitting layer 113 may additionally include other materials. Alternatively, the light-emitting layer 113 may be a stack of two layers with different compositions.

As the host material of the light-emitting layer, a material having a hole-transport property or an electron-transport property can be used. As such a host material, a material in whose singlet excited level is higher than and triplet excited level is lower than those of a substance causing light emission from the doublet excited level is used, in which case a highly reliable light-emitting device can be provided.

The material with a hole-transport property is preferably an organic compound having an amine skeleton or a π-electron rich heteroaromatic ring skeleton, for example. As the π-electron rich heteroaromatic ring, a fused aromatic ring having at least one of an acridine skeleton, a phenoxazine skeleton, a phenothiazine skeleton, a furan skeleton, a thiophene skeleton, and a pyrrole skeleton is preferable; specifically, a carbazole ring, a dibenzothiophene ring, or a ring in which an aromatic ring or a heteroaromatic ring is further fused to a carbazole ring or a dibenzothiophene ring is preferable.

Such an organic compound having a hole-transport property further preferably has any of a carbazole skeleton, a dibenzofuran skeleton, a dibenzothiophene skeleton, and an anthracene skeleton. In particular, an aromatic amine including a substituent that has a dibenzofuran ring or a dibenzothiophene ring, an aromatic monoamine that has a naphthalene ring, or an aromatic monoamine in which a 9-fluorenyl group is bonded to the nitrogen of the amine through an arylene group may be used. Note that the organic compound having a hole-transport property preferably includes an N,N-bis(4-biphenyl)amino group, which makes it possible to manufacture a light-emitting device with a long lifetime.

Examples of such an organic compound include a compound having an aromatic amine skeleton, such as 4,4'-bis[N-(1-naphthyl)-N-phenylamino]biphenyl (abbreviation: NPB), N,N'-diphenyl-N,N'-bis(3-methylphenyl)-4,4'-diaminobiphenyl (abbreviation: TPD), N,N'-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]-9,9'-spirobi[9H-fluoren]-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. In addition, the organic compounds given as examples of the first substance can also be used.

As the material with an electron-transport property, for example, a metal complex such as bis(10-hydroxybenzo[h]quinolinato)beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); or an organic compound having a Tc-electron deficient heteroaromatic ring skeleton is preferably used. Examples of the organic compound having a Tc-electron deficient heteroaromatic ring skeleton include an organic compound that includes a heteroaromatic ring having a polyazole skeleton, an organic compound that includes a heteroaromatic ring having a pyridine skeleton, an organic compound that includes a heteroaromatic ring having a diazine skeleton, and an organic compound that includes a heteroaromatic ring having a triazine skeleton.

Among the above materials, the organic compound that includes a heteroaromatic ring having a diazine skeleton (a pyrimidine skeleton, a pyrazine skeleton, or a pyridazine skeleton), the organic compound that includes a heteroaromatic ring having a pyridine skeleton, and the organic compound that includes a heteroaromatic ring having a triazine skeleton have high reliability and thus are preferable. In particular, the organic compound that includes a heteroaromatic ring having a diazine (pyrimidine or pyrazine) skeleton and the organic compound that includes a heteroaromatic ring having a triazine skeleton have a high electron-transport property to contribute to a reduction in driving voltage. A benzofuropyrimidine skeleton, a benzothienopyrimidine skeleton, a benzofuropyrazine skeleton, and a benzothienopyrazine skeleton are preferable because of their high acceptor properties and high reliability.

Examples of the organic compound having a T-electron deficient heteroaromatic ring skeleton include heterocyclic compounds having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); heterocyclic compounds having a triazine skeleton, such as 2-[3'-(9,9-dimethyl-9H-fluoren-2-yl)biphenyl-3-yl]-4,6-diphenyl-1,3,5-triazine (abbreviation: mFBPTzn), 2-(biphenyl-4-yl)-4-phenyl-6-(9,9'-spirobi[9H-fluoren]-2-yl)-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), and 2-{3-[3-(benzo[b]naphtho[1,2-d]furan-6-yl)phenyl]phenyl}-4,6-diphenyl-1,3,5-triazine (abbreviation: mBnfBPTzn-02); and heterocyclic compounds having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above materials, the heterocyclic compound having a diazine skeleton, the heterocyclic compound having a triazine skeleton, and the heterocyclic compound having a pyridine skeleton have high reliability and thus are preferable. In particular, the heterocyclic compound having a diazine (e.g., pyrimidine or pyrazine) skeleton has a good electron-transport property to contribute to a reduction in driving voltage.

A TADF material can also be used as the host material. Examples of the TADF material that can be used as the host material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$), which are represented by the following structural formulae.

[Chemical Formula 7]

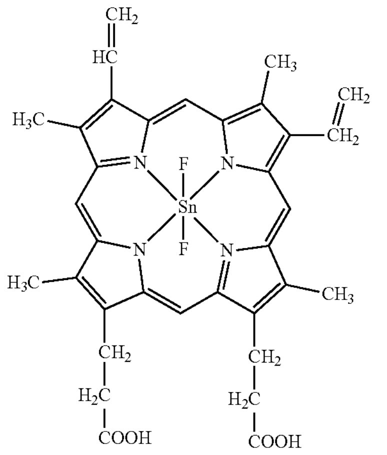

$SnF_2$(Proto IX)

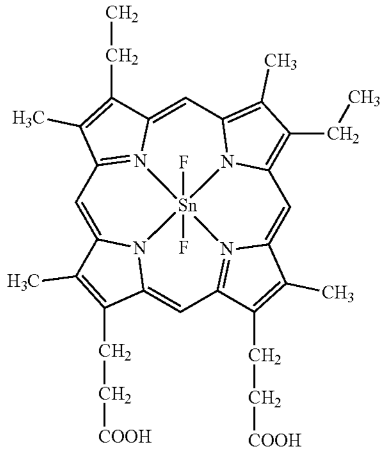

$SnF_2$(Meso IX)

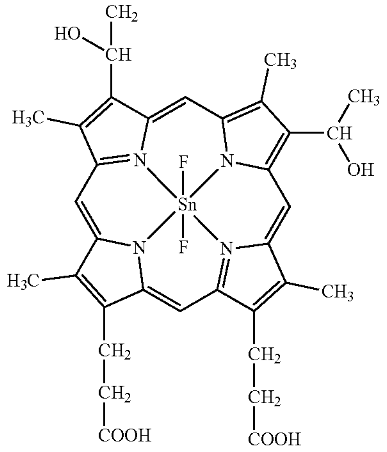

$SnF_2$(Hemato IX)

-continued

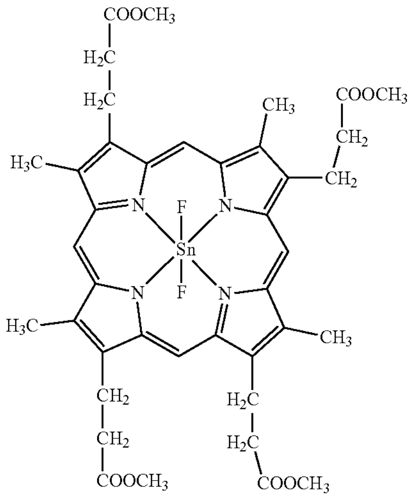

SnF2(Copro III-4Me)

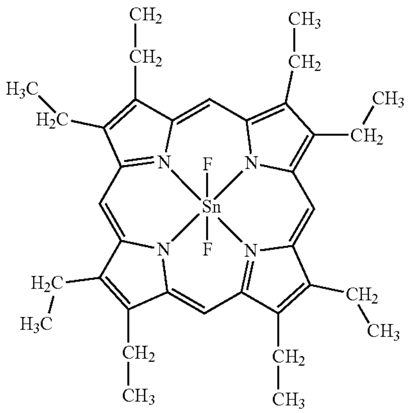

SnF2(OEP)

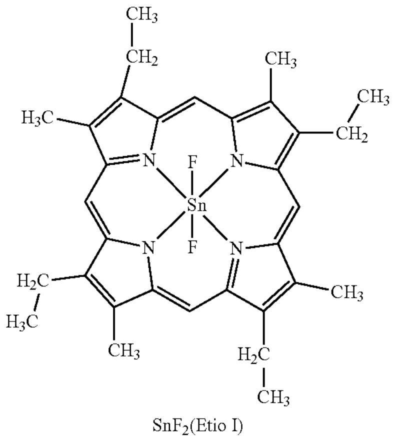

SnF2(Etio I)

-continued

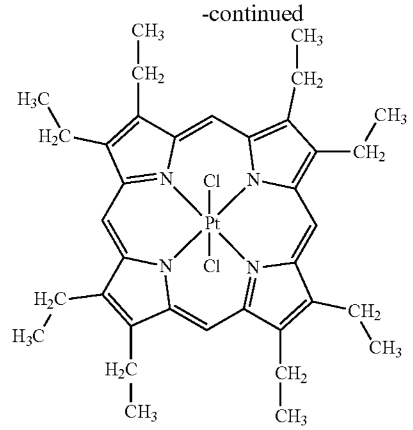

PtCl2OEP

Alternatively, a heterocyclic compound having one or both of a $\pi$-electron rich heteroaromatic ring and a $\pi$-electron deficient heteroaromatic ring that is represented by any of the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 9-[4-(4,6-diphenyl-1,3,5-triazin-2-yl)phenyl]-9'-phenyl-9H,9'H-3,3'-bicarbazole (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. Such a heterocyclic compound is preferable because of having high electron-transport and hole-transport properties owing to a $\pi$-electron rich heteroaromatic ring and a $\pi$-electron deficient heteroaromatic ring. Among skeletons having the $\pi$-electron deficient heteroaromatic ring, a pyridine skeleton, a diazine skeleton (a pyrimidine skeleton, a pyrazine skeleton, and a pyridazine skeleton), and a triazine skeleton are preferable because of their high stability and reliability. In particular, a benzofuropyrimidine skeleton, a benzothienopyrimidine skeleton, a benzofuropyrazine skeleton, and a benzothienopyrazine skeleton are preferred because of their good acceptor properties and high reliability. Among skeletons having the $\pi$-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the $\pi$-electron rich heteroaromatic ring is directly bonded to the $\pi$-electron deficient heteroaromatic ring is particularly preferred because the electron-donating property of the $\pi$-electron rich heteroaromatic ring and the electron-accepting property of the $\pi$-electron deficient heteroaromatic ring are both improved, the energy difference between the $S_1$ level and the $T_1$ level becomes small, and thus thermally activated delayed fluorescence can be obtained with high efficiency. Note that an aromatic ring to which an electron-withdrawing group such as a cyano group is bonded may be used instead of the n-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a cyano group or a nitrile group, such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 8]

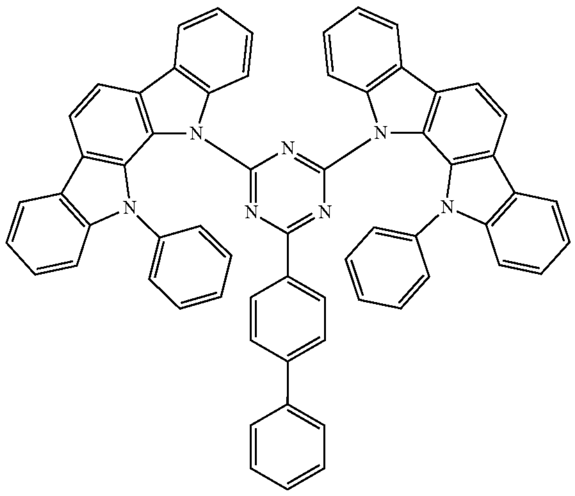

PIC-TRZ

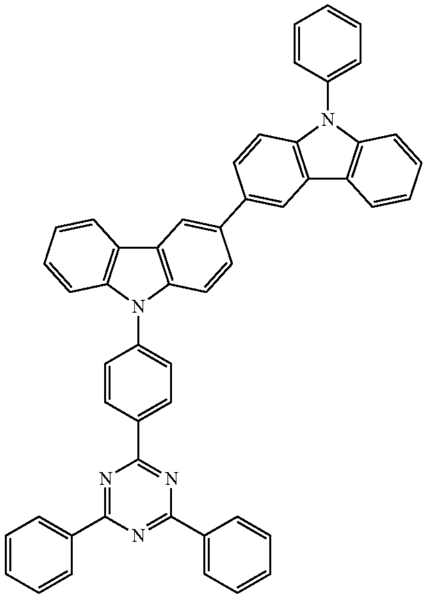

PCCzPtzn

-continued

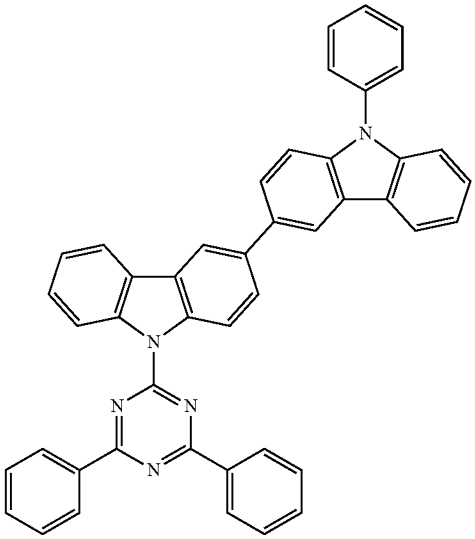

PCCzTzn

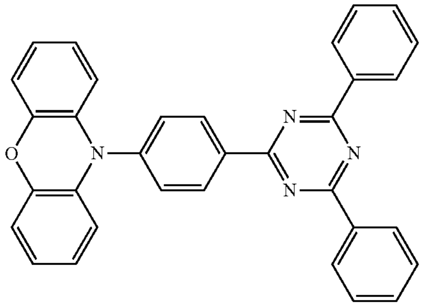

PXZ-TRZ

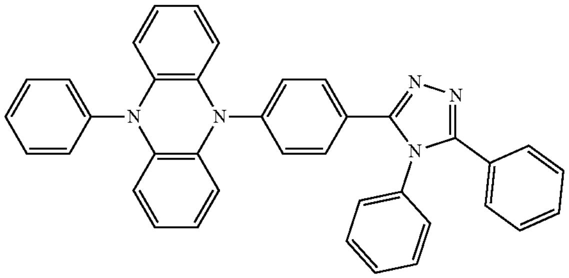

PPZ-3TPT

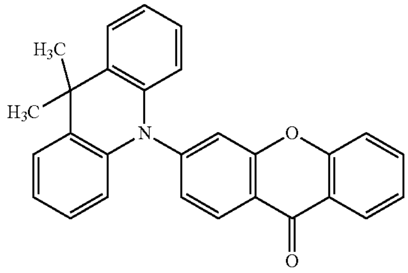

ACRXTN

-continued

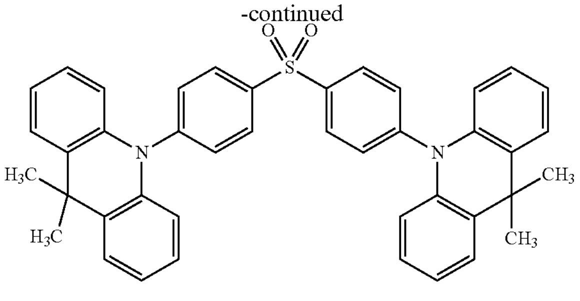

DMAC-DPS

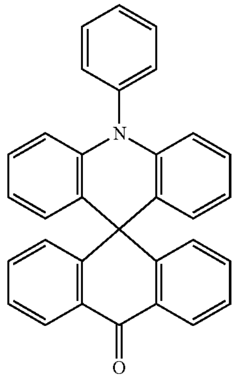

ACRSA

Note that a TADF material is a material having a small difference between the $S_1$ level and the $T_1$ level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. In addition, the triplet excitation energy can be converted into luminescence.

A phosphorescent spectrum observed at a low temperature (e.g., any of temperatures ranging from 4 K to 77 K) is used for an index of the $T_1$ level. When the level of energy with a wavelength of the line obtained by extrapolating a tangent to the fluorescent spectrum at a tail on the short wavelength side is the $S_1$ level and the level of energy with a wavelength of the line obtained by extrapolating a tangent to the phosphorescent spectrum at a tail on the short wavelength side is the $T_1$ level, the difference between the $S_1$ level and the $T_1$ level of the TADF material is preferably smaller than or equal to 0.3 eV, further preferably smaller than or equal to 0.2 eV.

The host material may be formed using a single material in some cases and forms using a plurality of materials in other cases. In the case where the host material is formed using a plurality of materials, a combination of materials with different transport properties facilitates the adjustment of carrier balance in the light-emitting layer 113, so that a recombination region can be easily controlled. The weight ratio of the content of the material having a hole-transport property to the content of the material having an electron-transport property may be 1:19 to 19:1.

A plurality of materials included in the host material may form an exciplex. The materials are preferably selected so as to form an exciplex that exhibits light emission whose wavelength overlaps with the wavelength on a lowest-energy-side absorption band of the light-emitting substance, in which case energy can be transferred smoothly and light emission can be obtained efficiently. The use of such a structure is preferable because the driving voltage can also be reduced.

An exciplex has an extremely small difference between the $S_1$ level and the $T_1$ level and also functions as a TADF material capable of converting triplet excitation energy into singlet excitation energy.

In order to form an exciplex efficiently, a material having an electron-transport property is preferably combined with a material having a hole-transport property and a HOMO level higher than or equal to that of the material having an electron-transport property. In addition, the LUMO level of the material having a hole-transport property is preferably higher than or equal to that of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the hole-transport material and the electron-transport material are mixed is shifted to the longer wavelength side than the emission spectrum of each of the hole-transport material and the electron-transport material (or has another peak on the longer wavelength side) observed by comparison of the emission spectra of the hole- and electron-transport materials and the mixed materials, for example. Alternatively, the formation of an exciplex can be confirmed by a difference in transient response, such as a phenomenon in which the transient photoluminescence (PL) lifetime of the mixed film has longer lifetime components or a larger proportion of delayed components than the transient PL lifetime of each of the hole-transport and electron-transport materials, observed by comparison of transient (PL) of the hole-transport material, the electron-transport material, and the mixed film of these materials. The transient PL can be rephrased as transient electroluminescence (EL). That is, the formation of an exciplex can also be confirmed by a difference in transient response observed by comparison of the transient EL of the hole-transport material, the electron-transport material, and the mixed film of these materials.

Note that the light-emitting layer 113 may contain a fluorescent material exhibiting light from the singlet excited state and obtain light emission from the fluorescent material. Examples of the material that can be used as the above-described fluorescent material in the light-emitting layer 113 include fluorescent materials described below. Other fluorescent materials can also be used. In this case, the singlet excited level of the fluorescent material is preferably lower than an organic complex containing $Ce^{3+}$ ($4f^1$) as an energy donor.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis (N,N',N'-triphenyl-1,4-phenylenediamine) (abbreviation: DPABPA), N,9-diphenyl-N-[4-(9,10-diphenyl-2-anthryl) phenyl]-9H-carbazol-3-amine (abbreviation: 2PCAPPA), N-[4-(9,10-diphenyl-2-anthryl)phenyl]-N,N',N'-triphenyl-1, 4-phenylenediamine (abbreviation: 2DPAPPA), N,N,N',N', N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(biphenyl-2-yl)-2-anthryl]-N,N',N'-triphenyl-1,4-phenylenediamine (abbreviation: 2DPABPhA), 9,10-bis (biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(biphenyl-4-yl)-6, 11-diphenyltetracene (abbreviation: BPT), 2-(2-{2-[4-(dimethylamino)phenyl]ethenyl}-6-methyl-4H-pyran-4-ylidene) propanedinitrile (abbreviation: DCM1), 2-{2-methyl-6-[2-(2,3,6,7-tetrahydro-1H,5H-benzo[ij]quinolizin-9-yl) ethenyl]-4H-pyran-4-ylidene}propanedinitrile (abbreviation: DCM2), N,N,N',N'-tetrakis(4-methylphenyl) tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b] naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b'] bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, and high reliability.

A fused heteroaromatic compound containing nitrogen and boron, especially a compound having a diaza-boranaphtho-anthracene skeleton, exhibits a narrow emission spectrum, emits blue light with favorable color purity, and can thus be used suitably. Examples of the compound include 5,9-diphenyl-5,9-diaza-13b-boranaphtho[3,2,1-de]anthracene (abbreviation: DABNA1), 9-(biphenyl-3-yl)-N,N,5,11-tetraphenyl-5,9-dihydro-5,9-diaza-13b-boranaphtho[3,2,1-de]anthracene-3-amine (abbreviation: DABNA2), 2,12-di (tert-butyl)-5,9-di(4-tert-butylphenyl)-N,N'-diphenyl-5H, 9H-[1,4]benzazaborino[2,3,4-kl]phenazaborin-7-amine (abbreviation: DPhA-tBu4DABNA), 2,12-di(tert-butyl)-N, N,5,9-tetra(4-tert-butylphenyl)-5H,9H-[1,4]benzazaborino [2,3,4-kl]phenazaborin-7-amine (abbreviation: tBuDPhA-tBu4DABNA), 2,12-di(tert-butyl)-5,9-di(4-tert-butylphenyl)-7-methyl-5H,9H-[1,4]benzazaborino[2,3,4-kl] phenazaborine (abbreviation: Me-tBu4DABNA), $N^7$,$N^7$, $N^{13}$,$N^{13}$,5,9,11,15-octaphenyl-5H,9H,11H,15H-[1,4] benzazaborino[2,3,4-kl][1,4]benzazaborino[4',3',2':4,5][1,4] benzazaborino[3,2-b]phenazaborin-7,13-diamine (abbreviation: v-DABNA), and 2-(4-tert-butylphenyl)benz [5,6]indolo[3,2,1-jk]benzo[b]carbazole (abbreviation: tBuPBibc).

Besides the above compounds, 9,10,11-tris[3,6-bis(1,1-dimethylethyl)-9H-carbazol-9-yl]-2,5,15,18-tetrakis(1,1-dimethylethyl)indolo[3,2,1-de]indolo[3',2',1':8,1][1,4]benzazaborino[2,3,4-kl]phenazaborine (abbreviation: BBCz-G), 9,11-bis[3,6-bis(1,1-dimethylethyl)-9H-carbazol-9-yl]-2,5,15,18-tetrakis(1,1-dimethylethyl)indolo[3,2,1-de]indolo [3',2',1':8,1][1,4]benzazaborino[2,3,4-kl]phenazaborine (abbreviation: BBCz-Y), or the like can be suitably used.

The energy transfer from the energy donor in the doublet excited state to the singlet excited state of the fluorescent material occurs very efficiency. Moreover, the fluorescent material has a short exciton lifetime. Thus, the light-emitting device with the structure described above is highly reliable and emits light very efficiently. Besides, the light-emitting device can have favorable chromaticity and color purity because of emitting light from the fluorescent material.

The electron-transport layer 114 contains a substance having an electron-transport property. As the substance having an electron-transport property, it is possible to use any of the above-listed substances with electron-transport properties that can be used as the host material.

Note that the electron-transport layer preferably includes a material having an electron-transport property and an alkali metal, an alkaline earth metal, a compound thereof, or a complex thereof. The electron mobility of the electron-transport layer 114 in the case where the square root of the electric field strength [V/cm] is 600 is preferably higher than or equal to $1\times10^{-7}$ $cm^2/Vs$ and lower than or equal to $5\times10^{-5}$ $cm^2/Vs$. The amount of electrons injected into the light-emitting layer can be controlled by the reduction in the electron-transport property of the electron-transport layer 114, whereby the light-emitting layer can be prevented from having excess electrons. It is particularly preferable to employ this structure when the hole-injection layer is formed using a composite material that includes a material having a hole-transport property with a relatively deep HOMO level higher than or equal to −5.7 eV and lower than or equal to −5.4 eV, in which case a long lifetime can be achieved. In this case, the material having an electron-transport property preferably has a HOMO level higher than or equal to −6.0 eV. The material having an electron-transport property is preferably an organic compound having an anthracene skeleton and further preferably an organic compound having both an anthracene skeleton and a heterocyclic skeleton. The heterocyclic skeleton is preferably a nitrogen-containing five-membered ring skeleton or a nitrogen-containing six-membered ring skeleton, and particularly preferably a nitrogen-containing five-membered ring skeleton or a nitrogen-containing six-membered ring skeleton that includes two heteroatoms in the ring, such as a pyrazole ring, an imidazole ring, an oxazole ring, a thiazole ring, a pyrazine ring, a pyrimidine ring, or a pyridazine ring. In addition, it is preferable that the alkali metal, the alkaline earth metal, the compound thereof, or the complex thereof include a 8-hydroxyquinolinato structure. Specific examples include 8-hydroxyquinolinato-lithium (abbreviation: Liq)

and 8-hydroxyquinolinato-sodium (abbreviation: Naq). In particular, a complex of a monovalent metal ion, especially a complex of lithium is preferable, and Liq is further preferable. Note that in the case where the 8-hydroxyquinolinato structure is included, a methyl-substituted product (e.g., a 2-methyl-substituted product or a 5-methyl-substituted product) of the alkali metal, the alkaline earth metal, the compound, or the complex can also be used, for example. There is preferably a difference in the concentration (including 0) of the alkali metal, the alkaline earth metal, the compound thereof, or the complex thereof in the electron-transport layer in the thickness direction.

A layer containing an alkali metal, an alkaline earth metal, or a compound thereof such as lithium fluoride (LiF), cesium fluoride (CsF), calcium fluoride ($CaF_2$), or 8-hydroxyquinolinato-lithium (abbreviation: Liq) may be provided as the electron-injection layer 115 between the electron-transport layer 114 and the cathode. An electride or a layer that is formed using a substance having an electron-transport property and includes an alkali metal, an alkaline earth metal, or a compound thereof can be used as the electron-injection layer 115. Examples of the electride include a substance in which electrons are added at high concentration to calcium oxide-aluminum oxide.

Note that as the electron-injection layer 115, it is possible to use a layer containing a substance having an electron-transport property (preferably an organic compound having a bipyridine skeleton) that contains a fluoride of the alkali metal or the alkaline earth metal at a concentration higher than or equal to that at which the electron-injection layer 115 becomes in a microcrystalline state (50 wt % or higher). Since the layer has a low refractive index, a light-emitting device including the layer can have favorable external quantum efficiency.

Figure 2B:
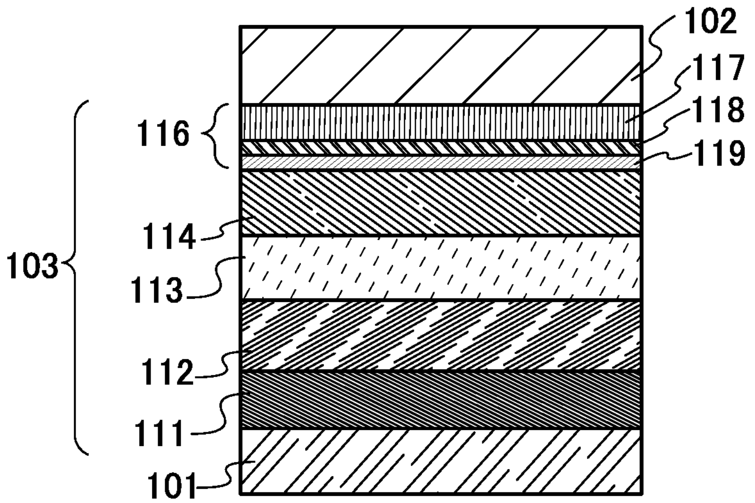

Instead of the electron-injection layer 115, a charge-generation layer 116 may be provided (FIG. 2B). The charge-generation layer 116 refers to a layer capable of injecting holes into a layer in contact with the cathode side of the charge-generation layer 116 and electrons into a layer in contact with the anode side thereof when a potential is applied. The charge-generation layer 116 includes at least a p-type layer 117. The p-type layer 117 is preferably formed using any of the composite materials given above as examples of materials that can be used for the hole-injection layer 111. The p-type layer 117 may be formed by stacking a film containing the above-described acceptor material as a material included in the composite material and a film containing a hole-transport material. When a potential is applied to the p-type layer 117, electrons are injected into the electron-transport layer 114 and holes are injected into the cathode; thus, the light-emitting device operates. Since the organic compound of one embodiment of the present invention has a low refractive index, using the organic compound for the p-type layer 117 enables the light-emitting device to have high external quantum efficiency.

Note that the charge-generation layer 116 preferably includes one or both of an electron-relay layer 118 and an electron-injection buffer layer 119 in addition to the p-type layer 117.

The electron-relay layer 118 contains at least the substance having an electron-transport property and has a function of preventing an interaction between the electron-injection buffer layer 119 and the p-type layer 117 and smoothly transferring electrons. The LUMO level of the substance having an electron-transport property included in the electron-relay layer 118 is preferably between the LUMO level of the acceptor substance in the p-type layer 117 and the LUMO level of a substance included in a layer of the electron-transport layer 114 that is in contact with the charge-generation layer 116. As a specific value of the energy level, the LUMO level of the substance having an electron-transport property in the electron-relay layer 118 is preferably higher than or equal to −5.0 eV, further preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

The electron-injection buffer layer 119 can be formed using a substance having a high electron-injection property, e.g., an alkali metal, an alkaline earth metal, a rare earth metal, or a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)).

In the case where the electron-injection buffer layer 119 contains a substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, or a compound thereof (e.g., an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)). As the substance having an electron-transport property, a material similar to the above-described material for the electron-transport layer 114 can be used.

For the cathode, a metal, an alloy, an electrically conductive compound, or a mixture thereof having a low work function (specifically, lower than or equal to 3.8 eV) can be used, for example. Specific examples of such a cathode material include elements belonging to Group 1 or 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the cathode and the electron-transport layer, a variety of conductive materials such as Al, Ag, ITO, and indium oxide-tin oxide containing silicon or silicon oxide can be used for the cathode regardless of the work function. Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed.

Furthermore, any of a variety of methods can be used for forming the organic compound layer 103, regardless of a dry method or a wet method. For example, a vacuum evaporation method, a gravure printing method, an offset printing method, a screen printing method, an ink-jet method, a spin coating method, or the like may be used.

Different deposition methods may be used to form the electrodes or the layers described above.

The structure of the layers provided between the first electrode 101 and the second electrode 102 is not limited to the above-described structure. Preferably, a light-emitting region where holes and electrons recombine is positioned away from the first electrode 101 and the second electrode 102 so as to inhibit quenching due to the proximity of the light-emitting region and the metal used for the electrodes or carrier-injection layers.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting material of the light-emitting layer or the light-emitting material contained in the light-emitting layer.

Next, an embodiment of a light-emitting device with a structure in which a plurality of light-emitting units are stacked (this type of light-emitting device is also referred to as a stacked or tandem device) is described with reference to FIG. 2C. This light-emitting device includes a plurality of light-emitting units between an anode and a cathode. One light-emitting unit has substantially the same structure as the organic compound layer 103 illustrated in FIG. 2A. In other words, the light-emitting device illustrated in FIG. 2A or 2B includes a single light-emitting unit, and the light-emitting device illustrated in FIG. 2C includes a plurality of light-emitting units.

Figure 2C:
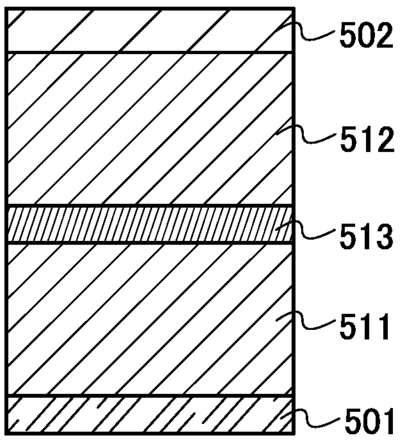

In FIG. 2C, a first light-emitting unit 511 and a second light-emitting unit 512 are stacked between a first electrode 501 and a second electrode 502, and a charge-generation layer 513 is provided between the first light-emitting unit 511 and the second light-emitting unit 512. The first electrode 501 and the second electrode 502 correspond, respectively, to the first electrode 101 and the second electrode 102 illustrated in FIG. 2A, and can be formed using the materials given in the description for FIG. 2A. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when voltage is applied between the first electrode 501 and the second electrode 502. That is, in FIG. 2C, the charge-generation layer 513 injects electrons into the first light-emitting unit 511 and holes into the second light-emitting unit 512 when voltage is applied such that the potential of the anode becomes higher than the potential of the cathode.

The charge-generation layer 513 preferably has a structure similar to that of the charge-generation layer 116 described with reference to FIG. 2B. A composite material of an organic compound and a metal oxide enables low-voltage driving and low-current driving because of having an excellent carrier-injection property and an excellent carrier-transport property. In the case where the anode-side surface of a light-emitting unit is in contact with the charge-generation layer 513, the charge-generation layer 513 can also function as a hole-injection layer of the light-emitting unit; therefore, a hole-injection layer is not necessarily provided in the light-emitting unit.

In the case where the charge-generation layer 513 includes the electron-injection buffer layer 119, the electron-injection buffer layer 119 functions as the electron-injection layer in the light-emitting unit on the anode side; thus, an electron-injection layer is not necessarily formed in the light-emitting unit on the anode side.

The light-emitting device having two light-emitting units is described with reference to FIG. 2C; however, one embodiment of the present invention can also be applied to a light-emitting device in which three or more light-emitting units are stacked. With a plurality of light-emitting units partitioned by the charge-generation layer 513 between a pair of electrodes as in the light-emitting device of this embodiment, it is possible to provide a long-life element that can emit light with high luminance at a low current density.

When the emission colors of the light-emitting units are different, light emission of a desired color can be obtained from the light-emitting device as a whole. For example, in a light-emitting device having two light-emitting units, the emission colors of the first light-emitting unit may be red and green and the emission color of the second light-emitting unit may be blue, so that the light-emitting device can emit white light as the whole.

The organic compound layer 103, the first light-emitting unit 511, the second light-emitting unit 512, the layers such as the charge-generation layer, and the electrodes that are described above can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the above components.

Embodiment 3

In this embodiment, a display device including the light-emitting device described in Embodiments 1 and 2 will be described.

Figure 3A:
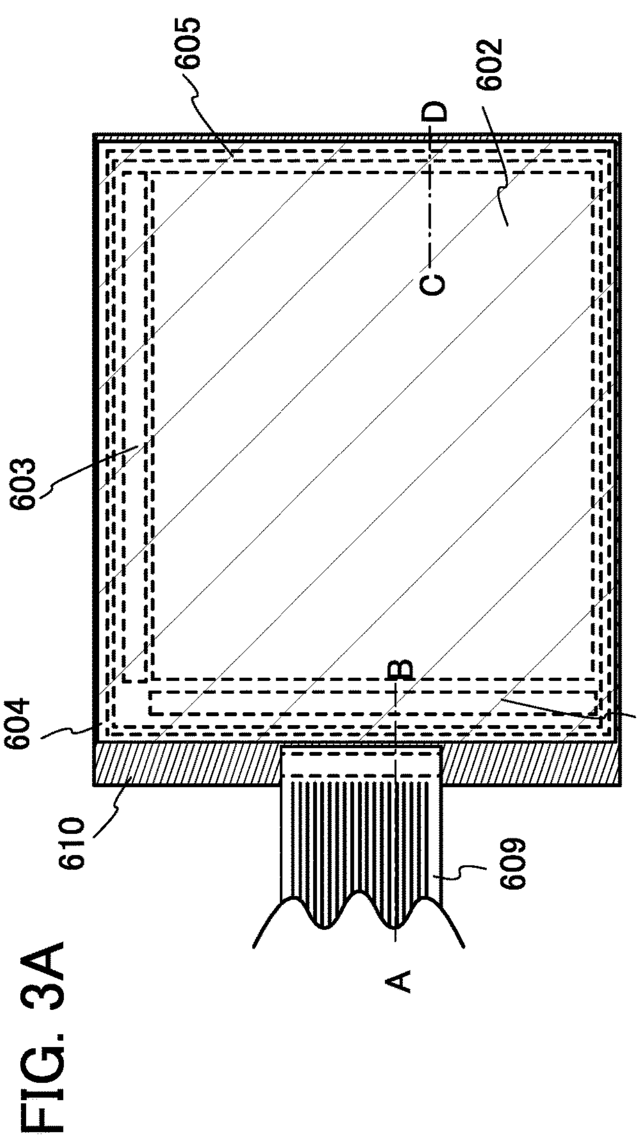
FIGS. 3A and 3B illustrate a display device of one embodiment of the present invention.
Figure 3B:
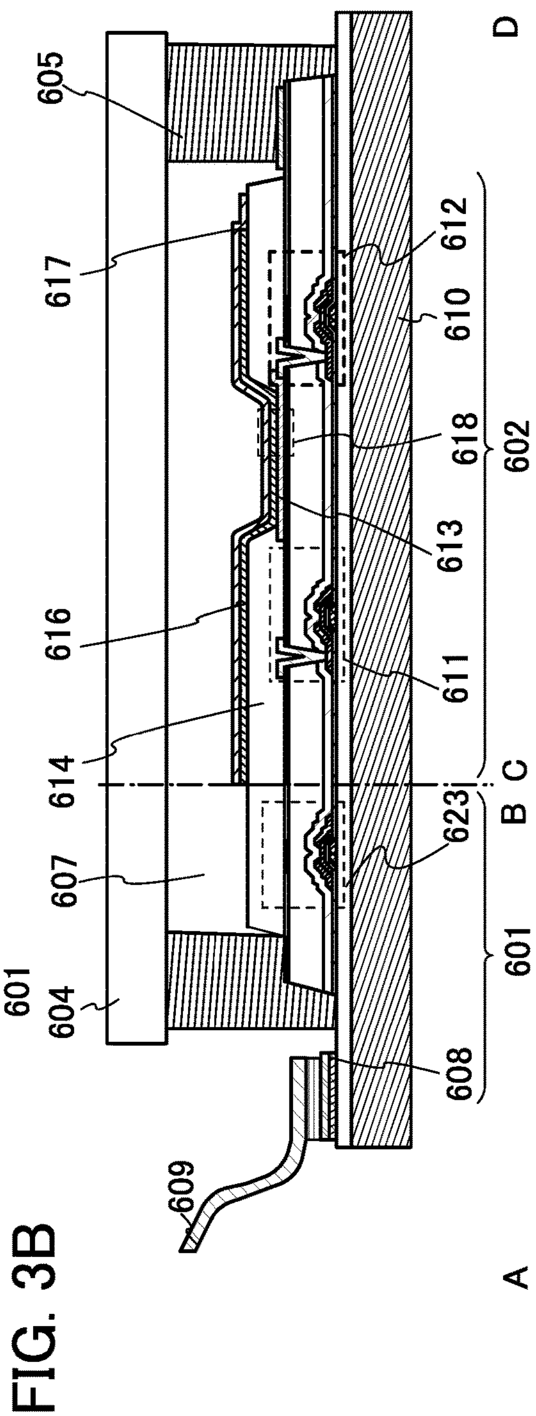

In this embodiment, the display device manufactured using the light-emitting device described in Embodiments 1 and 2 is described with reference to FIGS. 3A and 3B. Note that FIG. 3A is a top view of the display device and FIG. 3B is a cross-sectional view taken along the lines A-B and C-D in FIG. 3A. This display device includes a driver circuit portion (source line driver circuit) 601, a pixel portion 602, and a driver circuit portion (gate line driver circuit) 603, which are to control light emission of a light-emitting device and illustrated with dotted lines. Reference numeral 604 denotes a sealing substrate; 605, a sealing material; and 607, a space surrounded by the sealing material 605.

Reference numeral 608 denotes a lead wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The display device in the present specification includes, in its category, not only the display device itself but also the display device provided with the FPC or the PWB.

Next, a cross-sectional structure is described with reference to FIG. 3B. The driver circuit portions and the pixel portion are formed over an element substrate 610; FIG. 3B shows the source line driver circuit 601, which is a driver circuit portion, and one pixel in the pixel portion 602.

The element substrate 610 may be a substrate containing glass, quartz, an organic resin, a metal, an alloy, or a semiconductor or a plastic substrate formed of fiber reinforced plastic (FRP), polyvinyl fluoride (PVF), polyester, or an acrylic resin.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and either an amorphous semiconductor or a semiconductor having crystallinity (a microcrystalline semiconductor, a polycrystalline semiconductor, a single crystal semiconductor, or a semiconductor partly including crystal regions) can be used. It is preferable to use a semiconductor having crystallinity, in which case degradation of transistor characteristics can be inhibited.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics of the transistor and the like, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is described as a transistor formed in the driver circuit portion 601. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

Note that an insulator 614 is formed to cover an end portion of the first electrode 613. Here, the insulator 614 can be formed using a positive photosensitive acrylic resin film.

In order to improve coverage with an organic compound layer or the like which is formed later, the insulator 614 is formed to have a curved surface with curvature at its upper or lower end portion. For example, in the case where positive photosensitive acrylic resin is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An organic compound layer 616 and a second electrode 617 are formed over the first electrode 613. Here, as a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The organic compound layer 616 is formed by any of a variety of methods such as an evaporation method using an evaporation mask, an ink-jet method, and a spin coating method. The organic compound layer 616 has the structure described in Embodiments 1 and 2. As another material included in the organic compound layer 616, a low molecular compound or a high molecular compound (including an oligomer or a dendrimer) may be used.

As a material used for the second electrode 617, which is formed over the organic compound layer 616 and functions as a cathode, a material having a low work function (e.g., Al, Mg, Li, and Ca, or an alloy or a compound thereof, such as MgAg, MgIn, and AlLi) is preferably used. In the case where light generated in the organic compound layer 616 is transmitted through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting device is formed with the first electrode 613, the organic compound layer 616, and the second electrode 617. The light-emitting device is the light-emitting device described in Embodiments 1 and 2. In the display device of this embodiment, the pixel portion, which includes a plurality of light-emitting devices, may include both the light-emitting device described in Embodiments 1 and 2 and a light-emitting device having a different structure.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 may be filled with a filler, or may be filled with an inert gas (such as nitrogen or argon), or the sealing material. The structure of the sealing substrate in which a recessed portion is formed and a desiccant is provided is preferable because deterioration due to the influence of moisture can be inhibited.

An epoxy-based resin or glass frit is preferably used for the sealing material 605. It is preferable that such a material not be permeable to moisture or oxygen as much as possible. As the sealing substrate 604, a glass substrate, a quartz substrate, or a plastic substrate formed of fiber reinforced plastic (FRP), polyvinyl fluoride (PVF), polyester, and acrylic resin can be used.

Although not illustrated in FIGS. 3A and 3B, a protective film may be provided over the second electrode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material which an impurity such as water does not permeate easily. Thus, diffusion of an impurity such as water from the outside into the inside can be effectively suppressed.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and lower surfaces of a touch panel.

As described above, the display device manufactured using the light-emitting device described in Embodiments 1 and 2 can be obtained.

The display device in this embodiment is manufactured using the light-emitting device described in Embodiments 1 and 2 and thus can have favorable characteristics. Specifically, since the light-emitting device described in Embodiments 1 and 2 has high emission efficiency, the display device can achieve low power consumption. Since the light-emitting device described in Embodiments 1 and 2 has high reliability, the display device can be highly reliable. In addition, since the light-emitting device described in Embodiments 1 and 2 can have favorable chromaticity and high color purity, the display device can achieve high display quality.

This embodiment can be freely combined with any of the other embodiments.

Embodiment 4

Figure 4A:
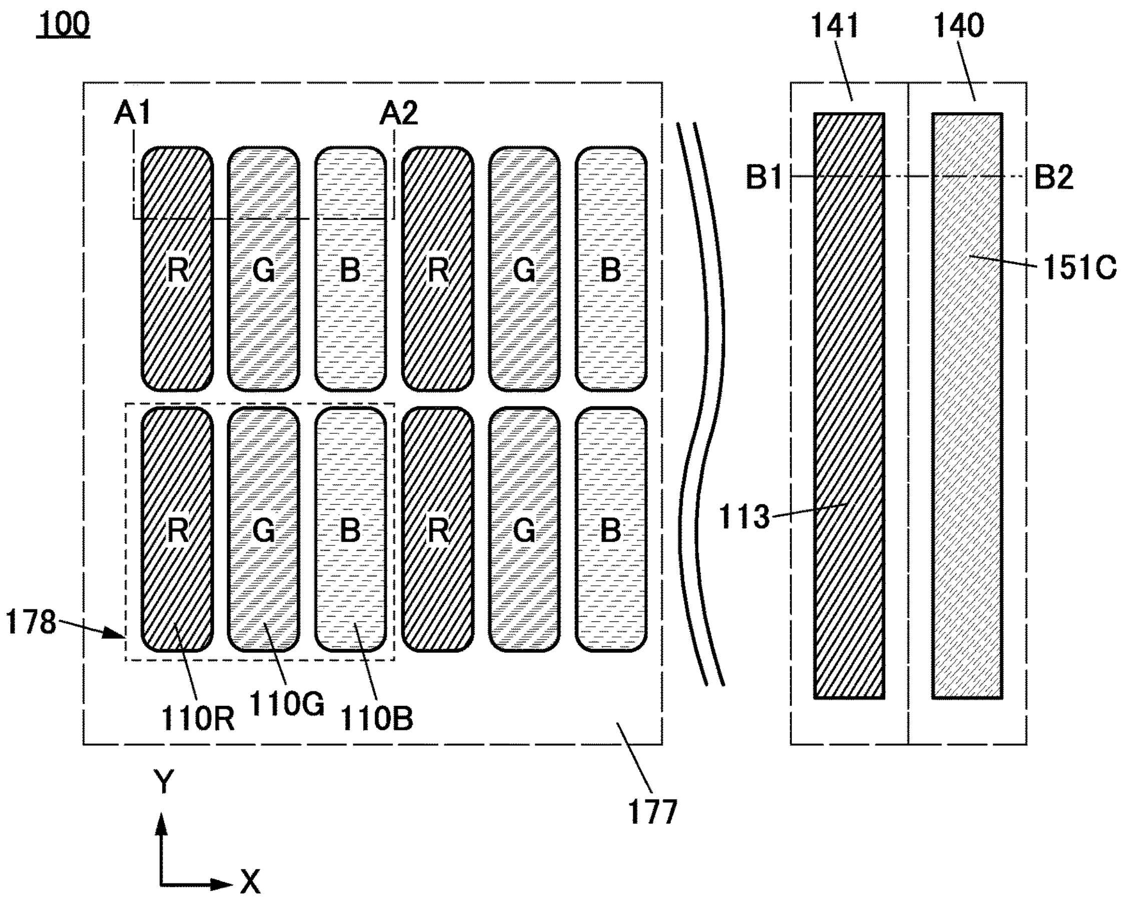
FIGS. 4A and 4B illustrate a display device of one embodiment of the present invention.
Figure 4B:
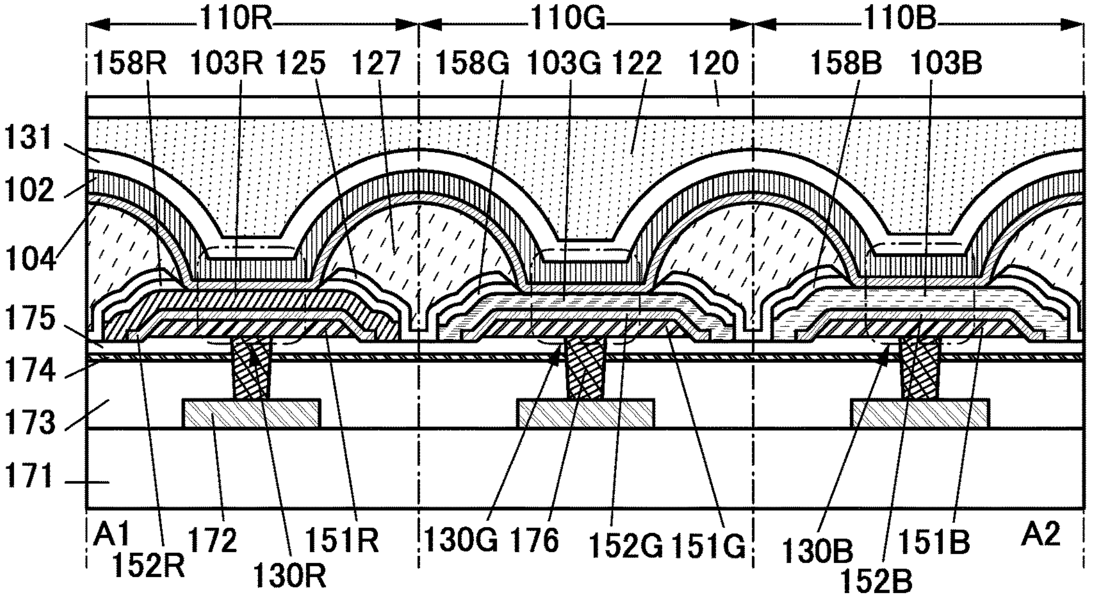

As illustrated in FIGS. 4A and 4B, a plurality of light-emitting devices are formed over an insulating layer 175 to constitute a display device. In this embodiment, the display device of another embodiment of the present invention will be described in detail.

A display device 100 includes a pixel portion 177 in which a plurality of pixels 178 are arranged in matrix. The pixel 178 includes a subpixel 110R, a subpixel 110G, and a subpixel 110B.

In this specification and the like, for example, description common to the subpixels 110R, 110G, and 110B is sometimes made using the collective term "subpixel 110". As for other components that are distinguished from each other using letters of the alphabet, matters common to the components are sometimes described using reference numerals excluding the letters of the alphabet.

The subpixel 110R emits red light, the subpixel 110G emits green light, and the subpixel 110B emits blue light. Thus, an image can be displayed on the pixel portion 177. Note that in this embodiment, three colors of red (R), green (G), and blue (B) are given as examples of colors of light emitted by the subpixels; however, subpixels of a different combination of colors may be employed. The number of subpixels is not limited to three, and may be four or more. Examples of four subpixels include subpixels emitting light of four colors of R, G, B, and white (W), subpixels emitting light of four colors of R, G, B, and Y, and four subpixels emitting light of R, G, and B and infrared light (IR).

In this specification and the like, the row direction and the column direction are sometimes referred to as the X direction and the Y direction, respectively. The X direction and the Y direction intersect with each other and are perpendicular to each other, for example.

FIG. 4A illustrates an example where subpixels of different colors are arranged in the X direction and subpixels of the same color are arranged in the Y direction. Note that subpixels of different colors may be arranged in the Y direction, and subpixels of the same color may be arranged in the X direction.

Outside the pixel portion 177, a region 141 is provided and a connection portion 140 may also be provided. The region 141 is provided between the pixel portion 177 and the connection portion 140. The organic compound layer 113 is provided in the region 141. A conductive layer 151C is provided in the connection portion 140.

Although FIG. 4A illustrates an example where the region 141 and the connection portion 140 are positioned on the right side of the pixel portion 177, the positions of the region 141 and the connection portion 140 are not particularly limited. The number of the regions 141 and the number of the connection portions 140 can each be one or more.

FIG. 4B is an example of a cross-sectional view along the dashed-dotted line A1-A2 in FIG. 4A. As illustrated in FIG. 4B, the display device 100 includes an insulating layer 171, a conductive layer 172 over the insulating layer 171, an insulating layer 173 over the insulating layer 171 and the conductive layer 172, an insulating layer 174 over the insulating layer 173, and the insulating layer 175 over the insulating layer 174. The insulating layer 171 is provided over a substrate (not illustrated). An opening reaching the conductive layer 172 is provided in the insulating layers 175, 174, and 173, and a plug 176 is provided to fill the opening.

In the pixel portion 177, a light-emitting device 130 is provided over the insulating layer 175 and the plug 176. A protective layer 131 is provided to cover the light-emitting device 130. A substrate 120 is bonded to the protective layer 131 with a resin layer 122. An inorganic insulating layer 125 and an insulating layer 127 over the inorganic insulating layer 125 are preferably provided between the adjacent light-emitting devices 130.

Although FIG. 4B shows cross sections of a plurality of the inorganic insulating layers 125 and a plurality of the insulating layers 127, the inorganic insulating layers 125 are preferably connected to each other and the insulating layers 127 are preferably connected to each other when the display device 100 is seen from above. In other words, each of the inorganic insulating layer 125 and the insulating layer 127 preferably has an opening over a first electrode.

In FIG. 4B, a light-emitting device 130R, a light-emitting device 130G, and a light-emitting device 130B are each illustrated as the light-emitting device 130. The light-emitting devices 130R, 130G, and 130B emit light of different colors. For example, the light-emitting device 130R can emit red light, the light-emitting device 130G can emit green light, and the light-emitting device 130B can emit blue light. Alternatively, the light-emitting device 130R, the light-emitting device 130G, or the light-emitting device 130B may emit visible light of another color or infrared light.

The display device of one embodiment of the present invention can be, for example, a top-emission display device where light is emitted in the direction opposite to a substrate over which light-emitting devices are formed. Note that the display device of one embodiment of the present invention may be of a bottom emission type.

The light-emitting device 130R has a structure as described in Embodiment 1. The light-emitting device 130R includes the first electrode (pixel electrode) including a conductive layer 151R and a conductive layer 152R, an organic compound layer 103R over the first electrode, the common layer 104 over the organic compound layer 103R, and the second electrode (common electrode) 102 over the common layer 104. Although the common layer 104 is not necessarily provided, it is preferable to provide the common layer 104 to reduce damage to the organic compound layer 103R during processing. In the case where the common layer 104 is provided, the common layer 104 is preferably an electron-injection layer. Furthermore, in the case where the common layer 104 is provided, a stack of the organic compound layer 103R and the common layer 104 corresponds to the organic compound layer 103 described in Embodiment 1.

The light-emitting device 130G has a structure as described in Embodiment 1. The light-emitting device 130G includes the first electrode (pixel electrode) including a conductive layer 151G and a conductive layer 152G, an organic compound layer 103G over the first electrode, the common layer 104 over the organic compound layer 103G, and the second electrode (common electrode) 102 over the common layer 104. Although the common layer 104 is not necessarily provided, it is preferable to provide the common layer 104 to reduce damage to the organic compound layer 103G during processing. In the case where the common layer 104 is provided, the common layer 104 is preferably an electron-injection layer. Furthermore, in the case where the common layer 104 is provided, a stack of the organic compound layer 103G and the common layer 104 corresponds to the organic compound layer 103 described in Embodiment 1.

The light-emitting device 130B has a structure as described in Embodiment 1. The light-emitting device 130B includes the first electrode (pixel electrode) including a conductive layer 151B and a conductive layer 152B, an organic compound layer 103B over the first electrode, the common layer 104 over the organic compound layer 103B, and the second electrode (common electrode) 102 over the common layer 104. Although the common layer 104 is not necessarily provided, it is preferable to provide the common layer 104 to reduce damage to the organic compound layer 103B during processing. In the case where the common layer 104 is provided, the common layer 104 is preferably an electron-injection layer. Furthermore, in the case where the common layer 104 is provided, a stack of the organic compound layer 103B and the common layer 104 corresponds to the organic compound layer 103 described in Embodiment 1.

In the light-emitting device, one of the pixel electrode and the common electrode functions as an anode and the other functions as a cathode. Hereinafter, description is made on the assumption that the pixel electrode functions as the anode and the common electrode functions as the cathode unless otherwise specified.

The organic compound layers 103R, the organic compound layers 103G, and the organic compound layers 103B are island-shaped layers that are independent of each other; alternatively, an organic compound layer of the light-emitting devices of one emission color may be independent of an organic compound layer of the light-emitting devices of another emission color. Providing the island-shaped organic compound layer 103 in each of the light-emitting devices 130 can suppress leakage current between the adjacent light-emitting devices 130 even in a high-resolution display device. This can prevent crosstalk, so that a display device with extremely high contrast can be obtained. Specifically, a display device having high current efficiency at low luminance can be obtained.

The island-shaped organic compound layer 103 is formed by forming an EL film and processing the EL film by a photolithography method.

The organic compound layer 103 is preferably provided to cover the top surface and the side surface of the first electrode (pixel electrode) of the light-emitting device 130. In this case, the aperture ratio of the display device 100 can be easily increased as compared to the structure where an end portion of the organic compound layer 103 is positioned inward from an end portion of the pixel electrode. Covering the side surface of the pixel electrode of the light-emitting device 130 with the organic compound layer 103 can inhibit the pixel electrode from being in contact with the second electrode 102; hence, a short circuit of the light-emitting device 130 can be inhibited.

In the display device of one embodiment of the present invention, the first electrode (pixel electrode) of the light-emitting device preferably has a stacked-layer structure. For example, in the example illustrated in FIG. 4B, the first electrode of the light-emitting device 130 is a stack of the conductive layer 151 and the conductive layer 152.

A metal material can be used for the conductive layer 151, for example. Specifically, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals, for example.

For the conductive layer 152, an oxide containing one or more selected from indium, tin, zinc, gallium, titanium, aluminum, and silicon can be used. For example, it is preferable to use a conductive oxide containing one or more of indium oxide, indium tin oxide, indium zinc oxide, zinc oxide, zinc oxide containing gallium, titanium oxide, indium zinc oxide containing gallium, indium zinc oxide containing aluminum, indium tin oxide containing silicon, indium zinc oxide containing silicon, and the like. In particular, an indium tin oxide containing silicon can be suitably used for the conductive layer 152 because of having a work function of higher than or equal to 4.0 eV, for example.

The conductive layer 151 and the conductive layer 152 may each be a stack of a plurality of layers containing different materials. In that case, the conductive layer 151 may include a layer formed using a material that can be used for the conductive layer 152, such as a conductive oxide. Furthermore, the conductive layer 152 may include a layer formed using a material that can be used for the conductive layer 151, such as a metal material. In the case where the conductive layer 151 is a stack of two or more layers, for example, a layer in contact with the conductive layer 152 can be formed using a material that can be used for the conductive layer 152.

The conductive layer 151 preferably has an end portion with a tapered shape. Specifically, the end portion of the conductive layer 151 preferably has a tapered shape with a taper angle of less than 90°. In that case, the conductive layer 152 provided along the side surface of the conductive layer 151 also has an end portion with a tapered shape. When the side surface of the conductive layer 152 has a tapered shape, coverage with the organic compound layer 103 provided along the side surface of the conductive layer 152 can be improved.

Next, an exemplary method for manufacturing the display device 100 having the structure illustrated in FIG. 4A is described with reference to FIGS. 5A to 10C.

[Manufacturing Method Example]

Thin films included in the display device (e.g., insulating films, semiconductor films, and conductive films) can be formed by a sputtering method, a chemical vapor deposition (CVD) method, a vacuum evaporation method, a pulsed laser deposition (PLD) method, an ALD method, or the like.

Thin films included in the display device (e.g., insulating films, semiconductor films, and conductive films) can also be formed by a wet process such as spin coating, dipping, spray coating, ink-jetting, dispensing, screen printing, offset printing, doctor blade coating, slit coating, roll coating, curtain coating, or knife coating.

Thin films included in the display device can be processed by a photolithography technique, for example.

As light used for exposure in the photolithography technique, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet rays, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used.

For etching of thin films, a dry etching method, a wet etching method, a sandblast method, or the like can be used.

Figure 5A:
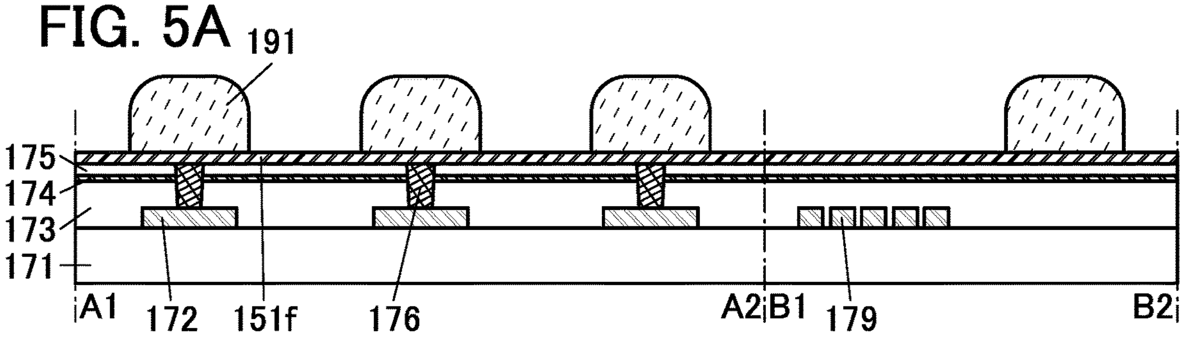
FIGS. 5A to 5E are cross-sectional views illustrating an example of a method for manufacturing a display device.

First, as illustrated in FIG. 5A, the insulating layer 171 is formed over a substrate (not illustrated). Next, the conductive layer 172 and a conductive layer 179 are formed over the insulating layer 171, and the insulating layer 173 is formed over the insulating layer 171 so as to cover the conductive layer 172 and the conductive layer 179. Then, the insulating layer 174 is formed over the insulating layer 173, and the insulating layer 175 is formed over the insulating layer 174.

As the substrate, a substrate that has heat resistance high enough to withstand at least heat treatment performed later can be used. For example, it is possible to use a glass substrate; a quartz substrate; a sapphire substrate; a ceramic substrate; an organic resin substrate; or a semiconductor substrate such as a single crystal semiconductor substrate or a polycrystalline semiconductor substrate of silicon, silicon carbide, or the like, a compound semiconductor substrate of silicon germanium or the like, or an SOI substrate.

Next, openings reaching the conductive layer 172 are formed in the insulating layers 175, 174, and 173. Then, the plugs 176 are formed to fill the openings.

Next, a conductive film **151*f* to be the conductive layers 151R, 151G, 151B, and 151C is formed over the plugs 176 and the insulating layer 175. A metal material can be used for the conductive film 151*f***, for example.

Then, a resist mask 191 is formed over the conductive film **151*f* The resist mask 191** can be formed by application of a photosensitive material (photoresist), light exposure, and development.

Figure 5B:
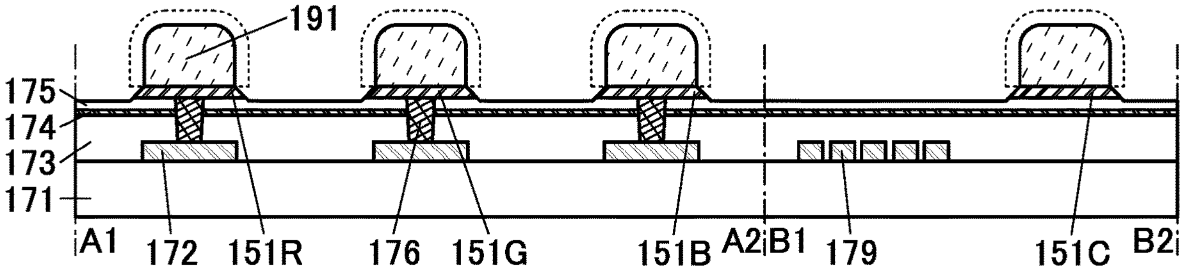

Subsequently, as shown in FIG. 5B, the conductive film **151*f* in a region not overlapping with the resist mask 191 is removed, for example. In this manner, the conductive layer 151** is formed.

Figure 5C:
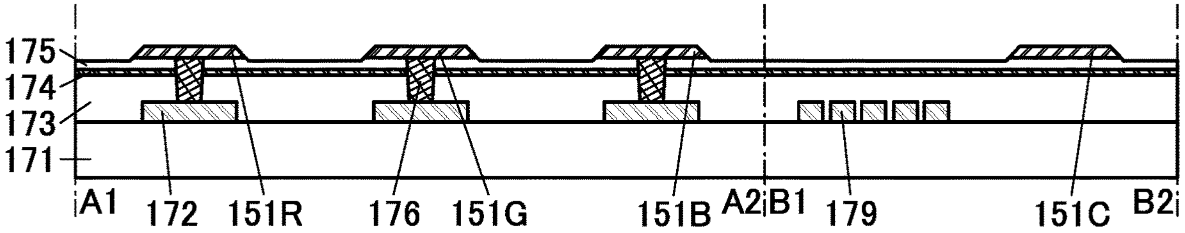

Next, the resist mask 191 is removed as illustrated in FIG. 5C. The resist mask 191 can be removed by ashing using oxygen plasma, for example.

Figure 5D:
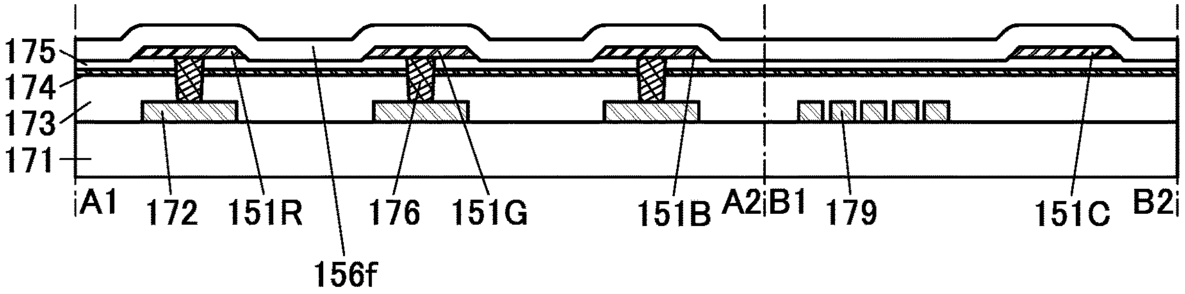

Then, as illustrated in FIG. 5D, an insulating film **156*f* to be an insulating layer 156R, an insulating layer 156G, an insulating layer 156B, and an insulating layer 156C is formed over the conductive layers 151R, 151G, 151B, and 151C and the insulating layer 175**.

As the insulating film **156*f***, an inorganic insulating film such as an oxide insulating film, a nitride insulating film, an oxynitride insulating film, or a nitride oxide insulating film, e.g., silicon oxynitride, can be used.

Figure 5E:
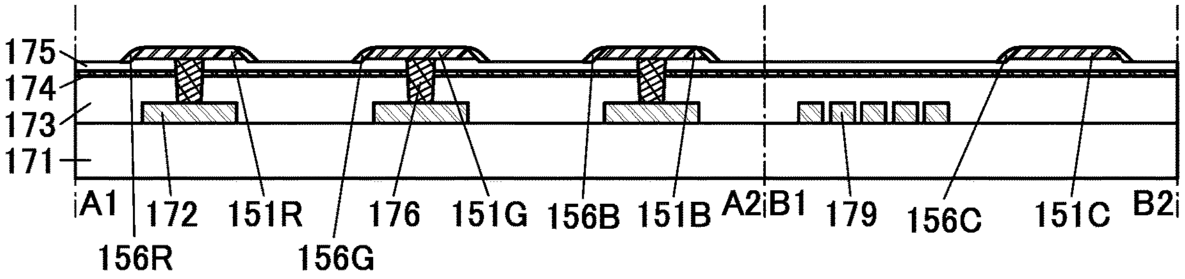

Subsequently, as illustrated in FIG. 5E, the insulating film **156*f* is processed to form the insulating layers 156R, 156G, 156B, and 156**C.

Figure 6A:
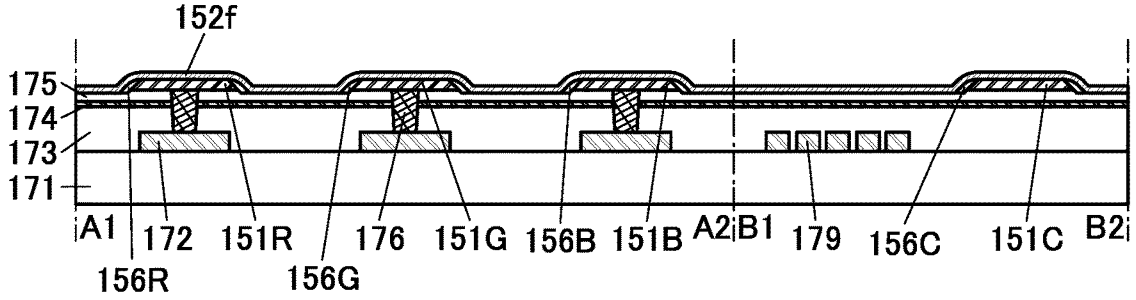
FIGS. 6A to 6D are cross-sectional views illustrating an example of a method for manufacturing a display device.

Next, as illustrated in FIG. 6A, a conductive film **152*f* is formed over the conductive layers 151R, 151G, 151B, and 151C and the insulating layers 156R, 156G, 156B, 156C, and 175. A conductive oxide can be used for the conductive film 152*f*, for example. The conductive film 152*f*** may have a stacked-layer structure.

Figure 6B:
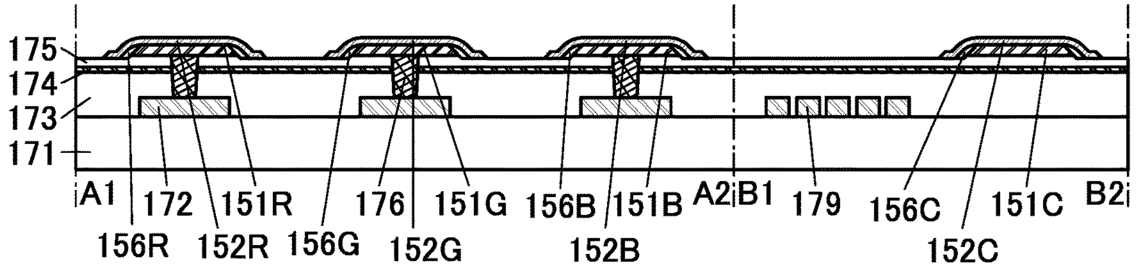

Then, as illustrated in FIG. 6B, the conductive film **152*f* is processed, so that the conductive layers 152R, 152G, 152B, and 152**C are formed.

Figure 6C:
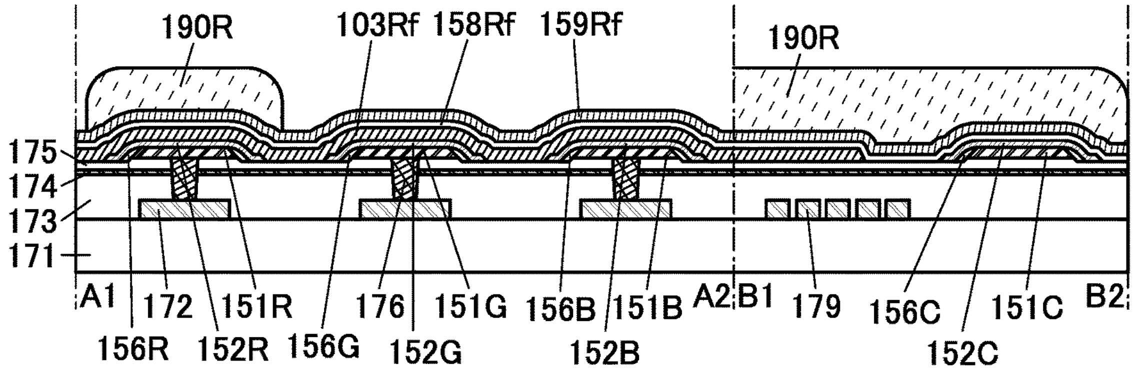

Next, as illustrated in FIG. 6C, an EL film 103Rf is formed over the conductive layers 152R, 152G, and 152B and the insulating layer 175. As illustrated in FIG. 6C, the EL film 103Rf is not formed over the conductive layer 152C.

Then, as illustrated in FIG. 6C, a sacrificial film 158Rf and a mask film 159Rf are formed.

Providing the sacrificial film 158Rf over the EL film 103Rf can reduce damage to the EL film 103Rf in the manufacturing process of the display device, resulting in an increase in the reliability of the light-emitting device.

As the sacrificial film 158Rf, a film that is highly resistant to the process conditions for the EL film 103Rf, specifically, a film having high etching selectivity with respect to the EL film 103Rf is used. For the mask film 159Rf, a film having high etching selectivity with respect to the sacrificial film 158Rf is used.

The sacrificial film 158Rf and the mask film 159Rf are formed at a temperature lower than the upper temperature limit of the EL film 103Rf. The typical substrate temperatures in formation of the sacrificial film 158Rf and the mask film 159Rf are each lower than or equal to 200° C., preferably lower than or equal to 150° C., further preferably lower than or equal to 120° C., still further preferably lower than or equal to 100° C., yet still further preferably lower than or equal to 80° C.

The sacrificial film 158Rf and the mask film 159Rf are preferably films that can be removed by a wet etching method.

Note that the sacrificial film 158Rf that is formed over and in contact with the EL film 103Rf is preferably formed by a formation method that is less likely to damage the EL film 103Rf than a formation method of the mask film 159Rf. For example, the sacrificial film 158Rf is preferably formed by an ALD method or a vacuum evaporation method rather than a sputtering method.

As each of the sacrificial film 158Rf and the mask film 159Rf, one or more of a metal film, an alloy film, a metal oxide film, a semiconductor film, an organic insulating film, and an inorganic insulating film, for example, can be used.

For each of the sacrificial film 158Rf and the mask film 159Rf, it is preferable to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. It is preferable to use a metal material that can block ultraviolet rays for one or both of the sacrificial film 158Rf and the mask film 159Rf, in which case the EL film 103Rf can be inhibited from being irradiated with ultraviolet rays and deterioration of the EL film 103Rf can be suppressed.

The sacrificial film 158Rf and the mask film 159Rf can each be formed using a metal oxide such as an In—Ga—Zn oxide, an indium oxide, an In—Zn oxide, an In—Sn oxide, an indium titanium oxide (In—Ti oxide), an indium tin zinc oxide (In—Sn—Zn oxide), an indium titanium zinc oxide (In—Ti—Zn oxide), an indium gallium tin zinc oxide (In—Ga—Sn—Zn oxide), or an indium tin oxide containing silicon.

In the above metal oxide, in place of gallium, an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used.

The sacrificial film 158Rf and the mask film 159Rf are preferably formed using a semiconductor material such as silicon or germanium for excellent compatibility with a semiconductor manufacturing process. Alternatively, a compound containing the above semiconductor material can be used.

As each of the sacrificial film 158Rf and the mask film 159Rf, any of a variety of inorganic insulating films can be used. In particular, an oxide insulating film is preferable because its adhesion to the EL film 103Rf is higher than that of a nitride insulating film.

Subsequently, a resist mask 190R is formed as illustrated in FIG. 6C. The resist mask 190R can be formed by application of a photosensitive material (photoresist), light exposure, and development.

The resist mask 190R is provided at a position overlapping with the conductive layer 152R. The resist mask 190R is preferably provided also at a position overlapping with the conductive layer 152C. This can inhibit the conductive layer 152C from being damaged during the process of manufacturing the display device.

Figure 6D:
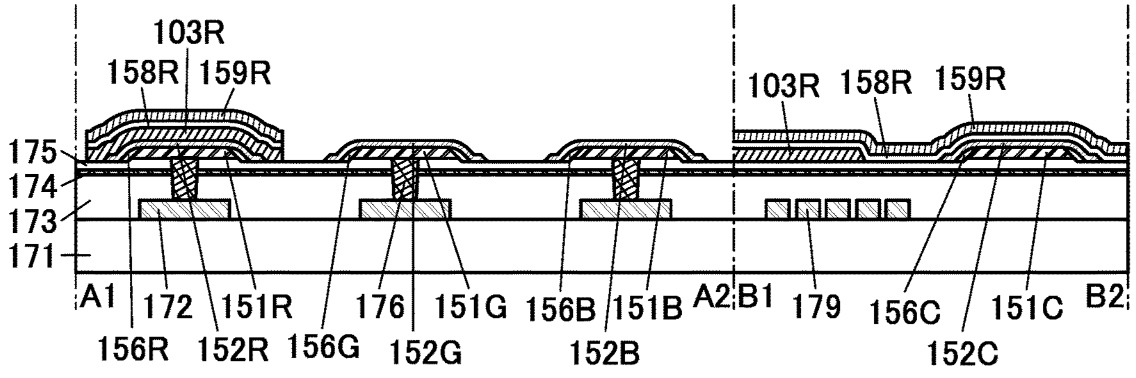

Next, as illustrated in FIG. 6D, part of the mask film 159Rf is removed using the resist mask 190R, whereby the mask layer 159R is formed. The mask layer 159R remains over the conductive layers 152R and 152C. After that, the resist mask 190R is removed. Then, part of the sacrificial film 158Rf is removed using the mask layer 159R as a mask (also referred to as a hard mask), whereby the sacrificial layer 158R is formed.

The use of a wet etching method can reduce damage to the EL film 103Rf in processing of the sacrificial film 158Rf and the mask film 159Rf, as compared to the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, or a chemical solution containing a mixed solution of any of these acids, for example.

In the case of using a dry etching method to process the sacrificial film 158Rf, deterioration of the EL film 103Rf can be inhibited by not using a gas containing oxygen as the etching gas.

The resist mask 190R can be removed by a method similar to that for the resist mask 191.

Next, as illustrated in FIG. 6D, the EL film 103Rf is processed to form the organic compound layer 103R. For example, part of the EL film 103Rf is removed using the mask layer 159R and the sacrificial layer 158R as a hard mask, whereby the organic compound layer 103R is formed.

Accordingly, as illustrated in FIG. 6D, the stacked-layer structure of the organic compound layer 103R, the sacrificial layer 158R, and the mask layer 159R remains over the conductive layer 152R. The conductive layers 152G and 152B are exposed.

The EL film 103Rf is preferably processed by anisotropic etching. Anisotropic dry etching is particularly preferable. Alternatively, wet etching may be used.

In the case of using a dry etching method, deterioration of the EL film 103Rf can be suppressed by not using a gas containing oxygen as the etching gas.

A gas containing oxygen may be used as the etching gas. When the etching gas contains oxygen, the etching rate can be increased. Thus, the etching can be performed under a low-power condition while an adequately high etching rate is maintained. Accordingly, damage to the EL film 103Rf can be reduced. Furthermore, a defect such as attachment of a reaction product generated during the etching can be inhibited.

In the case of using a dry etching method, it is preferable to use a gas containing at least one of $H_2$, $CF_4$, $C_4F_8$, $SF_6$, $CHF_3$, $Cl_2$, $H_2O$, $BCl_3$, and a Group 18 element such as He or Ar as the etching gas, for example. Alternatively, a gas containing oxygen and at least one of the above is preferably used as the etching gas. Alternatively, an oxygen gas may be used as the etching gas.

Figure 7A:
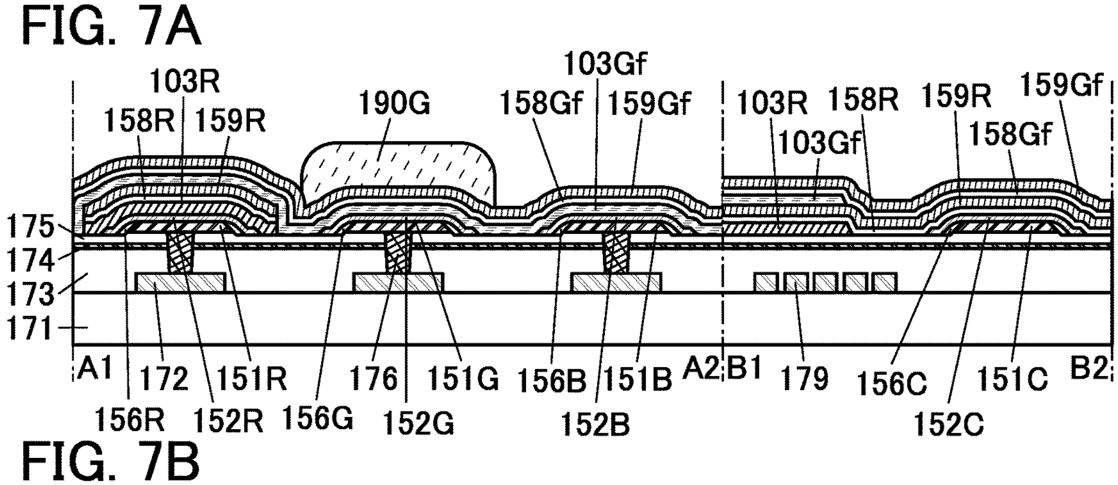
FIGS. 7A to 7D are cross-sectional views illustrating an example of a method for manufacturing a display device.

Then, as illustrated in FIG. 7A, an EL film 103Gf to be the organic compound layer 103G is formed.

The EL film 103Gf can be formed by a method similar to that for forming the EL film 103Rf. The EL film 103Gf can have a structure similar to that of the EL film 103Rf.

Subsequently, a sacrificial film 158Gf and a mask film 159Gf are formed in this order. A resist mask 190G is then formed at a position overlapping with the conductive layer 152G. The materials and the formation methods of the sacrificial film 158Gf and the mask film 159Gf are similar to those for the sacrificial film 158Rf and the mask film 159Rf. The material and the formation method of the resist mask 190G are similar to those for the resist mask 190R.

Figure 7B:
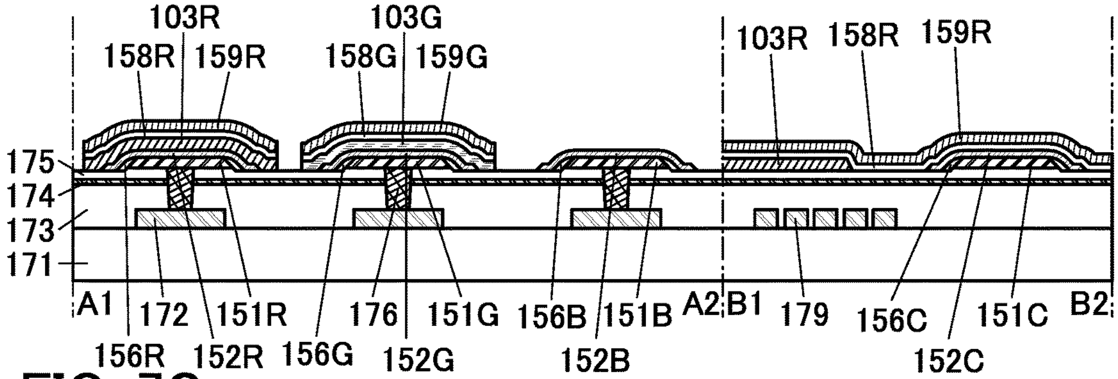

Subsequently, as illustrated in FIG. 7B, part of the mask film 159Gf is removed using the resist mask 190G, whereby the mask layer 159G is formed. The mask layer 159G remains over the conductive layer 152G. After that, the resist mask 190G is removed. Then, part of the sacrificial film 158Gf is removed using the mask layer 159G as a mask, whereby the sacrificial layer 158G is formed. Next, the EL film 103Gf is processed to form the organic compound layer 103G.

Figure 7C:
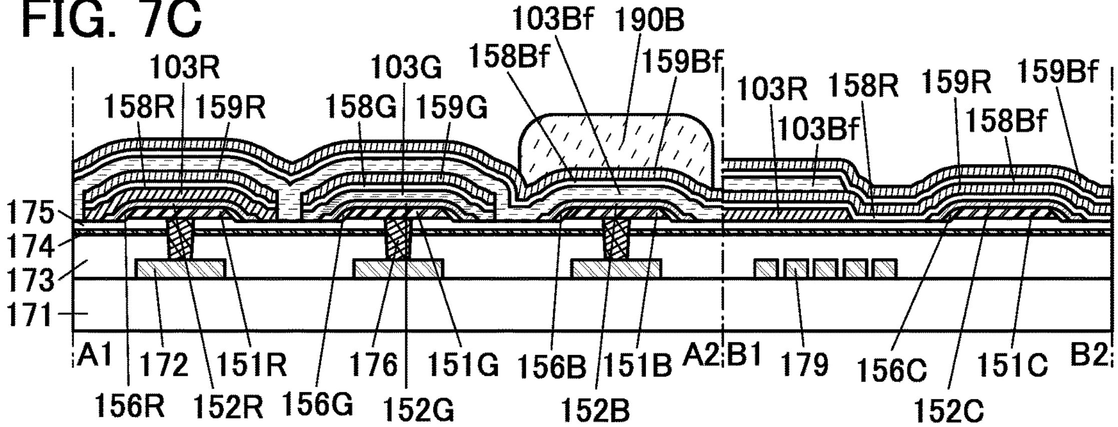

Then, an EL film 103Bf is formed as illustrated in FIG. 7C. The EL film 103Bf can be formed by a method similar to that for forming the EL film 103Rf. The EL film 103Bf can have a structure similar to that of the EL film 103Rf.

Subsequently, a sacrificial film 158Bf and a mask film 159Bf are formed in this order as illustrated in FIG. 7C. A resist mask 190B is then formed at a position overlapping with the conductive layer 152B. The materials and the formation methods of the sacrificial film 158Bf and the mask film 159Bf are similar to those for the sacrificial film 158Rf and the mask film 159Rf. The material and the formation method of the resist mask 190B are similar to those for the resist mask 190R.

Figure 7D:
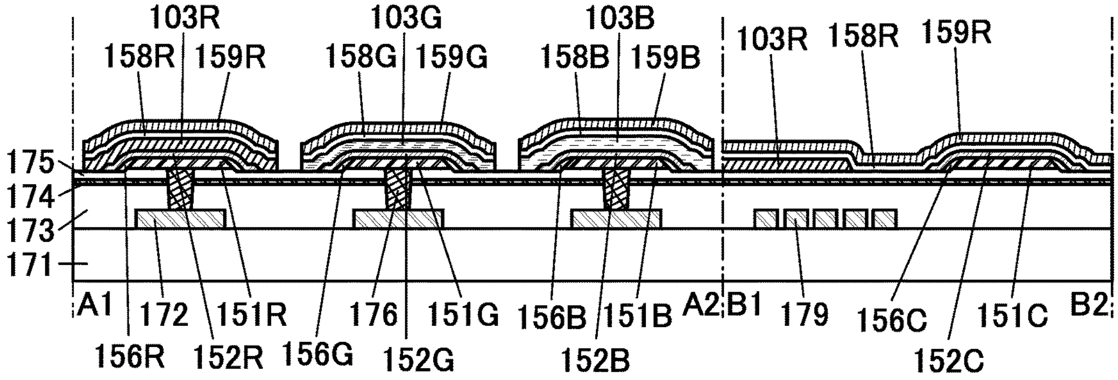

Subsequently, as illustrated in FIG. 7D, part of the mask film 159Bf is removed using the resist mask 190B, whereby the mask layer 159B is formed. The mask layer 159B remains over the conductive layer 152B. After that, the resist mask 190B is removed. Then, part of the sacrificial film 158Bf is removed using the mask layer 159B as a mask, so that the sacrificial layer 158B is formed. Next, the EL film 103Bf is processed to form the organic compound layer 103B. For example, part of the EL film 103Bf is removed using the mask layer 159B and the sacrificial layer 158B as a hard mask, whereby the organic compound layer 103B is formed.

Accordingly, the stacked-layer structure of the organic compound layer 103B, the sacrificial layer 158B, and the mask layer 159B remains over the conductive layer 152B. The mask layers 159R and 159G are exposed.

Note that the side surfaces of the organic compound layers 103R, 103G, and 103B are preferably perpendicular or substantially perpendicular to their formation surfaces. For example, the angle between the formation surfaces and these side surfaces is preferably greater than or equal to 600 and less than or equal to 90°.

The distance between two adjacent layers among the organic compound layers 103R, 103G, and 103B, which are formed by a photolithography method as described above, can be reduced to less than or equal to 8 μm, less than or equal to 5 μm, less than or equal to 3 μm, less than or equal to 2 μm, or less than or equal to 1 μm. Here, the distance can be specified, for example, by a distance between opposite end portions of two adjacent layers among the organic compound layers 103R, 103G, and 103B. Reducing the distance between the island-shaped EL layers makes it possible to provide a display device having high resolution and a high aperture ratio. In addition, the distance between the first electrodes of adjacent light-emitting devices can also be shortened to for example, less than or equal to 10 μm, less than or equal to 8 μm, less than or equal to 5 μm, less than or equal to 3 μm, or less than or equal to 2 μm. Note that the distance between the first electrodes of adjacent light-emitting devices is preferably greater than or equal to 2 m and less than or equal to 5 μm.

Figure 8A:
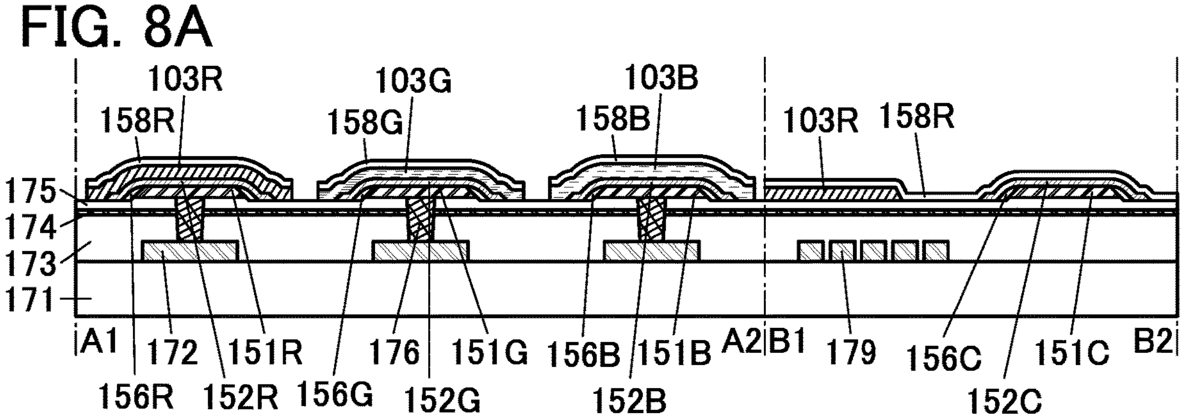
FIGS. 8A to 8C are cross-sectional views illustrating an example of a method for manufacturing a display device.

Next, as illustrated in FIG. 8A, the mask layers 159R, 159G, and 159B are preferably removed.

The step of removing the mask layers can be performed by a method similar to that for the step of processing the mask layers. Specifically, by using a wet etching method, damage caused to the organic compound layer 103 at the time of removing the mask layers can be reduced as compared to the case of using a dry etching method.

The mask layers may be removed by being dissolved in a solvent such as water or an alcohol. Examples of an alcohol include ethyl alcohol, methyl alcohol, isopropyl alcohol (IPA), and glycerin.

After the mask layers are removed, drying treatment may be performed in order to remove water adsorbed on surfaces. For example, heat treatment in an inert gas atmosphere or a reduced-pressure atmosphere can be performed. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

Figure 8B:
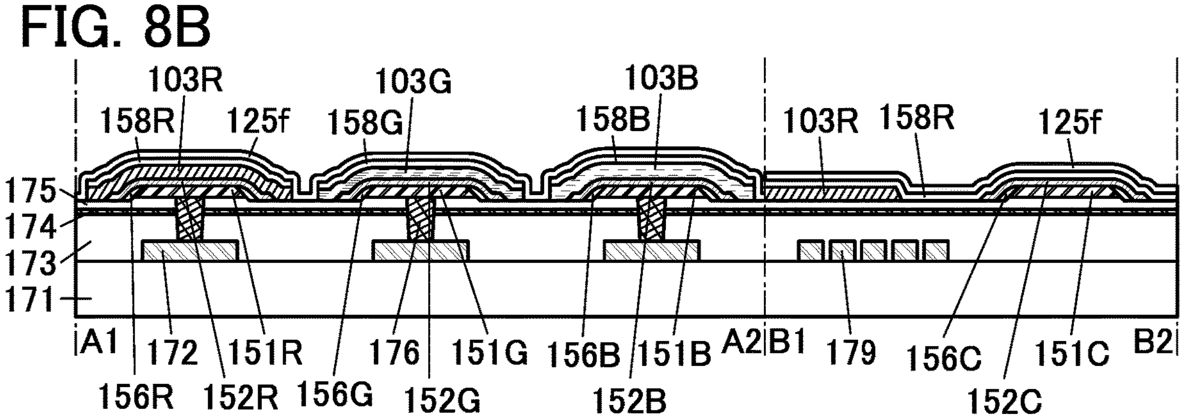

Next, an inorganic insulating film 125*f* is formed as illustrated in FIG. 8B.

Figure 8C:
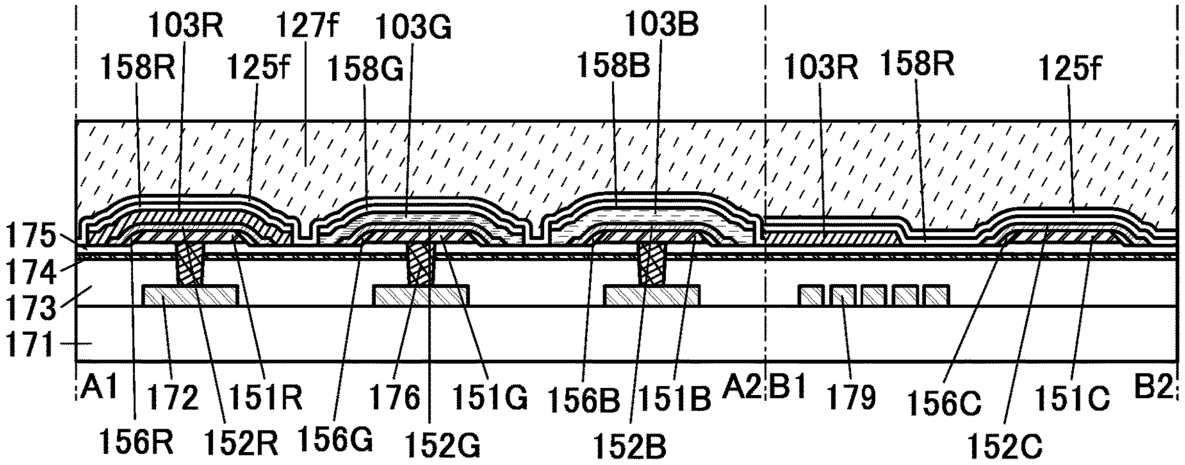

Then, as illustrated in FIG. 8C, the insulating film 127*f* to be the insulating layer 127 is formed over the inorganic insulating film 125*f*.

The substrate temperature at the time of forming the inorganic insulating film 125*f* and the insulating film 127*f* is preferably higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C.

As the inorganic insulating film 125*f*, an insulating film having a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm is preferably formed in the above-described range of the substrate temperature.

The inorganic insulating film 125*f* is preferably formed by an ALD method, for example. An ALD method is preferably used, in which case deposition damage is reduced and a film with good coverage can be formed. As the inorganic insulating film 125*f*, an aluminum oxide film is preferably formed by an ALD method, for example.

The insulating film 127*f* is preferably formed by the aforementioned wet process. The insulating film 127*f* is preferably formed by spin coating using a photosensitive material, for example, and specifically preferably formed using a photosensitive resin composition containing an acrylic resin.

Then, part of the insulating film 127*f* is exposed to visible light or ultraviolet rays. The insulating layer 127 is formed in regions that are interposed between any two of the conductive layers 152R, 152G, and 152B and around the conductive layer 152C.

The width of the insulating layer 127 formed later can be controlled in accordance with the exposed region of the insulating film 127*f*. In this embodiment, processing is performed such that the insulating layer 127 includes a portion overlapping with the top surface of the conductive layer 151.

Light used for the exposure preferably includes the i-line (wavelength: 365 nm). Furthermore, light used for the exposure may include at least one of the g-line (wavelength: 436 nm) and the h-line (wavelength: 405 nm).

Figure 9A:
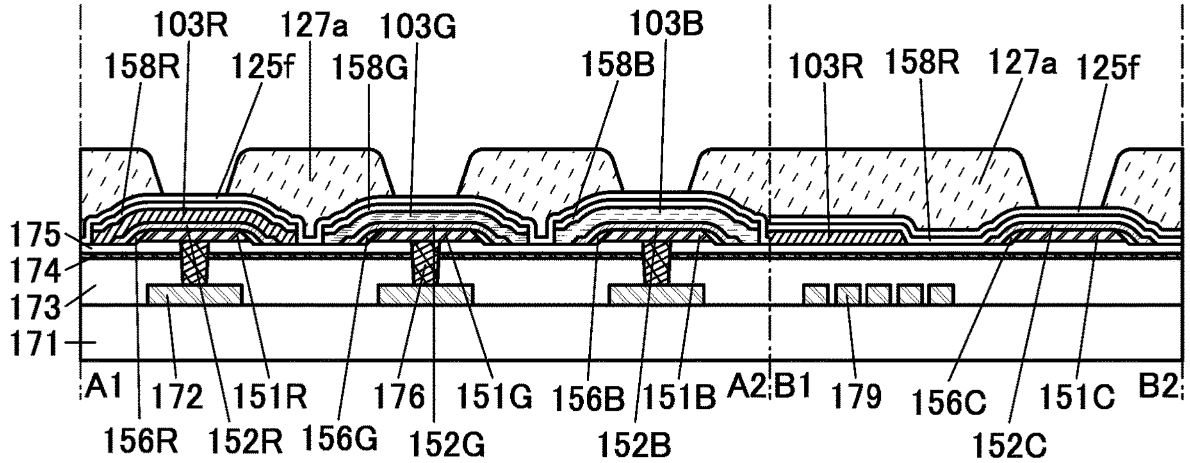
FIGS. 9A to 9C are cross-sectional views illustrating an example of a method for manufacturing a display device.

Next, as illustrated in FIG. 9A, development is performed to remove the exposed region of the insulating film 127*f*, whereby an insulating layer 127*a* is formed.

Figure 9B:
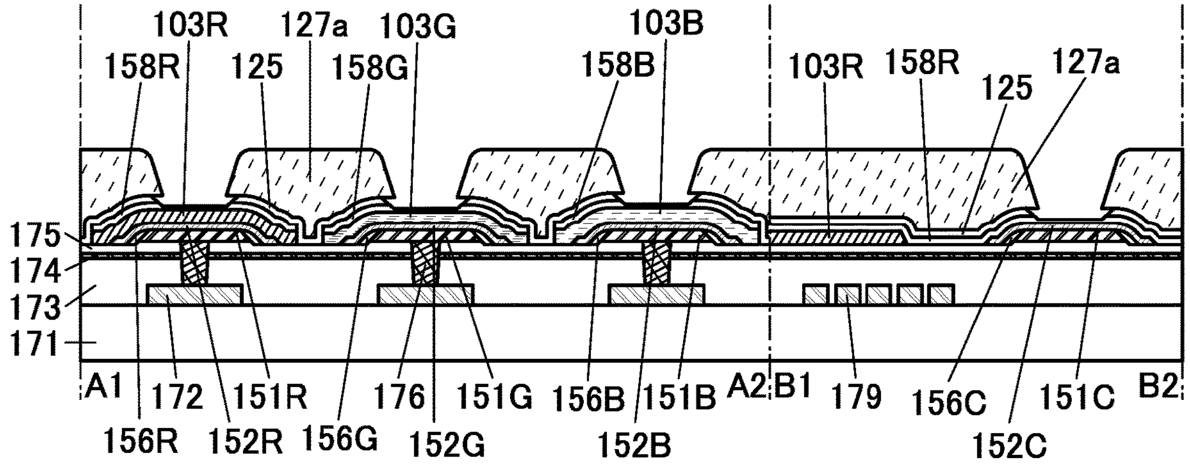

Next, as illustrated in FIG. 9B, etching treatment is performed using the insulating layer 127*a* as a mask to remove part of the inorganic insulating film 125*f* and reduce the thickness of part of the sacrificial layers 158R, 158G, and 158B. Thus, the inorganic insulating layer 125 is formed under the insulating layer 127*a*. Moreover, the surfaces of the thin portions in the sacrificial layers 158R, 158G, and 158B are exposed. Note that the etching treatment using the insulating layer 127*a* as a mask may be hereinafter referred to as first etching treatment.

The first etching treatment can be performed by dry etching or wet etching. Note that the inorganic insulating film 125*f* is preferably formed using a material similar to that of the sacrificial layers 158R, 158G, and 158B, in which case the first etching treatment can be performed concurrently.

In the case of performing dry etching, a chlorine-based gas is preferably used. As the chlorine-based gas, one of $Cl_2$, $BCl_3$, $SiCl_4$, $CCl_4$, and the like or a mixture of two or more of them can be used. Moreover, one of an oxygen gas, a hydrogen gas, a helium gas, an argon gas, and the like or a mixture of two or more of them can be added as appropriate to the chlorine-based gas. By the dry etching, the thin regions of the sacrificial layers 158R, 158G, and 158B can be formed with favorable in-plane uniformity.

As a dry etching apparatus, a dry etching apparatus including a high-density plasma source can be used. As the dry etching apparatus including a high-density plasma source, an inductively coupled plasma (ICP) etching apparatus can be used, for example. Alternatively, a capacitively coupled plasma (CCP) etching apparatus including parallel plate electrodes can be used.

The first etching treatment is preferably performed by wet etching. The use of wet etching can reduce damage to the organic compound layers 103R, 103G, and 103B, as compared to the case of using dry etching. Wet etching can be performed using an alkaline solution or an acid solution, for example.

It is preferable that the sacrificial layers 158R, 158G, and 158B not be removed completely by the first etching treatment, and the etching treatment be stopped when the thickness of the sacrificial layers 158R, 158G, and 158B is reduced. The sacrificial layers 158R, 158G, and 158B remain over the corresponding organic compound layers 103R, 103G, and 103B in this manner, whereby the organic compound layers 103R, 103G, and 103B can be prevented from being damaged by treatment in a later step.

Next, light exposure is preferably performed on the entire substrate so that the insulating layer 127*a* is irradiated with visible light or ultraviolet rays. The energy density for the light exposure is preferably greater than 0 $mJ/cm^2$ and less than or equal to 800 $mJ/cm^2$, further preferably greater than 0 $mJ/cm^2$ and less than or equal to 500 $mJ/cm^2$. Performing such light exposure after the development can sometimes increase the degree of transparency of the insulating layer 127*a*. In addition, it is sometimes possible to lower the substrate temperature required for subsequent heat treatment for changing the shape of the insulating layer 127*a* into a tapered shape.

Here, when a barrier insulating layer against oxygen (e.g., an aluminum oxide film) exists as each of the sacrificial layers 158R, 158G, and 158B, diffusion of oxygen to the organic compound layers 103R, 103G, and 103B can be suppressed.

Figure 9C:
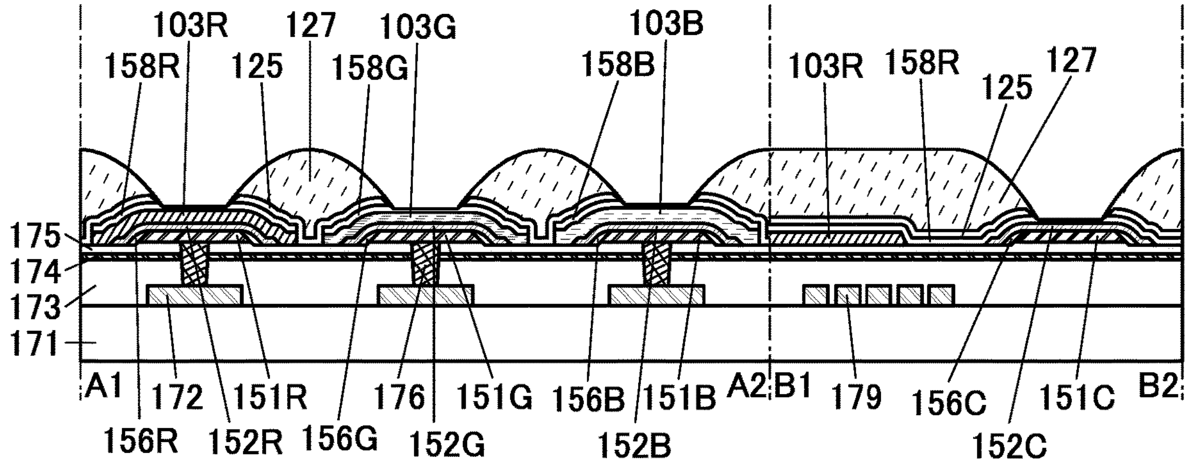

Then, heat treatment (also referred to as post-baking) is performed. The heat treatment can change the insulating layer 127*a* into the insulating layer 127 having a tapered side surface (FIG. 9C). The heat treatment is performed at a temperature lower than the upper temperature limit of the organic compound layer. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 130° C. The heating atmosphere may be an air atmosphere or an inert gas atmosphere. Moreover, the heating atmosphere may be an atmospheric-pressure atmosphere or a reduced-pressure atmosphere. Accordingly, adhesion between the insulating layer 127 and the inorganic insulating layer 125 can be improved, and corrosion resistance of the insulating layer 127 can be increased.

When the sacrificial layers 158R, 158G, and 158B are not completely removed by the first etching treatment and the thinned sacrificial layers 158R, 158G, and 158B are left, the organic compound layers 103R, 103G, and 103B can be prevented from being damaged and deteriorating in the heat treatment. This increases the reliability of the light-emitting device.

Figure 10A:
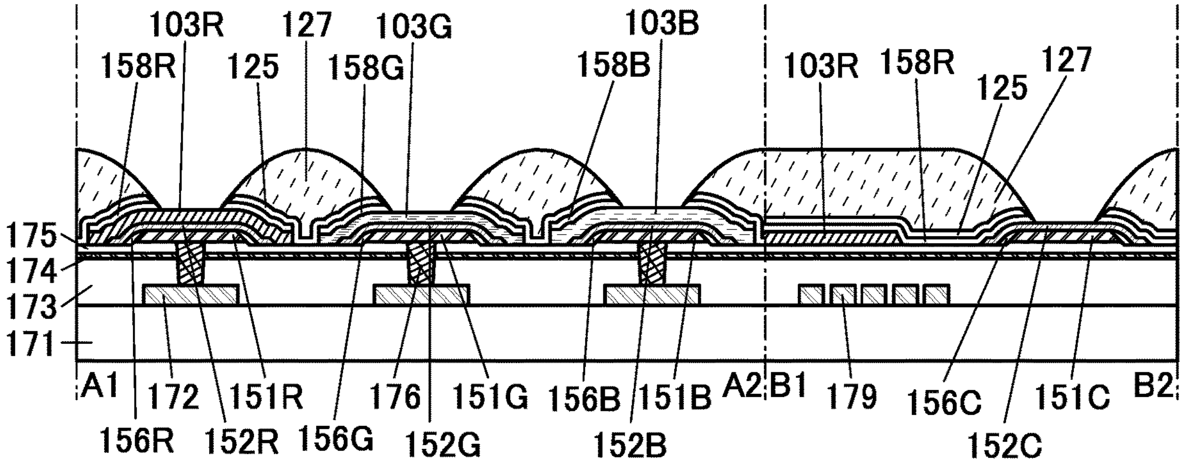
FIGS. 10A to 10C are cross-sectional views illustrating an example of a method for manufacturing a display device.

Next, as illustrated in FIG. 10A, etching treatment is performed using the insulating layer 127 as a mask to remove parts of the sacrificial layers 158R, 158G, and 158B. Thus, openings are formed in the sacrificial layers 158R, 158G, and 158B, and the top surfaces of the organic compound layers 103R, 103G, and 103B and the conductive layer 152C are exposed. Note that this etching treatment may be hereinafter referred to as second etching treatment.

An end portion of the inorganic insulating layer 125 is covered with the insulating layer 127. FIG. 10A illustrates an example in which part of the end portion of the sacrificial layer 158G (specifically a tapered portion formed by the first etching treatment) is covered with the insulating layer 127 and a tapered portion formed by the second etching treatment is exposed.

The second etching treatment is performed by wet etching. The use of wet etching can reduce damage to the organic compound layers 103R, 103G, and 103B, as compared to the case of using dry etching. Wet etching can be performed using an alkaline solution or an acid solution, for example.

Figure 10B:
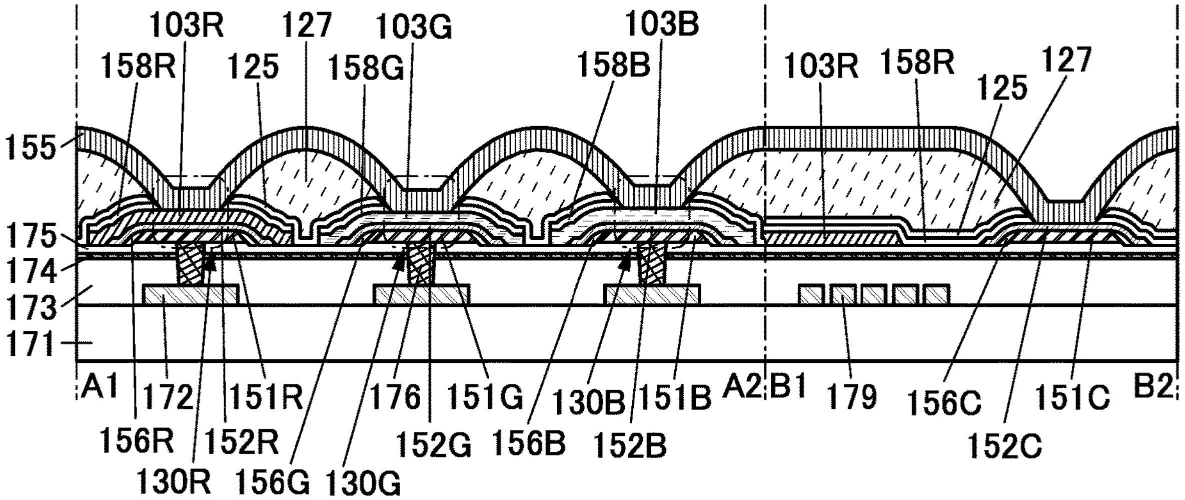

Next, as illustrated in FIG. 10B, a common electrode 155 is formed over the organic compound layers 103R, 103G, and 103B, the conductive layer 152C, and the insulating layer 127. The common electrode 155 can be formed by a sputtering method, a vacuum evaporation method, or the like.

Figure 10C:
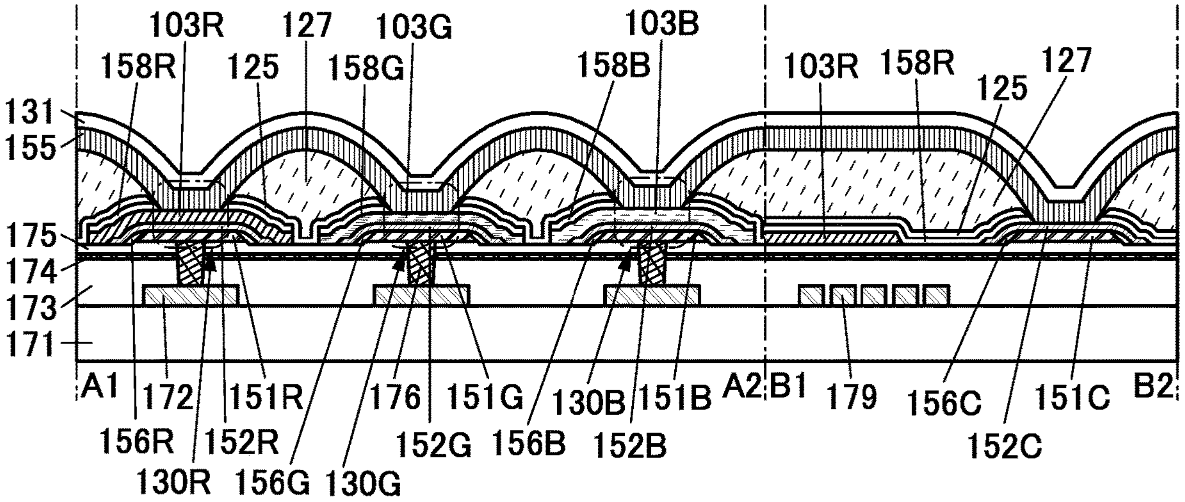

Next, as illustrated in FIG. 10C, the protective layer 131 is formed over the common electrode 155. The protective layer 131 can be formed by a vacuum evaporation method, a sputtering method, a CVD method, an ALD method, or the like.

Then, the substrate 120 is bonded over the protective layer 131 using the resin layer 122, so that the display device can be manufactured. In the method for manufacturing the display device of one embodiment of the present invention, the insulating layer 156 is formed to include a region overlapping with the side surface of the conductive layer 151 and the conductive layer 152 is formed to cover the conductive layer 151 and the insulating layer 156 as described above. This can increase the yield of the display device and inhibit generation of defects.

As described above, in the method for manufacturing the display device in this embodiment, the island-shaped organic compound layers 103R, 103G, and 103B are formed not by using a fine metal mask but by processing, by a photolithography technique, a film formed on the entire surface; thus, the island-shaped layers can be formed to have a uniform thickness. In addition, a high-resolution display device or a display device with a high aperture ratio can be obtained. Furthermore, even when the resolution or the aperture ratio is high and the distance between the subpixels is extremely short, the organic compound layers 103R, 103G, and 103B can be inhibited from being in contact with each other in the adjacent subpixels. As a result, generation of a leakage current between the subpixels can be inhibited. This can prevent crosstalk, so that a display device with extremely high contrast can be obtained. Moreover, even a display device that includes tandem light-emitting devices formed by a photolithography technique can have favorable characteristics.

Embodiment 5

In this embodiment, a display device of one embodiment of the present invention will be described.

The display device in this embodiment can be a high-definition display device. Accordingly, the display device in this embodiment can be used for display portions of information terminals (wearable devices) such as watch-type and bracelet-type information terminals and display portions of wearable devices capable of being worn on the head, such as a VR device like a head-mounted display (HMD) and a glasses-type AR device.

The display device in this embodiment can be a high-definition display device or a large-sized display device. Accordingly, the display device in this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, desktop and notebook personal computers, a monitor of a computer and the like, digital signage, and a large game machine such as a pachinko machine.

[Display Module]

Figure 11A:
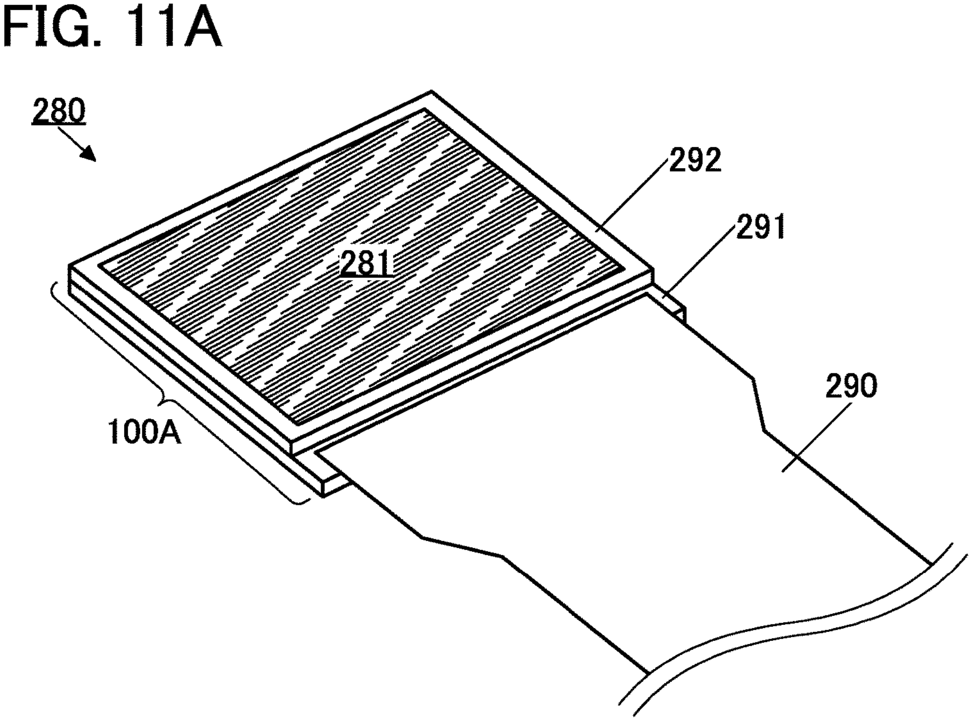
FIGS. 11A and 11B are perspective views illustrating a structure example of a display module.

FIG. 11A is a perspective view of a display module 280. The display module 280 includes a display device 100A and an FPC 290. Note that the display device included in the display module 280 is not limited to the display device 100A and may be any of display devices 100B to 100E described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 11B:
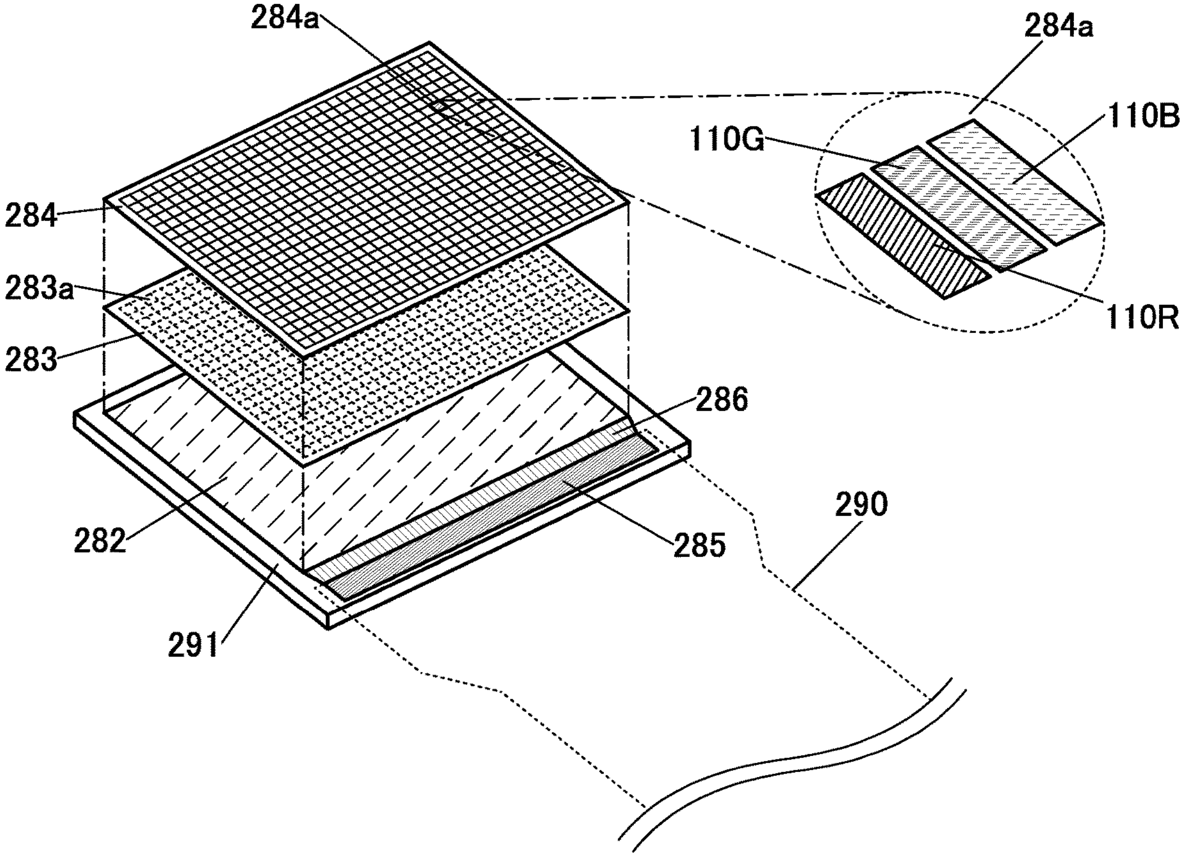

FIG. 11B is a perspective view schematically illustrating the structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is included in a portion not overlapping with the pixel portion 284 over the substrate 291. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side in FIG. 11B. The pixels 284*a* can employ any of the structures described in the above embodiments.

The pixel circuit portion 283 includes a plurality of pixel circuits 283*a* arranged periodically.

One pixel circuit 283*a* is a circuit that controls driving of a plurality of elements included in one pixel 284*a*.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure where one or both of the pixel circuit portion 283 and the circuit portion 282 are stacked below the pixel portion 284; hence, the aperture ratio (effective display area ratio) of the display portion 281 can be significantly high.

Such a display module 280 has an extremely high resolution, and thus can be suitably used for a VR device such as a HMD or a glasses-type AR device. For example, even in the case of a structure where the display portion of the display module 280 is seen through a lens, pixels of the extremely-high-resolution display portion 281 included in the display module 280 are prevented from being recognized even when the display portion is enlarged by the lens, so that display providing a high sense of immersion can be performed. Without being limited thereto, the display module 280 can be suitably used for electronic devices including a relatively small display portion.

[Display Device 100A]

Figure 12A:
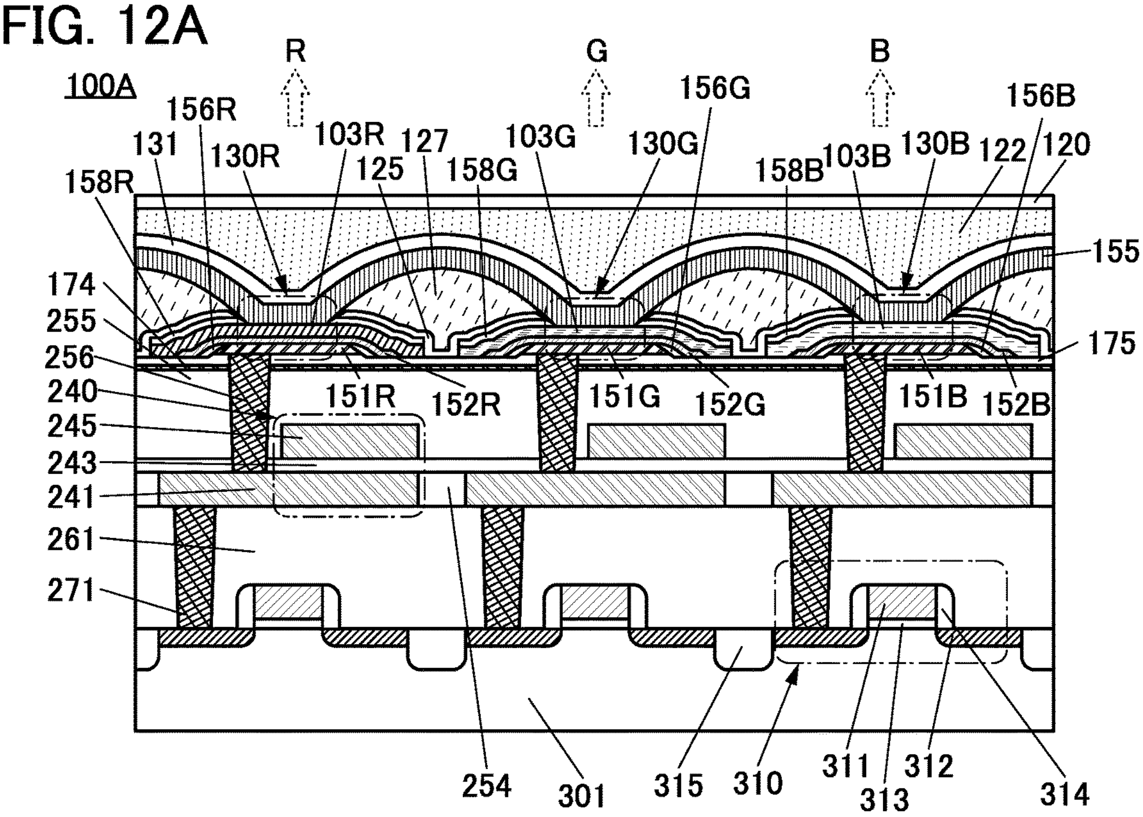
FIGS. 12A and 12B are cross-sectional views illustrating structure examples of a display device.

The display device 100A illustrated in FIG. 12A includes a substrate 301, the light-emitting devices 130R, 130G, and 130B, a capacitor 240, and a transistor 310.

The substrate 301 corresponds to the substrate 291 in FIGS. 11A and 11B. The transistor 310 includes a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as a source or a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of a source and a drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 240. The insulating layer 174 is provided over the insulating layer 255. The insulating layer 175 is provided over the insulating layer 174. The light-emitting devices 130R, 130G, and 130B are provided over the insulating layer 175. An insulator is provided in regions between adjacent light-emitting devices.

The insulating layer 156R is provided to include a region overlapping with the side surface of the conductive layer 151R. The insulating layer 156G is provided to include a region overlapping with the side surface of the conductive layer 151G. The insulating layer 156B is provided to include a region overlapping with the side surface of the conductive layer 151B. The conductive layer 152R is provided to cover the conductive layer 151R and the insulating layer 156R. The conductive layer 152G is provided to cover the conductive layer 151G and the insulating layer 156G. The conductive layer 152B is provided to cover the conductive layer 151B and the insulating layer 156B. The sacrificial layer 158R is positioned over the organic compound layer 103R. The sacrificial layer 158G is positioned over the organic compound layer 103G. The sacrificial layer 158B is positioned over the organic compound layer 103B.

Each of the conductive layers 151R, 151G, and 151B is electrically connected to one of the source and the drain of the corresponding transistor 310 through a plug 256 embedded in the insulating layers 243, 255, 174, and 175, the conductive layer 241 embedded in the insulating layer 254, and the plug 271 embedded in the insulating layer 261. Any of a variety of conductive materials can be used for the plugs.

The protective layer 131 is provided over the light-emitting devices 130R, 130G, and 130B. A substrate 120 is bonded to the protective layer 131 with a resin layer 122. Embodiment 2 can be referred to for the details of the light-emitting device 130 and the components thereover up to the substrate 120. The substrate 120 corresponds to the substrate 292 in FIG. 11A.

Figure 12B:
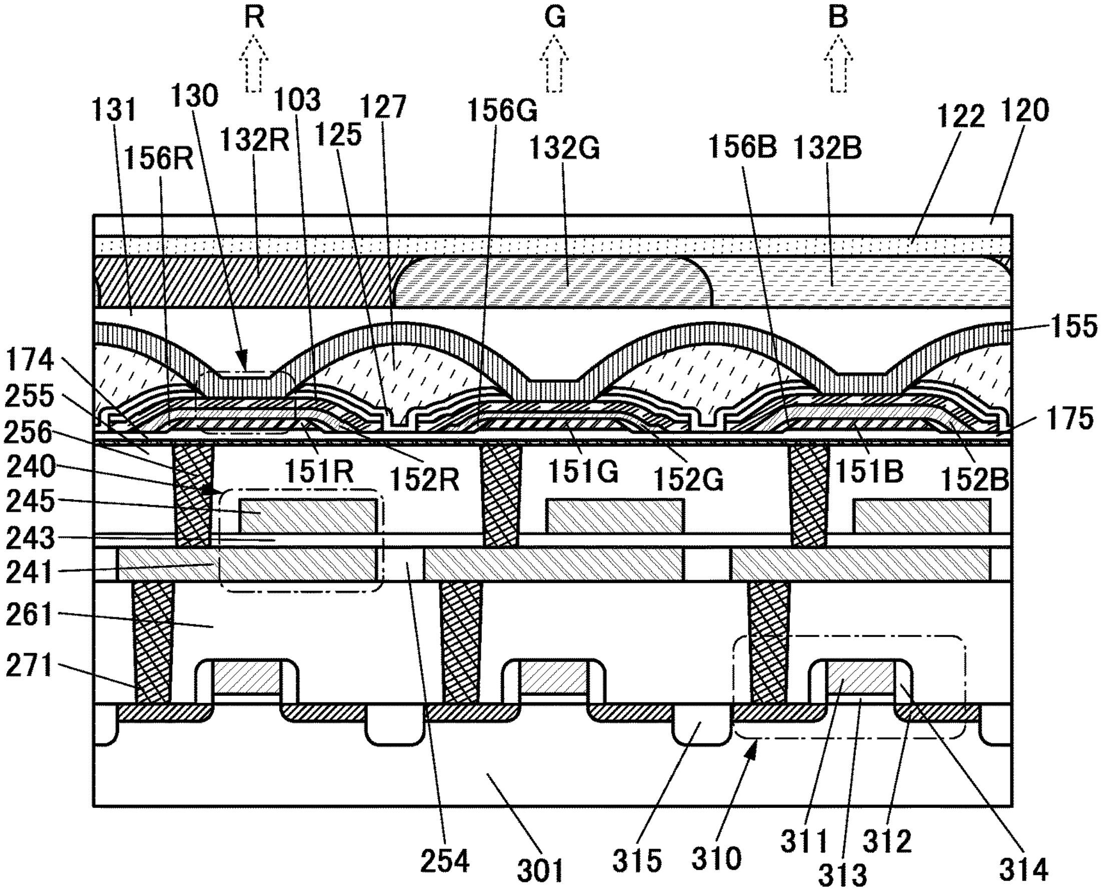

FIG. 12B illustrates a variation example of the display device 100A illustrated in FIG. 12A. The display device illustrated in FIG. 12B includes coloring layers 132R, 132G, and 132B, and each of the light-emitting devices 130 includes a region overlapping with one of the coloring layers 132R, 132G, and 132B. In the display device illustrated in FIG. 12B, the light-emitting device 130 can emit white light, for example. For example, the coloring layer 132R, the coloring layer 132G, and the coloring layer 132B can transmit red light, green light, and blue light, respectively.

[Display Device 100B]

Figure 13:
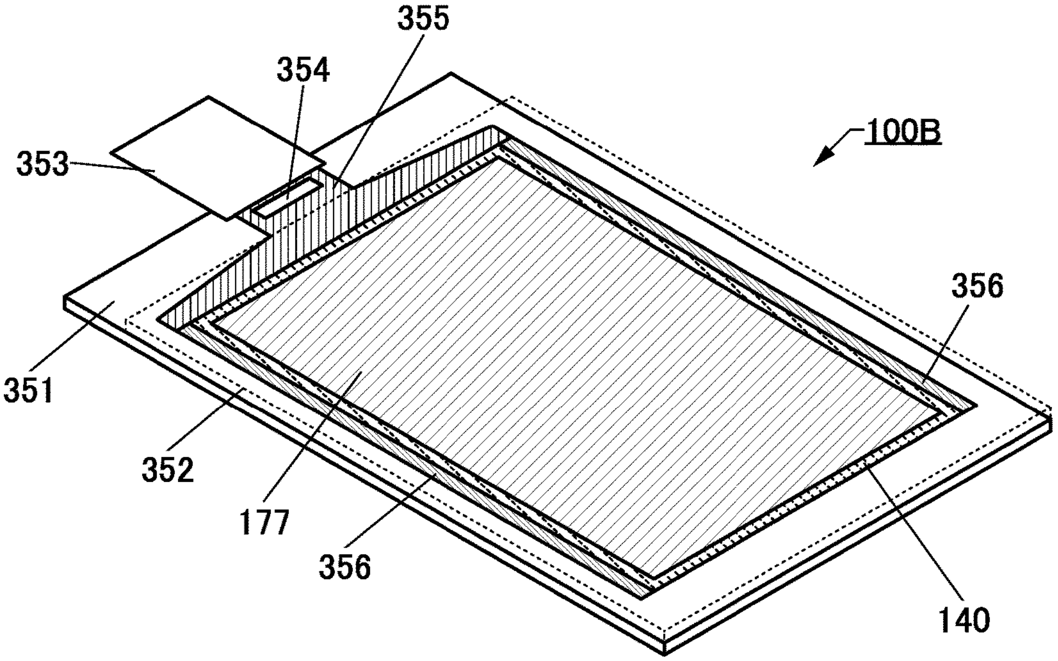
FIG. 13 is a perspective view illustrating a structure example of a display device.
Figure 14:
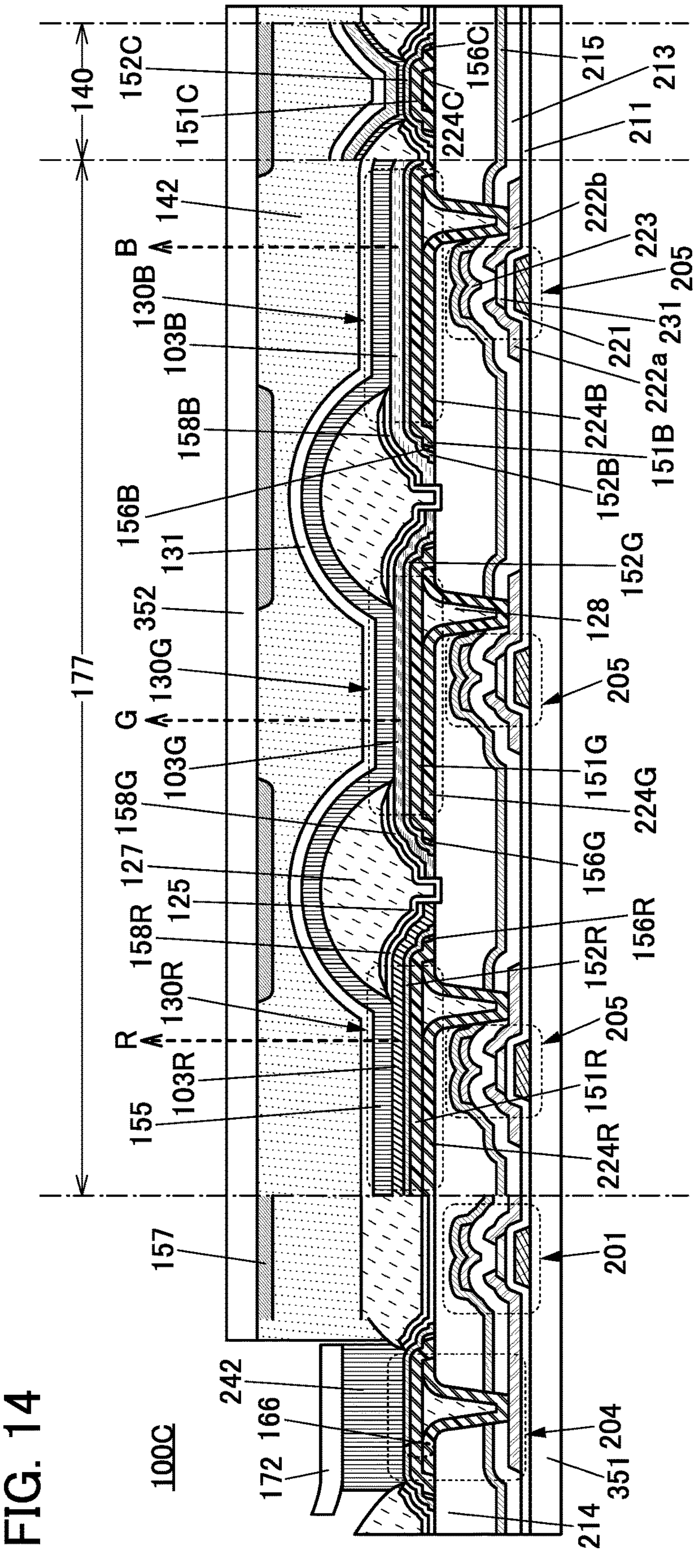
FIG. 14 is a cross-sectional view illustrating a structure example of a display device.

FIG. 13 is a perspective view of the display device 100B, and FIG. 14 is a cross-sectional view of the display device 100C.

In the display device 100B, a substrate 352 and a substrate 351 are bonded to each other. In FIG. 13, the substrate 352 is denoted by a dashed line.

The display device 100B includes the pixel portion 177, the connection portion 140, a circuit 356, a wiring 355, and the like. FIG. 13 illustrates an example in which an IC 354 and an FPC 353 are mounted on the display device 100B. Thus, the structure illustrated in FIG. 13 can be regarded as a display module including the display device 100B, the integrated circuit (IC), and the FPC. Here, a display device in which a substrate is equipped with a connector such as an FPC or mounted with an IC is referred to as a display module.

The connection portion 140 is provided outside the pixel portion 177. The number of connection portions 140 may be one or more. In the connection portion 140, a common electrode of a light-emitting device is electrically connected to a conductive layer, so that a potential can be supplied to the common electrode.

As the circuit 356, a scan line driver circuit can be used, for example.

The wiring 355 has a function of supplying a signal and power to the pixel portion 177 and the circuit 356. The signal and power are input to the wiring 355 from the outside through the FPC 353 or from the IC 354.

FIG. 13 illustrates an example in which the IC 354 is provided over the substrate 351 by a chip on glass (COG) method, a chip on film (COF) method, or the like. An IC including a scan line driver circuit, a signal line driver circuit, or the like can be used as the IC 354, for example. Note that the display device 100B and the display module are not necessarily provided with an IC. The IC may be mounted on the FPC by a COF method or the like.

FIG. 14 illustrates an example of cross sections of part of a region including the FPC 353, part of the circuit 356, part of the pixel portion 177, part of the connection portion 140, and part of a region including an end portion of the display device 100B.

[Display Device 100C]

The display device 100C illustrated in FIG. 14 includes a transistor 201, a transistor 205, the light-emitting device 130R that emits red light, the light-emitting device 130G that emits green light, the light-emitting device 130B that emits blue light, and the like between the substrate 351 and the substrate 352.

Embodiment 1 can be referred to for the details of the light-emitting devices 130R, 130G, and 130B.

The light-emitting device 130R includes a conductive layer 224R, the conductive layer 151R over the conductive layer 224R, and the conductive layer 152R over the conductive layer 151R. The light-emitting device 130G includes a conductive layer 224G, the conductive layer 151G over the conductive layer 224G, and the conductive layer 152G over the conductive layer 151G. The light-emitting device 130B includes a conductive layer 224B, the conductive layer 151B over the conductive layer 224B, and the conductive layer 152B over the conductive layer 151B.

The conductive layer 224R is connected to a conductive layer 222*b* included in the transistor 205 through the opening provided in an insulating layer 214. The end portion of the conductive layer 151R is positioned on the outer side of the end portion of the conductive layer 224R. The insulating layer 156R is provided to include a region that is in contact with the side surface of the conductive layer 151R, and the conductive layer 152R is provided to cover the conductive layer 151R and the insulating layer 156R.

The conductive layers 224G, 151G, and 152G and the insulating layer 156G in the light-emitting device 130G are not described in detail because they are respectively similar to the conductive layers 224R, 151R, and 152R and the insulating layer 156R in the light-emitting device 130R; the same applies to the conductive layers 224B, 151B, and 152B and the insulating layer 156B in the light-emitting device 130B.

The conductive layers 224R, 224G, and 224B each have a depression portion covering an opening provided in the insulating layer 214. A layer 128 is embedded in the depression portion.

The layer 128 has a function of filling the depression portions of the conductive layers 224R, 224G, and 224B to obtain planarity. Over the conductive layers 224R, 224G, and 224B and the layer 128, the conductive layers 151R, 151G, and 151B that are respectively electrically connected to the conductive layers 224R, 224G, and 224B are provided. Thus, the regions overlapping with the depression portions of the conductive layers 224R, 224G, and 224B can also be used as light-emitting regions, whereby the aperture ratio of the pixel can be increased.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. The layer 128 can be formed using an organic insulating material usable for the insulating layer 127, for example.

The protective layer 131 is provided over the light-emitting devices 130R, 130G, and 130B. The protective layer 131 and the substrate 352 are bonded to each other with an adhesive layer 142. The substrate 352 is provided with a light-blocking layer 157. A solid sealing structure, a hollow sealing structure, or the like can be employed to seal the light-emitting device 130. In FIG. 14, a solid sealing structure is employed, in which a space between the substrate 352 and the substrate 351 is filled with the adhesive layer 142. Alternatively, a hollow sealing structure may be employed, in which the space is filled with an inert gas (e.g., nitrogen or argon). In that case, the adhesive layer 142 may be provided not to overlap with the light-emitting device. Alternatively, the space may be filled with a resin other than the frame-like adhesive layer 142.

FIG. 14 illustrates an example in which the connection portion 140 includes a conductive layer 224C obtained by processing the same conductive film as the conductive layers 224R, 224G, and 224B; the conductive layer 151C obtained by processing the same conductive film as the conductive layers 151R, 151G, and 151B; and the conductive layer 152C obtained by processing the same conductive film as the conductive layers 152R, 152G, and 152B. In the example illustrated in FIG. 14, the insulating layer 156C is provided to include a region overlapping with the side surface of the conductive layer 151C.

The display device 100C has a top-emission structure. Light from the light-emitting device is emitted toward the substrate 352. For the substrate 352, a material having a high visible-light-transmitting property is preferably used. The pixel electrode contains a material that reflects visible light, and the counter electrode (the common electrode 155) contains a material that transmits visible light.

An insulating layer 211, an insulating layer 213, an insulating layer 215, and the insulating layer 214 are provided in this order over the substrate 351. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or more.

An inorganic insulating film is preferably used as each of the insulating layers 211, 213, and 215.

An organic insulating layer is suitable as the insulating layer 214 functioning as a planarization layer.

Each of the transistors 201 and 205 includes a conductive layer 221 functioning as a gate, the insulating layer 211 functioning as a gate insulating layer, a conductive layer 222*a* and a conductive layer 222*b* functioning as a source and a drain, a semiconductor layer 231, the insulating layer 213 functioning as a gate insulating layer, and a conductive layer 223 functioning as a gate.

A connection portion 204 is provided in a region of the substrate 351 which does not overlap with the substrate 352. In the connection portion 204, the wiring 355 is electrically connected to the FPC 353 through a conductive layer 166 and a connection layer 242. As an example, the conductive layer 166 has a stacked-layer structure of a conductive film obtained by processing the same conductive film as the conductive layers 224R, 224G, and 224B; a conductive film obtained by processing the same conductive film as the conductive layers 151R, 151G, and 151B; and a conductive film obtained by processing the same conductive film as the conductive layers 152R, 152G, and 152B. On the top surface of the connection portion 204, the conductive layer 166 is exposed. Thus, the connection portion 204 and the FPC 353 can be electrically connected to each other through the connection layer 242.

The light-blocking layer 157 is preferably provided on the surface of the substrate 352 on the substrate 351 side. The light-blocking layer 157 can be provided over a region between adjacent light-emitting devices, in the connection portion 140, in the circuit 356, and the like. A variety of optical members can be arranged on the outer surface of the substrate 352.

A material that can be used for the substrate 120 can be used for each of the substrates 351 and 352.

A material that can be used for the resin layer 122 can be used for the adhesive layer 142.

As the connection layer 242, for example, an anisotropic conductive film (ACF) or an anisotropic conductive paste (ACP) can be used.

[Display Device 100D]

Figure 15:
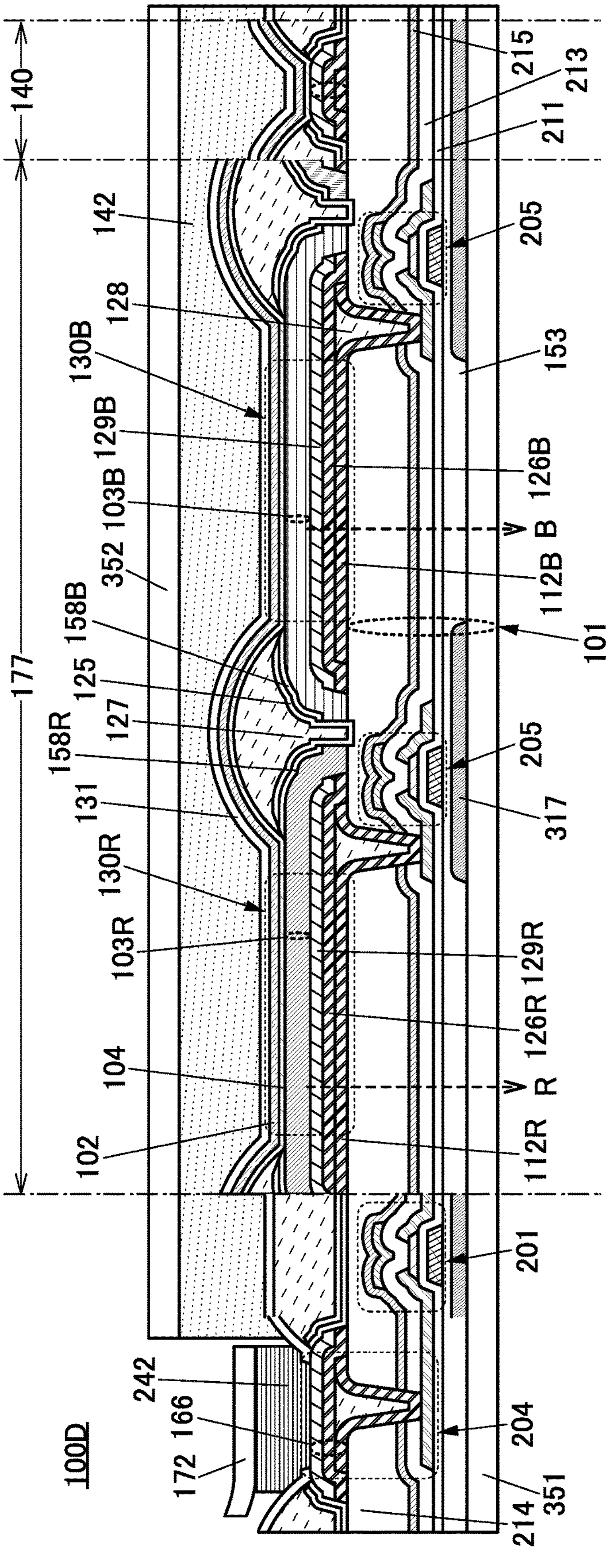
FIG. 15 is a cross-sectional view illustrating a structure example of a display device.

The display device 100D in FIG. 15 differs from the display device 100C in FIG. 14 mainly in having a bottom-emission structure.

Light from the light-emitting device is emitted toward the substrate 351. For the substrate 351, a material having a high visible-light-transmitting property is preferably used. By contrast, there is no limitation on the light-transmitting property of a material used for the substrate 352.

The light-blocking layer 317 is preferably formed between the substrate 351 and the transistor 201 and between the substrate 351 and the transistor 205. FIG. 15 illustrates an example in which the light-blocking layer 317 is provided over the substrate 351, an insulating layer 153 is provided over the light-blocking layer 317, and the transistors 201 and 205 and the like are provided over the insulating layer 153.

The light-emitting device 130R includes a conductive layer 112R, a conductive layer 126R over the conductive layer 112R, and a conductive layer 129R over the conductive layer 126R.

The light-emitting device 130B includes a conductive layer 112B, a conductive layer 126B over the conductive layer 112B, and a conductive layer 129B over the conductive layer 126B.

A material having a high visible-light-transmitting property is used for each of the conductive layers 112R, 112B, 126R, 126B, 129R, and 129B. A material that reflects visible light is preferably used for the second electrode 102.

Although not shown in FIG. 15, the light-emitting device 130G is also provided.

Although FIG. 15 and the like illustrate an example in which the top surface of the layer 128 includes a flat portion, the shape of the layer 128 is not particularly limited.

[Display Device 100E]

Figure 16:
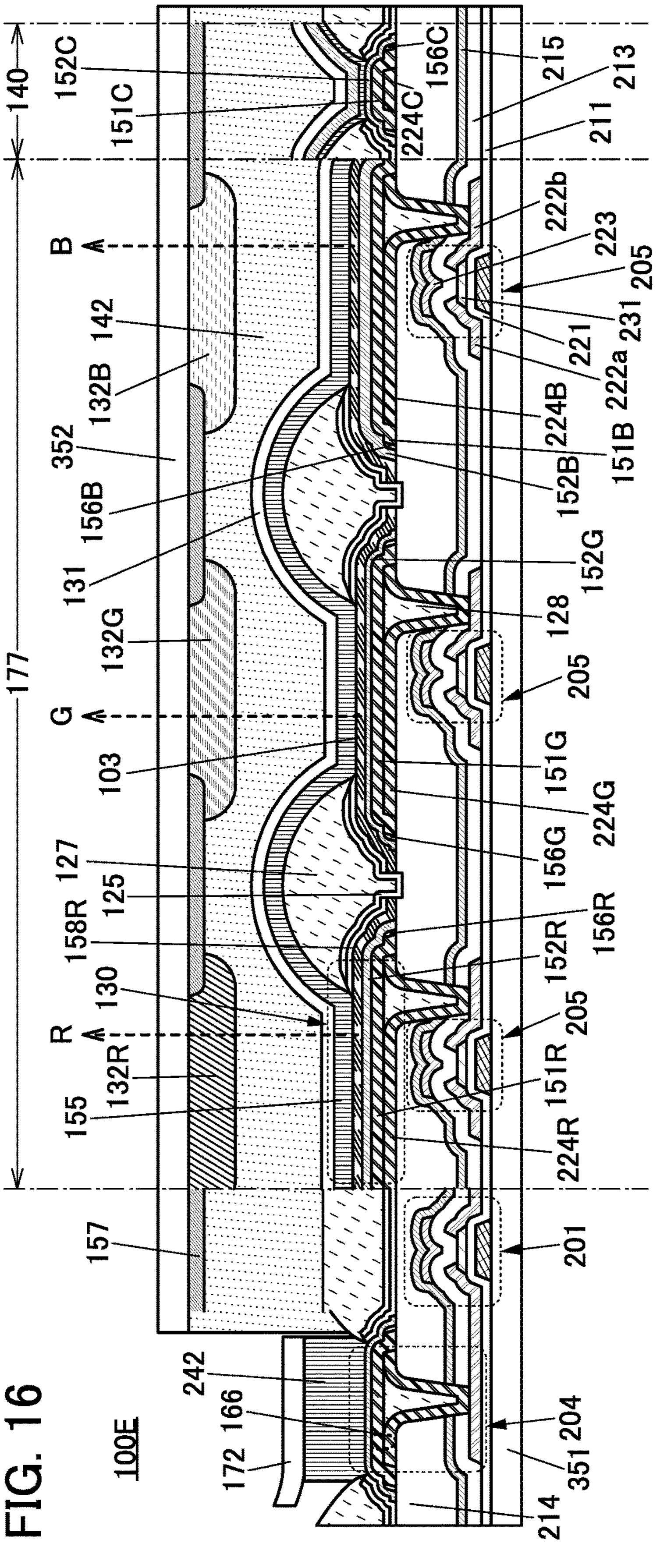
FIG. 16 is a cross-sectional view illustrating a structure example of a display device.

The display device 100E illustrated in FIG. 16 is a variation example of the display device 100C illustrated in FIG. 14 and differs from the display device 100C mainly in including the coloring layers 132R, 132G, and 132B.

In the display device 100E, the light-emitting device 130 includes a region overlapping with one of the coloring layers 132R, 132G, and 132B. The coloring layers 132R, 132G, and 132B can be provided on a surface of the substrate 352 on the substrate 351 side. The end portions of the coloring layers 132R, 132G, and 132B can overlap with the light-blocking layer 157.

In the display device 100E, the light-emitting device 130 can emit white light, for example. For example, the coloring layer 132R, the coloring layer 132G, and the coloring layer 132B can transmit red light, green light, and blue light, respectively. Note that in the display device 100E, the coloring layers 132R, 132G, and 132B may be provided between the protective layer 131 and the adhesive layer 142.

This embodiment can be combined as appropriate with the other embodiments or an example. In this specification, in the case where a plurality of structure examples are shown in one embodiment, the structure examples can be combined as appropriate.

Embodiment 6

In this embodiment, electronic devices of embodiments of the present invention will be described.

Electronic devices of this embodiment are each provided with the display device of one embodiment of the present invention in a display portion. The display device of one embodiment of the present invention has low power consumption and high reliability. Thus, the display device of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and notebook personal computers, a monitor of a computer and the like, digital signage, and a large game machine such as a pachinko machine.

Examples of head-mounted wearable devices are described with reference to FIGS. 17A to 17D.

Figure 17A:
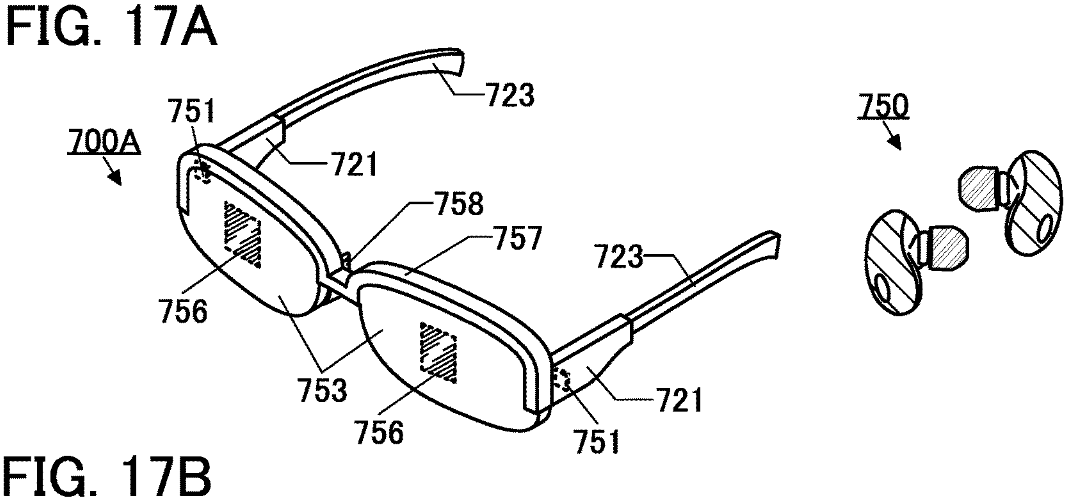
FIGS. 17A to 17D each illustrate an example of an electronic device.
Figure 17B:
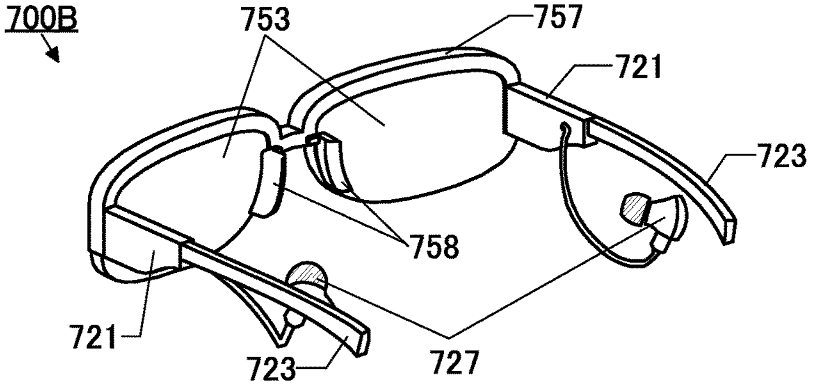

An electronic device 700A illustrated in FIG. 17A and an electronic device 700B illustrated in FIG. 17B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display device of one embodiment of the present invention can be used for the display panels 751. Thus, a highly reliable electronic device is obtained.

The electronic devices 700A and 700B can each project images displayed on the display panels 751 onto display regions 756 of the optical members 753. Since the optical members 753 have a light-transmitting property, the user can see images displayed on the display regions, which are superimposed on transmission images seen through the optical members 753.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal, for example, can be supplied by the wireless communication device. Instead of or in addition to the wireless communication device, a connector that can be connected to a cable for supplying a video signal and a power supply potential may be provided.

The electronic devices 700A and 700B are provided with a battery, so that they can be charged wirelessly and/or by wire.

A touch sensor module may be provided in the housing 721.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

Figure 17C:
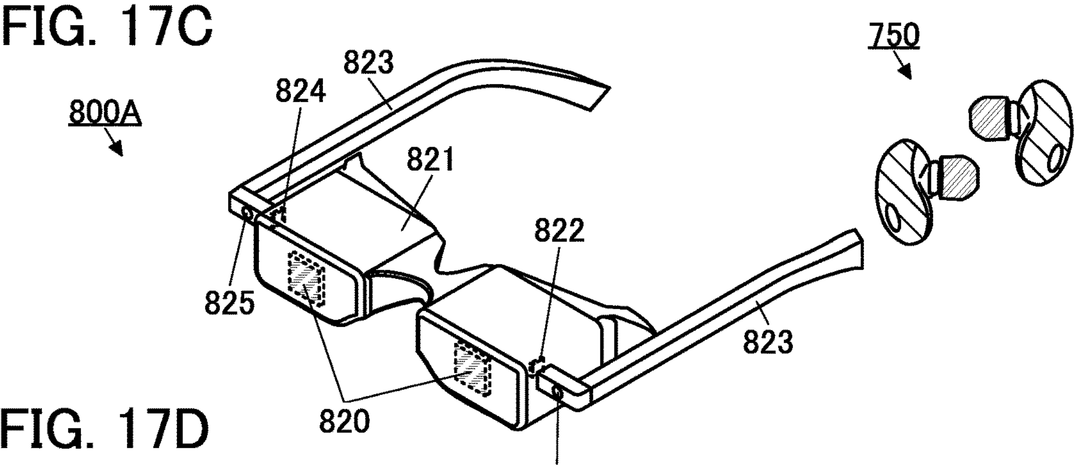
Figure 17D:
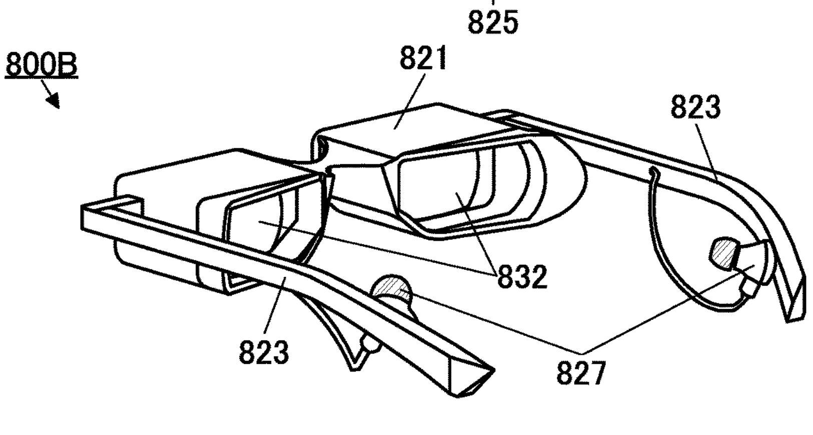

An electronic device 800A illustrated in FIG. 17C and an electronic device 800B illustrated in FIG. 17D each include a pair of display portions 820, a housing 821, a communication portion 822, a pair of wearing portions 823, a control portion 824, a pair of image capturing portions 825, and a pair of lenses 832.

The display device of one embodiment of the present invention can be used in the display portions 820. Thus, a highly reliable electronic device is obtained.

The display portions 820 are positioned inside the housing 821 so as to be seen through the lenses 832. When the pair of display portions 820 display different images, three-dimensional display using parallax can be performed.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes.

The electronic device 800A or the electronic device 800B can be mounted on the user's head with the wearing portions 823.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

The electronic device 800A may include a vibration mechanism that functions as bone-conduction earphones.

The electronic devices 800A and 800B may each include an input terminal. To the input terminal, a cable for supplying a video signal from a video output device or the like, power for charging a battery provided in the electronic device, and the like can be connected.

The electronic device of one embodiment of the present invention may have a function of performing wireless communication with earphones 750.

The electronic device may include an earphone portion. The electronic device 700B in FIG. 17B includes earphone portions 727. Part of a wiring that connects the earphone portion 727 and the control portion may be positioned inside the housing 721 or the wearing portion 723.

Similarly, the electronic device 800B in FIG. 17D includes earphone portions 827. For example, the earphone portion 827 can be connected to the control portion 824 by wire.

As described above, both the glasses-type device (e.g., the electronic devices 700A and 700B) and the goggles-type device (e.g., the electronic devices 800A and 800B) are preferable as the electronic device of one embodiment of the present invention.

Figure 18A:
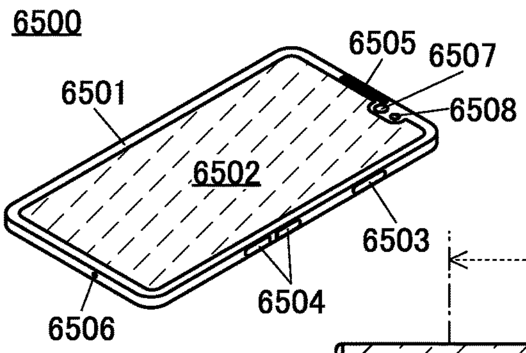
FIGS. 18A to 18F each illustrate an example of an electronic device.

An electronic device 6500 illustrated in FIG. 18A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502. Thus, a highly reliable electronic device is obtained.

Figure 18B:
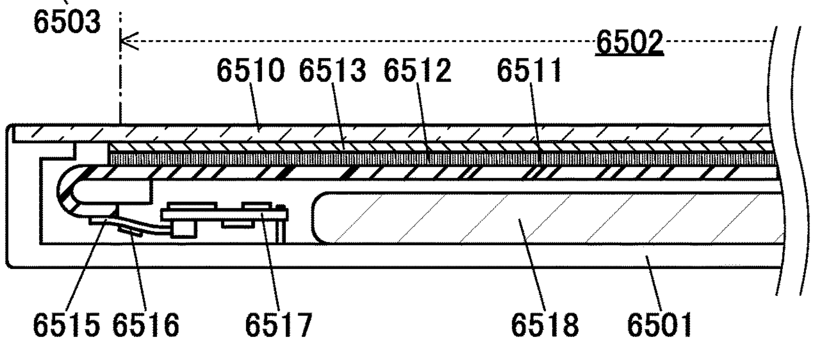

FIG. 18B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with a bonding layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

The display device of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 18C:
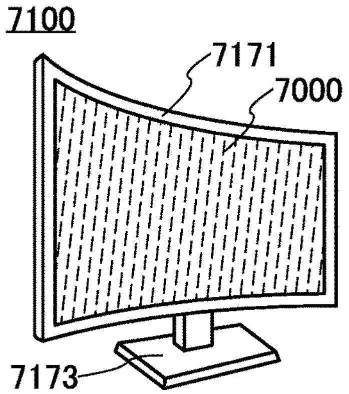

FIG. 18C illustrates an example of a television device. In a television device 7100, a display portion 7000 is incorporated in a housing 7171. Here, the housing 7171 is supported by a stand 7173.

The display device of one embodiment of the present invention can be used in the display portion 7000. Thus, a highly reliable electronic device is obtained.

Operation of the television device 7100 illustrated in FIG. 18C can be performed with an operation switch provided in the housing 7171 and a separate remote controller 7151.

Figure 18D:
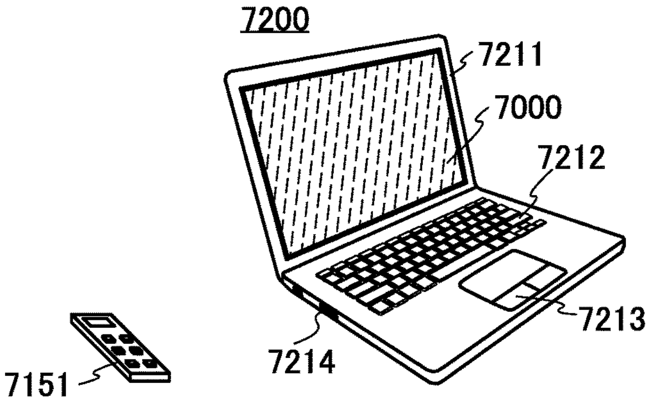

FIG. 18D illustrates an example of a notebook personal computer. A laptop personal computer 7200 includes a housing 7211, a keyboard 7212, a pointing device 7213, an external connection port 7214, and the like. The display portion 7000 is incorporated in the housing 7211.

The display device of one embodiment of the present invention can be used in the display portion 7000. Thus, a highly reliable electronic device is obtained.

Figure 18E:
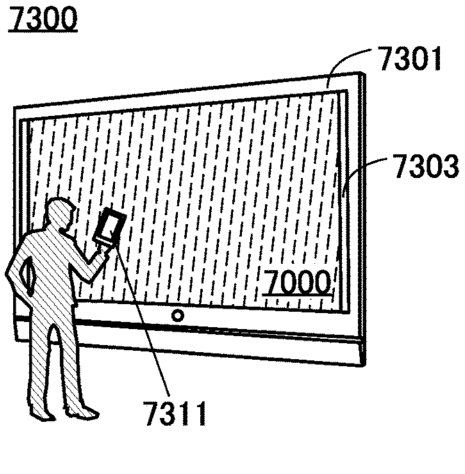
Figure 18F:
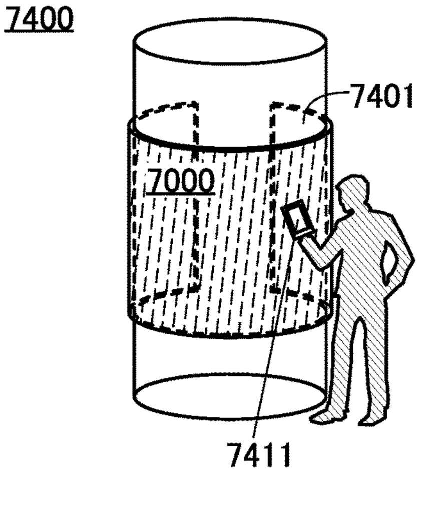

FIGS. 18E and 18F illustrate examples of digital signage.

Digital signage 7300 illustrated in FIG. 18E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 18F shows digital signage 7400 attached to a cylindrical pillar 7401. The digital signage 7400 includes the display portion 7000 provided along a curved surface of the pillar 7401.

In FIGS. 18E and 18F, the display device of one embodiment of the present invention can be used in the display portion 7000. Thus, a highly reliable electronic device is obtained.

A larger area of the display portion 7000 can increase the amount of information that can be provided at a time. The larger display portion 7000 attracts more attention, so that the effectiveness of the advertisement can be increased, for example.

As illustrated in FIGS. 18E and 18F, it is preferable that the digital signage 7300 or the digital signage 7400 can work with an information terminal 7311 or an information terminal 7411, such as a smartphone that a user has, through wireless communication.

Electronic devices illustrated in FIGS. 19A to 19G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 9008, and the like.

The electronic devices illustrated in FIGS. 19A to 19G have a variety of functions. For example, the electronic devices can have a function of displaying a variety of information (e.g., a still image, a moving image, and a text image) on the display portion, a touch panel function, a function of displaying a calendar, date, time, and the like, a function of controlling processing with use of a variety of software (programs), a wireless communication function, and a function of reading out and processing a program or data stored in a recording medium.

The electronic devices in FIGS. 19A to 19G are described in detail below.

Figure 19A:
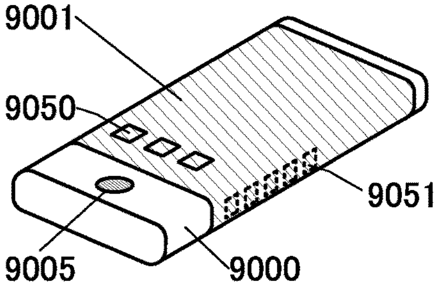
FIGS. 19A to 19G each illustrate an example of an electronic device.

FIG. 19A is a perspective view of a portable information terminal 9171. The portable information terminal 9171 can be used as a smartphone, for example. The portable information terminal 9171 may include the speaker 9003, the connection terminal 9006, the sensor 9007, or the like. The portable information terminal 9171 can display text and image information on its plurality of surfaces. FIG. 19A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, an incoming call, or the like, the title and sender of an e-mail, an SNS message, or the like, the date, the time, remaining battery, and the radio field intensity. Alternatively, the icon 9050 or the like may be displayed at the position where the information 9051 is displayed.

Figure 19B:
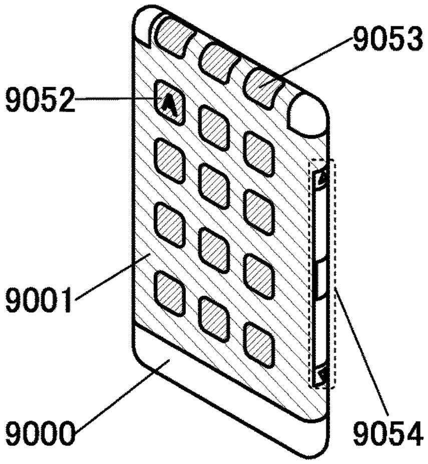

FIG. 19B is a perspective view of a portable information terminal 9172. The portable information terminal 9172 has a function of displaying information on three or more surfaces of the display portion 9001. Here, information 9052, information 9053, and information 9054 are displayed on different surfaces. For example, the user of the portable information terminal 9172 can check the information 9053 displayed such that it can be seen from above the portable information terminal 9172, with the portable information terminal 9172 put in a breast pocket of his/her clothes.

Figure 19C:
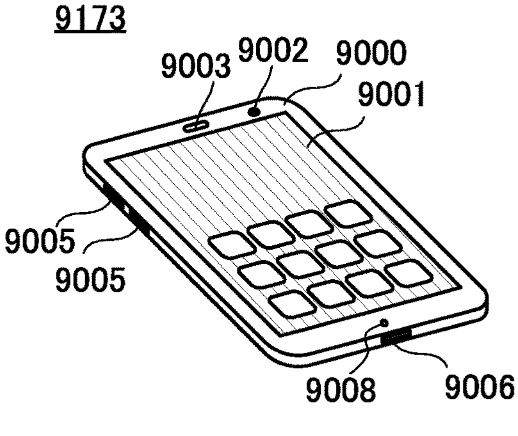

FIG. 19C is a perspective view of a tablet terminal 9173. The tablet terminal 9173 is capable of executing a variety of applications such as mobile phone calls, e-mailing, viewing and editing texts, music reproduction, Internet communication, and a computer game, for example. The tablet terminal 9173 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 19D:
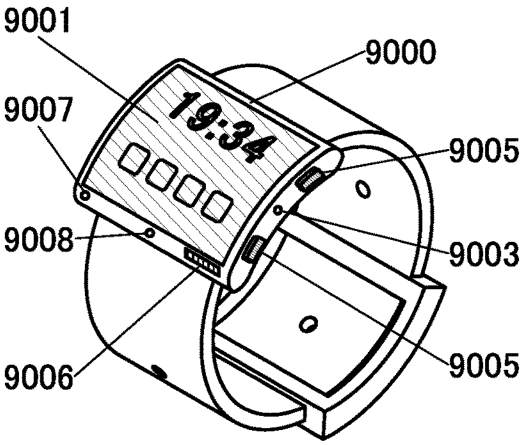

FIG. 19D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 19E:
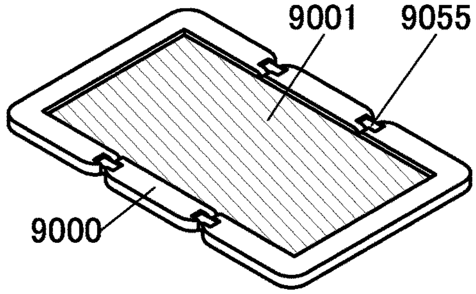
Figure 19F:
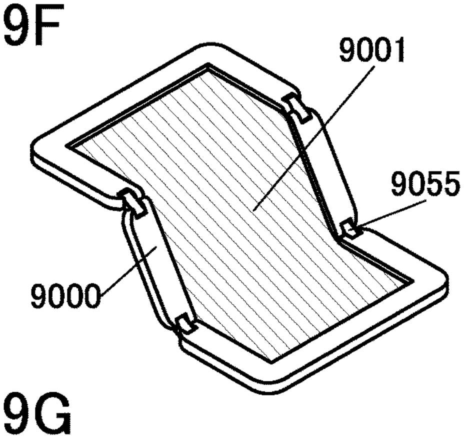
Figure 19G:
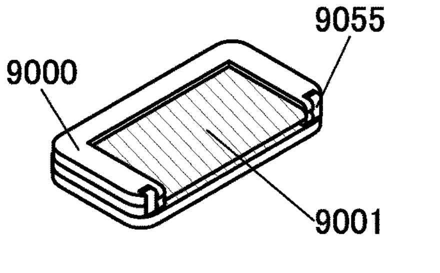

FIGS. 19E to 19G are perspective views of a foldable portable information terminal 9201. FIG. 19E is a perspective view showing the portable information terminal 9201 that is opened. FIG. 19G is a perspective view showing the portable information terminal 9201 that is folded. FIG. 19F is a perspective view showing the portable information terminal 9201 that is shifted from one of the states in FIGS. 19E and 19G to the other. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined as appropriate with the other embodiments or an example. In this specification, in the case where a plurality of structure examples are shown in one embodiment, the structure examples can be combined as appropriate.

Example 1

In this example, fabricating methods and characteristics of a light-emitting device 1 of one embodiment of the present invention and comparative light-emitting devices 1 and 2 which are comparative examples will be described in detail. Structural formulae of organic compounds used for the light-emitting device 1, the comparative light-emitting devices 1 and 2 are shown below.

[Chemical Formula 9]

(i)

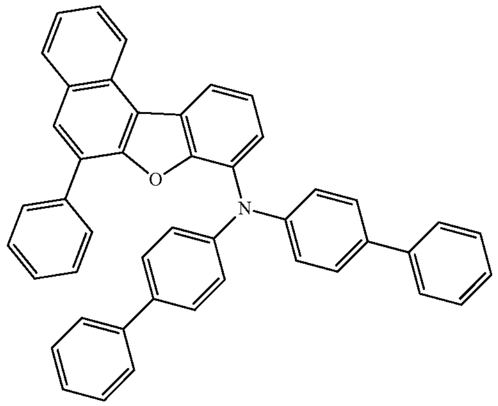

BBABnf (ii)

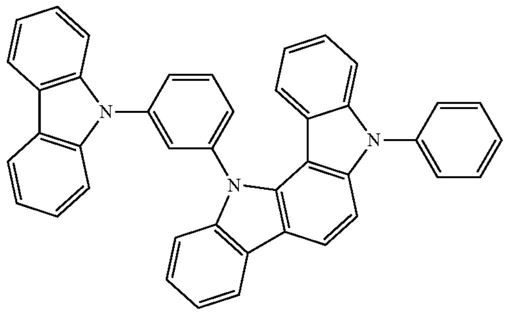

MCzPICz

-continued (iii)

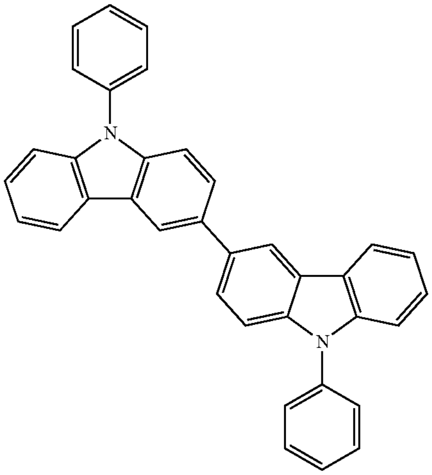

PCCP (iv)

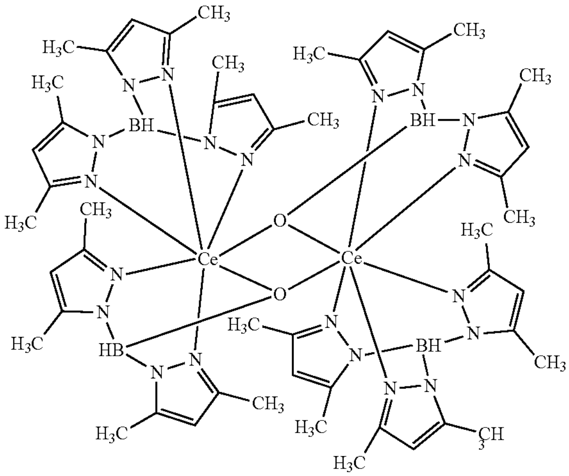

[Ce(bmpz3)(bmpz2)O]2

(v)

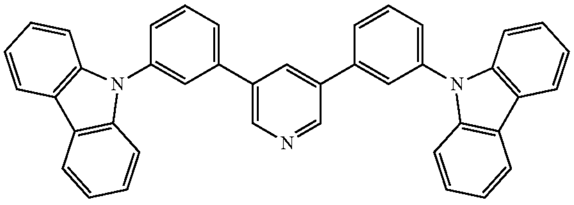

3,5DCzPPY

-continued (vi)

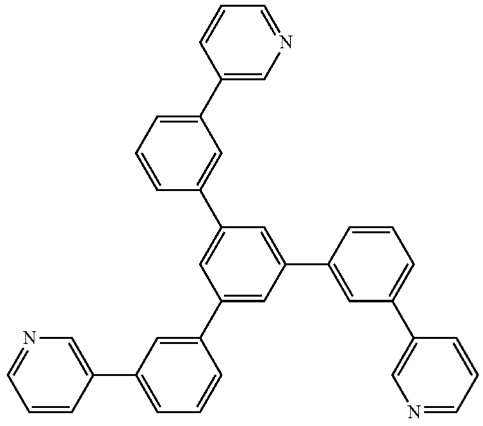

TmPyPB (vii)

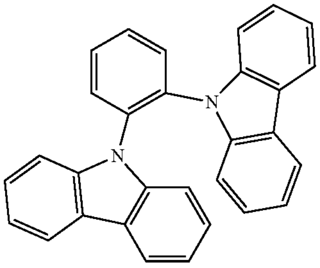

oCP (viii)

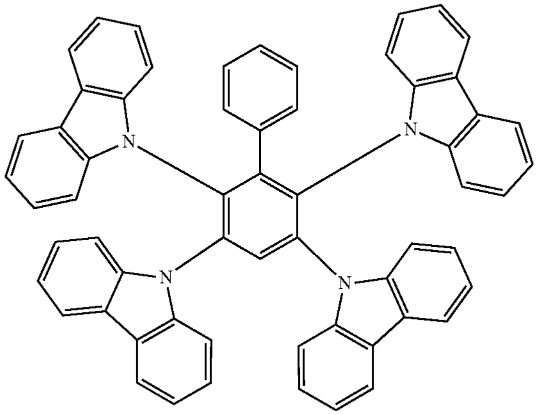

Cz4BP (Fabrication Method of Light-Emitting Device 1)

First, indium tin oxide containing silicon oxide (ITSO) was deposited over a glass substrate to a thickness of 70 nm by a sputtering method, so that the first electrode 101 having a size of 2 mm×2 mm was formed. Note that the ITSO served as an anode.

Then, pretreatment for formation of the light-emitting device over the substrate was performed by washing the substrate surface with water.

After that, the substrate was transferred into a vacuum evaporation apparatus where the pressure was reduced to approximately $1\times10^{-4}$ Pa, and was subjected to vacuum baking at 170° C. for 30 minutes in a heating chamber of the vacuum evaporation apparatus and then, the substrate was cooled down for approximately 30 minutes.

Next, the substrate was fixed to a holder provided in the vacuum evaporation apparatus such that the side on which the first electrode 101 was formed faced downward. Then, N,N-bis(4-biphenyl)-6-phenylbenzo[b]naphtho[1,2-d]furan-8-amine (abbreviation: BBABnf) represented by Structural Formula (i) above and a fluorine-containing electron acceptor material (OCHD-003) with a molecular weight of 672 were deposited by co-evaporation over the first electrode 101 to a thickness of 10 nm such that the weight ratio of BBABnf to OCHD-003 was 1:0.1; thus, the hole-injection layer 111 was formed.

Over the hole-injection layer 111, BBABnf was deposited by evaporation to a thickness of 25 nm and 12-[3-(9H-carbazol-9-yl)phenyl]-5,12-dihydro-5-phenyl-indolo[3,2-a]carbazole (abbreviation: mCzPICz) represented by Structural Formula (ii) above was subsequently deposited by evaporation to a thickness of 10 nm, so that the hole-transport layer 112 was formed.

Next, over the hole-transport layer, 3,3'-bis(9-phenyl-9H-carbazole) (abbreviation: PCCP) represented by Structural Formula (iii) above and di-μ-oxobis[bis(3,5-dimethyl-1H-pyrazolato-κN1)hydroborato(1-)-κN2,κN2']bis[tris(3,5-dimethyl-1H-pyrazolato-κN1)hydroborato(1-)-κN2,κN2',κN2"]dicerium(III) (abbreviation: $[Ce(bmpz_3)(bmpz_2)O]_2$) were deposited by co-evaporation to a thickness of 30 nm with a weight ratio of PCCP to $[Ce(bmpz_3)(bmpz_2)O]_2$ being 1:0.1, so that the light-emitting layer 113 was formed.

After that, 3,5-bis[3-(9H-carbazol-9-yl)phenyl]pyridine (abbreviation: 35DCzPPy) represented by Structural Formula (vi) above was deposited by evaporation to a thickness of 10 nm and 1,3,5-tri[(3-pyridyl)-phenyl-3-yl]benzene (abbreviation: TmPyPB) represented by Structural Formula (vii) above was then deposited by evaporation to a thickness of 15 nm, so that the electron-transport layer 114 was formed.

Then, lithium fluoride (LiF) was deposited by evaporation to a thickness of 1 nm to form the electron-injection layer 115. Aluminum (Al) was deposited by evaporation to a thickness of 200 nm to form the second electrode 102. Through the above, the light-emitting device 1 of one embodiment of the present invention was formed.

Then, the light-emitting device was sealed using a glass substrate in a glove box containing a nitrogen atmosphere so as not to be exposed to the air. Specifically, a UV curable sealing material was applied to surround the device, only the sealing material was irradiated with UV while the light-emitting device was not irradiated with the UV, and heat treatment was performed at 80° C. under an atmospheric pressure for one hour. In this manner, the light-emitting device 1 was fabricated.

(Fabrication Method of Comparative Light-Emitting Device 1)

The comparative light-emitting device 1 was fabricated in a manner similar to that for the light-emitting device 1 except that PCCP in the light-emitting device 1 was replaced with 1,2-bis(carbazol-9-yl)benzene (abbreviation: oCP) represented by Structural Formula (vii) above.

(Fabrication Method of Comparative Light-Emitting Device 2)

The comparative light-emitting device 2 was fabricated in a manner similar to that for the light-emitting device 1 except that PCCP in the light-emitting device 1 was replaced with 9,9',9",9"'-(biphenyl-2,3,5,6-tetrayl)tetrakis(9H-carbazole) (abbreviation: Cz4BP) represented by Structural Formula (viii) above.

Device structures of the light-emitting device 1 and the comparative light-emitting devices 1 and 2 are shown below.

TABLE 1

| | | Thickness (nm) | Light-emitting device 1 | Comparative light-emitting device 1 | Comparative light-emitting device 2 |
|---|---|---|---|---|---|
| Second electrode | | 200 | Al | | |
| Electron-injection layer | | 1 | LiF | | |
| Electron-transport layer | 2 | 15 | TmPyPB | | |
| | 1 | 10 | 3,5DCzPPy | | |
| Light-emitting layer | | 30 | *1:$[Ce(bmpz_3)(bmpz_2)O]_2$ (1:0.1) | | |
| Hole-transport layer | 2 | 10 | mCzPICz | | |
| | 1 | 25 | BBABnf | | |
| Hole-injection layer | | 10 | BBABnf:OCHD-003 (1:0.1) | | |
| First electrode | | 70 | ITSO | | |

Figure 20:
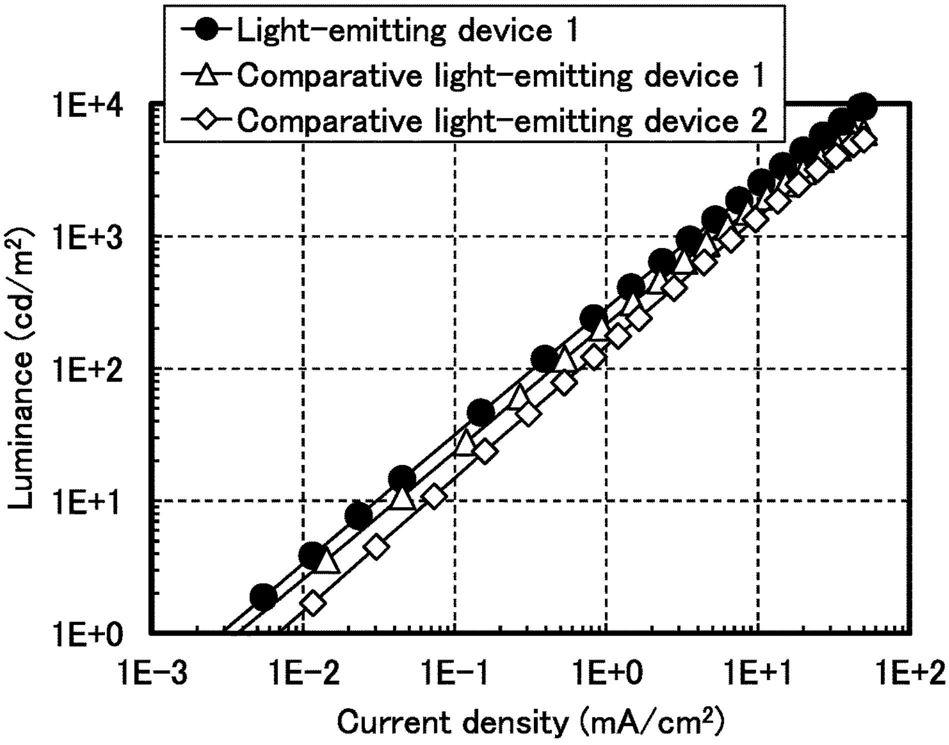
FIG. 20 is a graph showing luminance-current density characteristics of a light-emitting device 1, a comparative light-emitting device 1, and a comparative light-emitting device 2.
Figure 21:
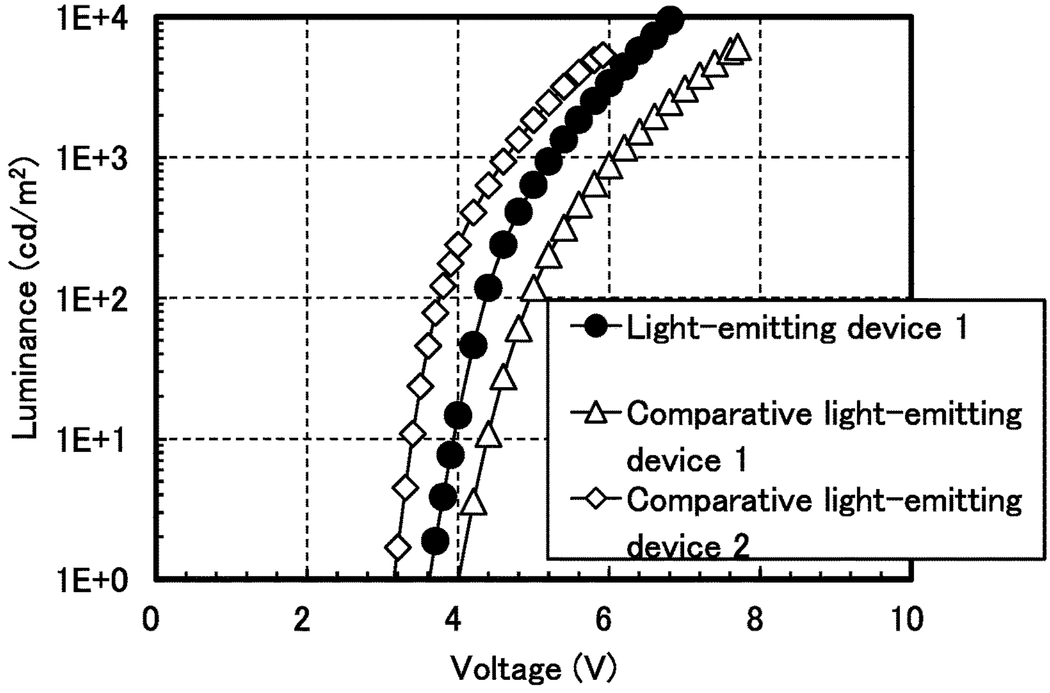
FIG. 21 is a graph showing luminance-voltage characteristics of the light-emitting device 1, the comparative light-emitting device 1, and the comparative light-emitting device 2.
Figure 22:
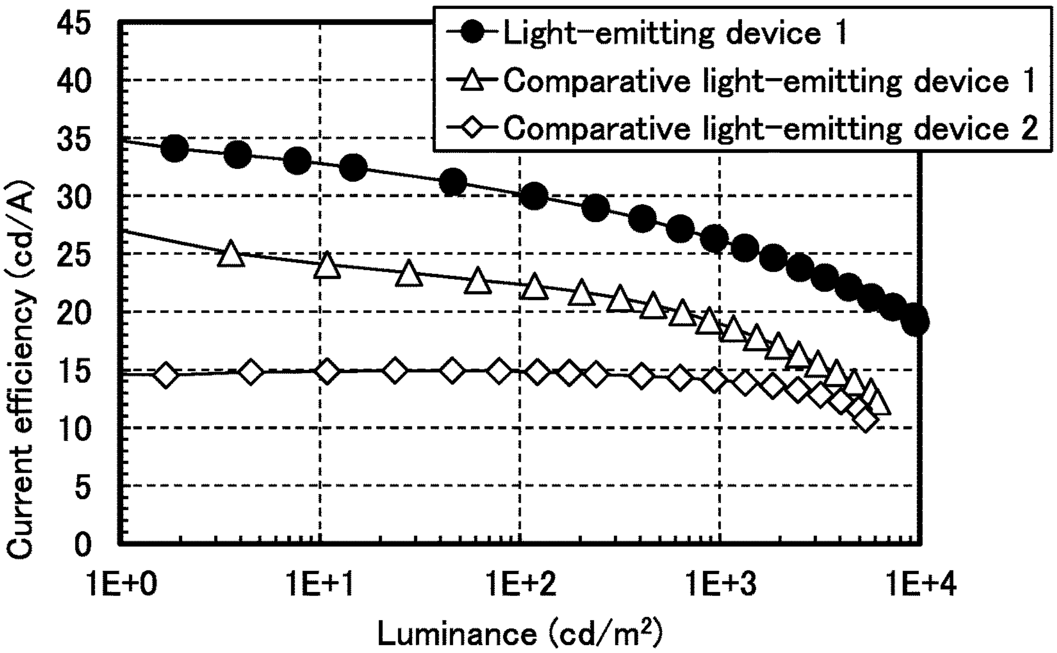
FIG. 22 is a graph showing current efficiency-luminance characteristics of the light-emitting device 1, the comparative light-emitting device 1, and the comparative light-emitting device 2.
Figure 23:
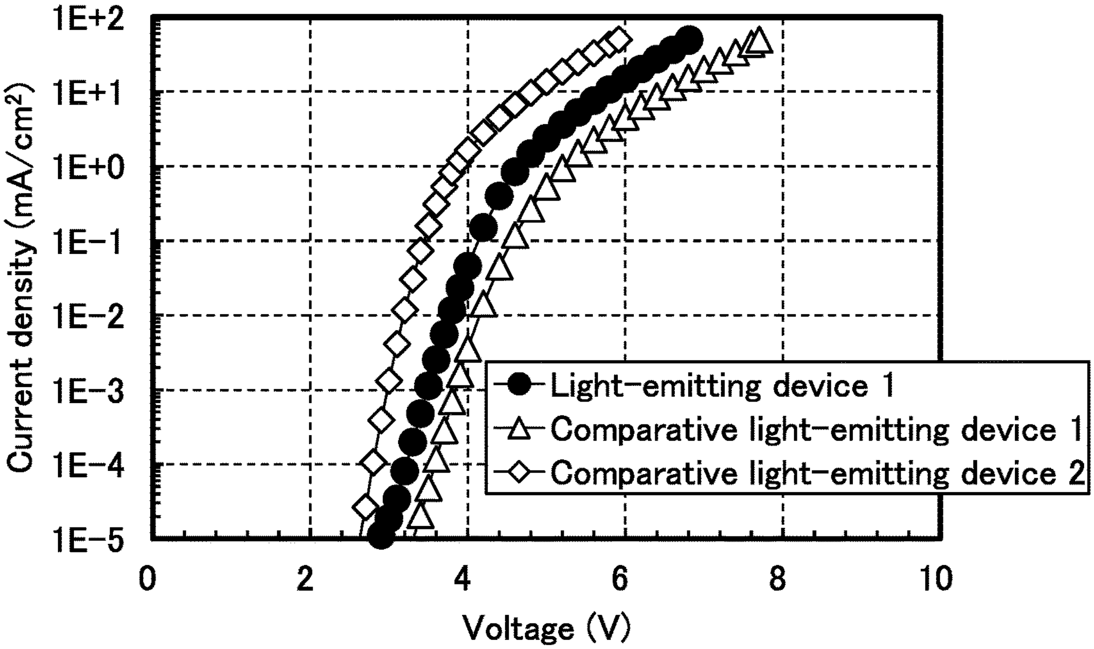
FIG. 23 is a graph showing current density-voltage characteristics of the light-emitting device 1, the comparative light-emitting device 1, and the comparative light-emitting device 2.
Figure 24:
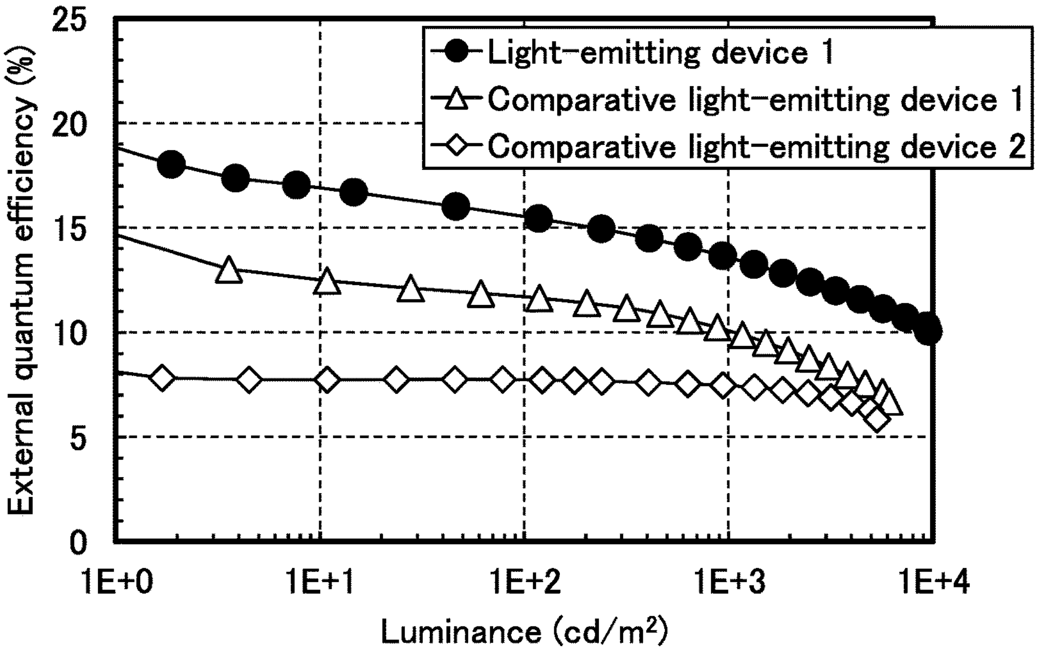
FIG. 24 is a graph showing external quantum efficiency-luminance characteristics of the light-emitting device 1, the comparative light-emitting device 1, and the comparative light-emitting device 2.
Figure 25:
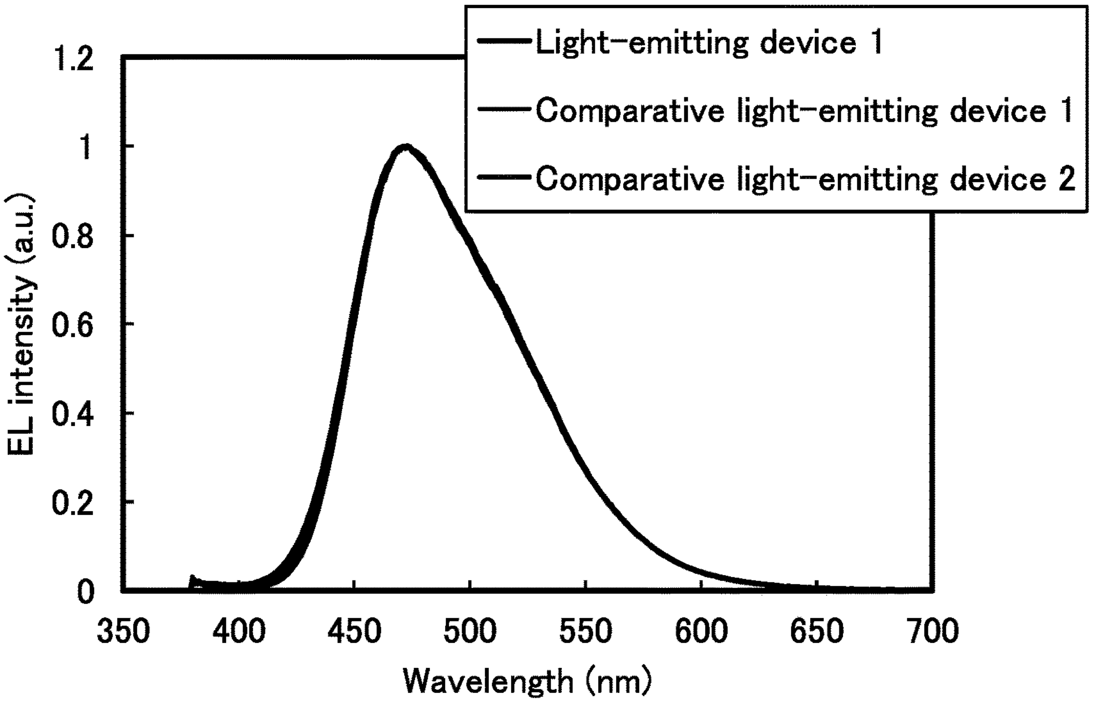
FIG. 25 is a graph showing emission spectra of the light-emitting device 1, the comparative light-emitting device 1, and the comparative light-emitting device 2.

*1Light-emitting device 1: PCCP
Comparative light-emitting device 1: oCP
Comparative light-emitting device 2: Cz4BP FIG. 20 shows luminance-current density characteristics of the light-emitting device 1 and the comparative light-emitting devices 1 and 2. FIG. 21 shows luminance-voltage characteristics thereof. FIG. 22 shows current efficiency-luminance characteristics thereof. FIG. 23 shows current density-voltage characteristics thereof. FIG. 24 shows external quantum efficiency-luminance characteristics thereof. FIG. 25 shows emission spectra thereof. The values of the voltage, current, current density, CIE chromaticity, current efficiency, and external quantum efficiency at around 1000 $cd/cm^2$ are shown below. The luminance, CIE chromaticity, and electroluminescence spectra were measured at room temperature with a spectroradiometer (SR-UL1R manufactured by TOPCON TECHNOHOUSE CORPORATION). The external quantum efficiency was calculated from the luminance and the electroluminescence spectra measured with the spectroradiometer, on the assumption that the light-emitting devices had isotropic (Lambertian) light-distribution characteristics.

TABLE 2

| | Voltage (V) | Current (mA) | Current density ($mA/cm^2$) | Chromaticity x | Chromaticity y | Current efficiency (cd/A) | External quantum efficiency (%) |
|---|---|---|---|---|---|---|---|
| Light-emitting device 1 | 5.2 | 0.143 | 3.57 | 0.16 | 0.28 | 26 | 14 |
| Comparative light-emitting device 1 | 6.0 | 0.183 | 4.59 | 0.16 | 0.27 | 19 | 10 |
| Comparative light-emitting device 2 | 4.6 | 0.267 | 6.67 | 0.16 | 0.27 | 14 | 7 |

According to FIGS. 20 to 25, the light-emitting device 1 has better emission efficiency including current efficiency, external quantum efficiency, and the like than the comparative light-emitting devices 1 and 2.

Figure 26:
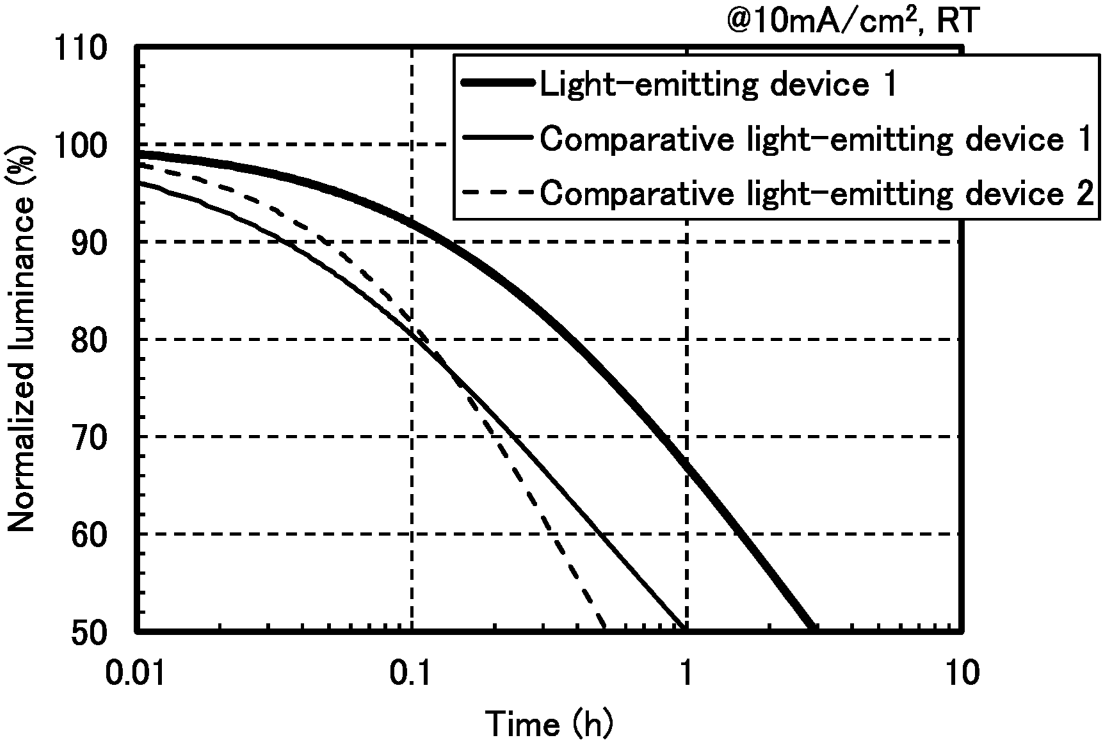
FIG. 26 is a graph showing time dependence of normalized luminance of the light-emitting device 1, the comparative light-emitting device 1, and the comparative light-emitting device 2.

FIG. 26 shows results of measuring luminance as a function of driving time at the time of constant-current driving at a current density of 10 $mA/cm^2$. According to FIG. 26, the light-emitting device 1 achieves a lifetime approximately three times as long as the comparative light-emitting device 1 and approximately six times as long as the comparative light-emitting device 2.

Figure 27:
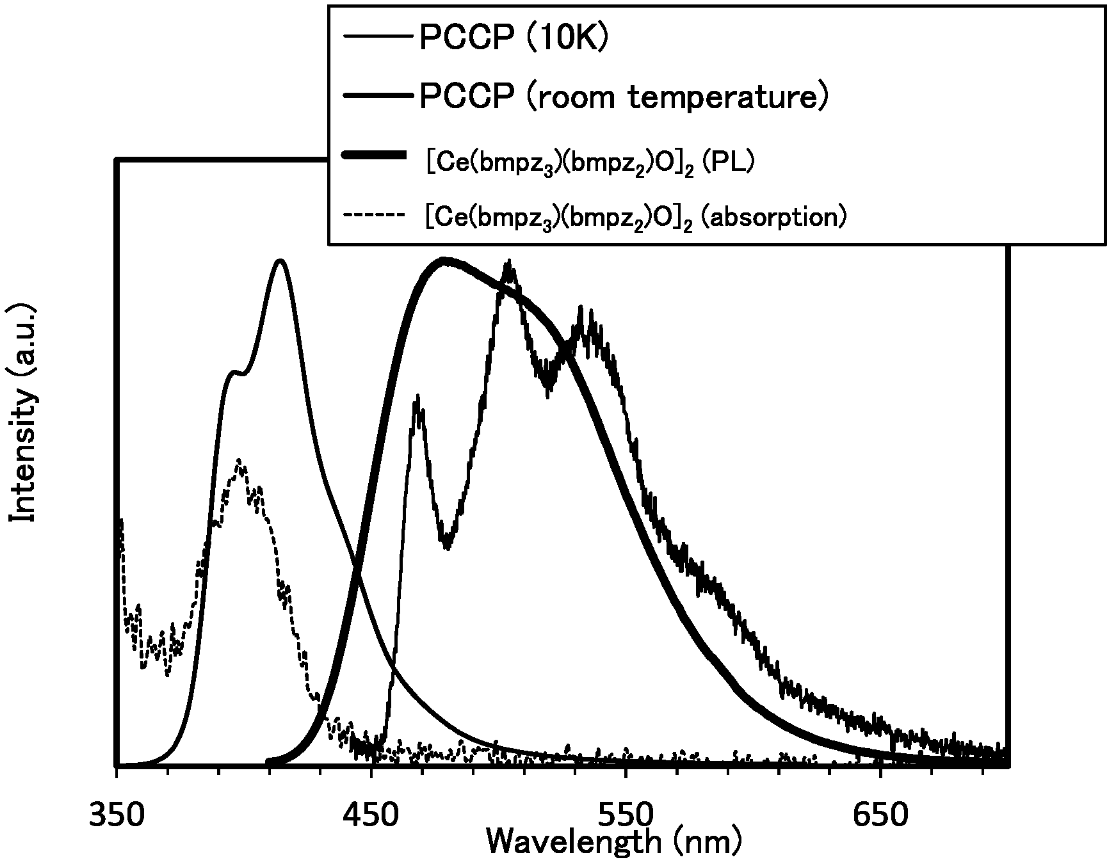
FIG. 27 is a graph showing an absorption spectrum and a photoluminescence (PL) spectrum (at room temperature) of a light-emitting substance of the light-emitting device 1, and PL spectra (at room temperature and 10 K) of a host material of the light-emitting device 1.
Figure 28:
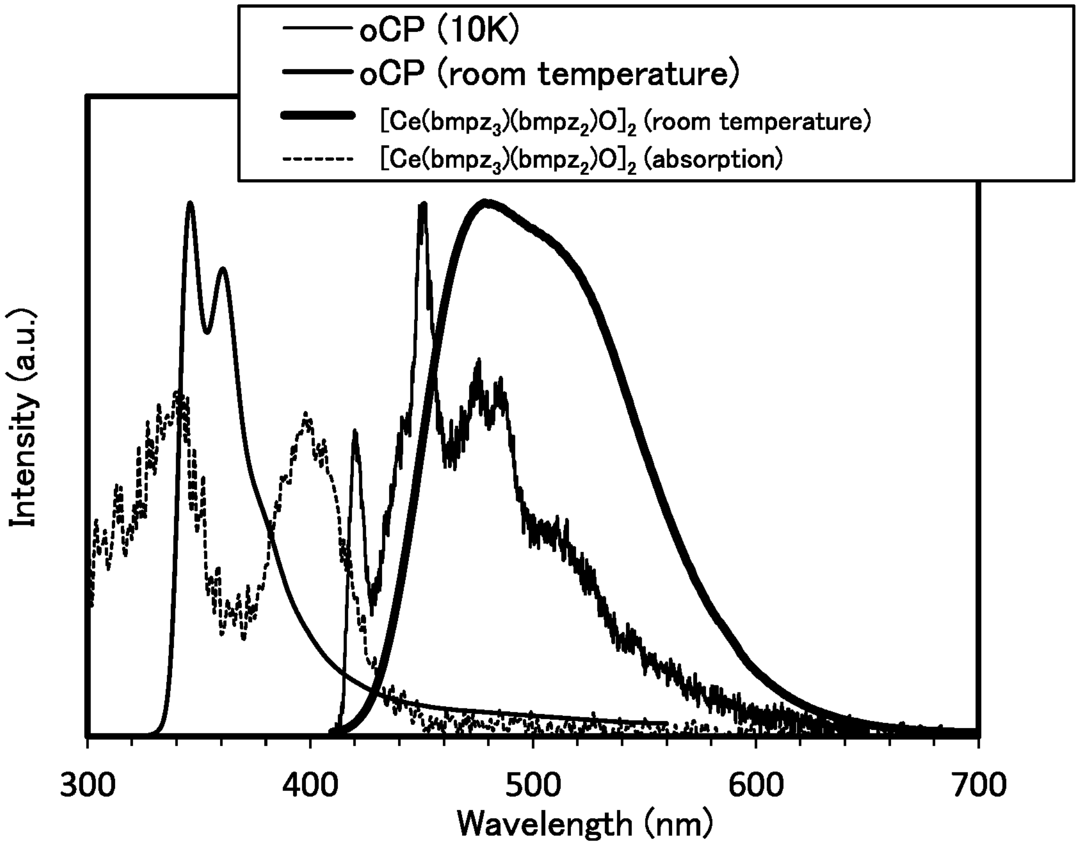
FIG. 28 is a graph showing an absorption spectrum and a photoluminescence (PL) spectrum (at room temperature) of a light-emitting substance of the comparative light-emitting device 1, and PL spectra (at room temperature and 10 K) of a host material of the comparative light-emitting device 1.
Figure 29:
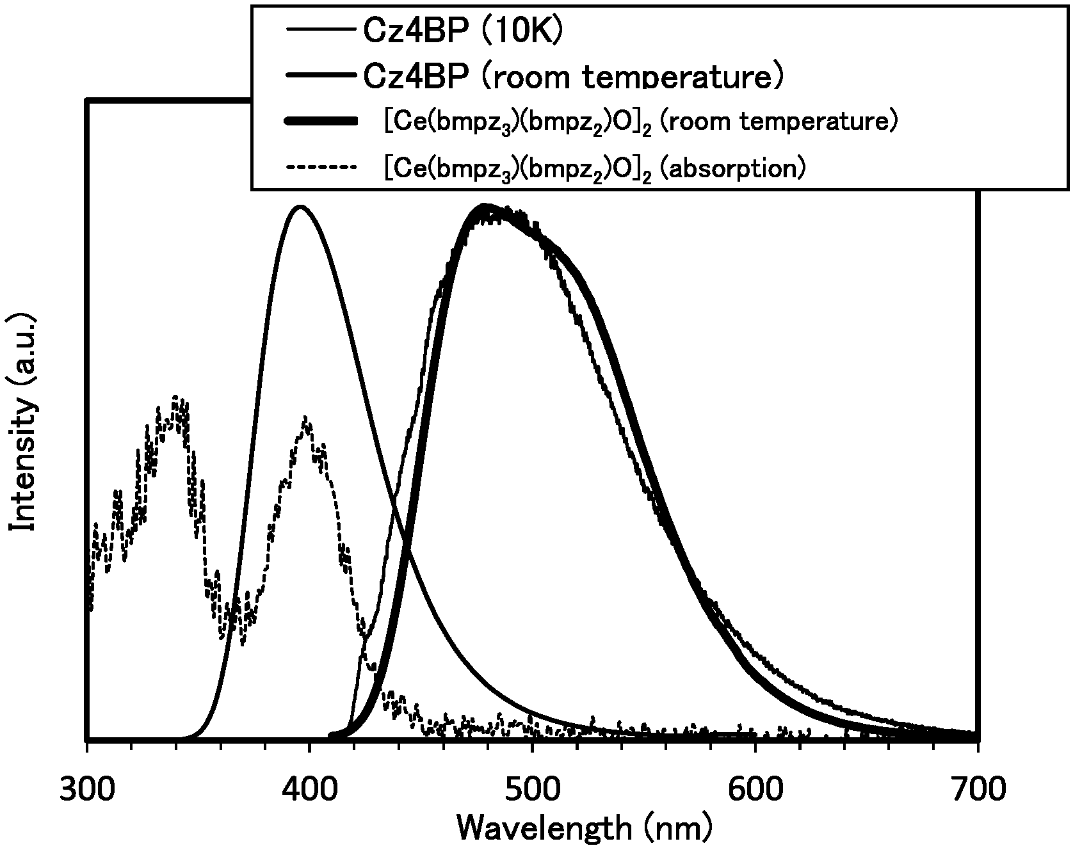
FIG. 29 is a graph showing an absorption spectrum and a photoluminescence (PL) spectrum (at room temperature) of a light-emitting substance of the comparative light-emitting device 2, and PL spectra (at room temperature and 10 K) of a host material of the comparative light-emitting device 2.

FIG. 27 shows an absorption spectrum and a photoluminescence (PL) spectrum at room temperature of a light-emitting substance of the light-emitting device 1 and PL spectra at room temperature and 10 K of a host material of the light-emitting device 1. Similarly, FIG. 28 shows spectra of a material used in the light-emitting layer of the comparative light-emitting device 1, and FIG. 29 shows spectra of a material used in the light-emitting layer of the comparative light-emitting device 2. Note that all of these spectra were measured with the materials in a thin-film state (50-nm-thick evaporated film). An ultraviolet-visible spectrophotometer, U-4100 (produced by Hitachi High-Technologies Corporation) was used for measuring the absorption spectrum; a spectrofluorometer, FP-8600DS (produced by JASCO Corporation) was used for measuring the fluorescent spectrum; and a PL microscope, LabRAM HR-PL (produced by HORIBA, Ltd.) was used for measuring the phosphorescent spectrum.

According to FIG. 27, in the light-emitting device 1, the emission spectrum (fluorescent spectrum) of $[Ce(bmpz_3)(bmpz_2)O]_2$ that is the light-emitting substance at room temperature exhibits the emission edge on the short wavelength side (431 nm) that is located at a shorter wavelength than the emission edge on the short wavelength side (456 nm) of the emission spectrum (phosphorescent spectrum) of PCCP of a host material at 10 K and is located at a longer wavelength than the emission edge on the short wavelength side (378 nm) of the emission spectrum (fluorescent spectrum) of PCCP at room temperature. The energy of the emission edge on the short wavelength side of the fluorescent spectrum can be regarded as the energy of D* level or $S_1$ level of the organic compound, and the energy of the emission edge on the short wavelength side of the phosphorescent spectrum can be regarded as the energy of the $T_1$ level of the organic compound. In other words, in the light-emitting device 1, the D* level of the light-emitting substance (431 nm, corresponding to 2.88 eV) is lower than the $S_1$ level of the host material (378 nm, corresponding to 3.28 eV) and higher than the $T_1$ level of the host material (456 nm, corresponding to 2.72 eV).

Furthermore, in the light-emitting device 1, the absorption spectrum of $[Ce(bmpz_3)(bmpz_2)O]_2$ that is the light-emitting substance exhibits the absorption edge (432 nm) that is located at a shorter wavelength than the emission edge on the short wavelength side (456 nm) of the emission spectrum (phosphorescent spectrum) of PCCP of the host material at 10 K and is located at a longer wavelength than the emission edge on the short wavelength side (378 nm) of the emission spectrum (fluorescent spectrum) of PCCP at room temperature. The energy of the emission edge on the short wavelength side of the fluorescent spectrum can be regarded as the energy of the D* level or $S_1$ level of the organic compound, the energy of the absorption edge on the long wavelength side of the absorption spectrum can be regarded as the energy of D* level or $S_1$ level of the organic compound, and the energy of the emission edge on the short wavelength side of the phosphorescent spectrum can be regarded as the energy of $T_1$ level of the organic compound. In other words, in the light-emitting device 1, the D* level of the light-emitting substance (432 nm, corresponding to 2.87 eV) is lower than the $S_1$ level of the host material (378 nm, corresponding to 3.28 eV) and higher than the $T_1$ level of the host material (456 nm, corresponding to 2.72 eV).

The wavelength (or energy) at the emission edge of the phosphorescent spectrum or the fluorescent spectrum can be calculated as the intersection of the base line and a tangent to the phosphorescent or fluorescent spectrum at the point where the slope of the spectrum on a shorter wavelength side than the shortest-wavelength peak is the steepest. Similarly, the wavelength (or energy) of the absorption edge can be calculated as the intersection of the base line and a tangent to the absorption spectrum at the point where the slope of the spectrum on a longer wavelength side than the longest-wavelength peak is most negative. When the spectrum contains noise, smoothed or fitted data may be used for the calculation.

Figure 30A:
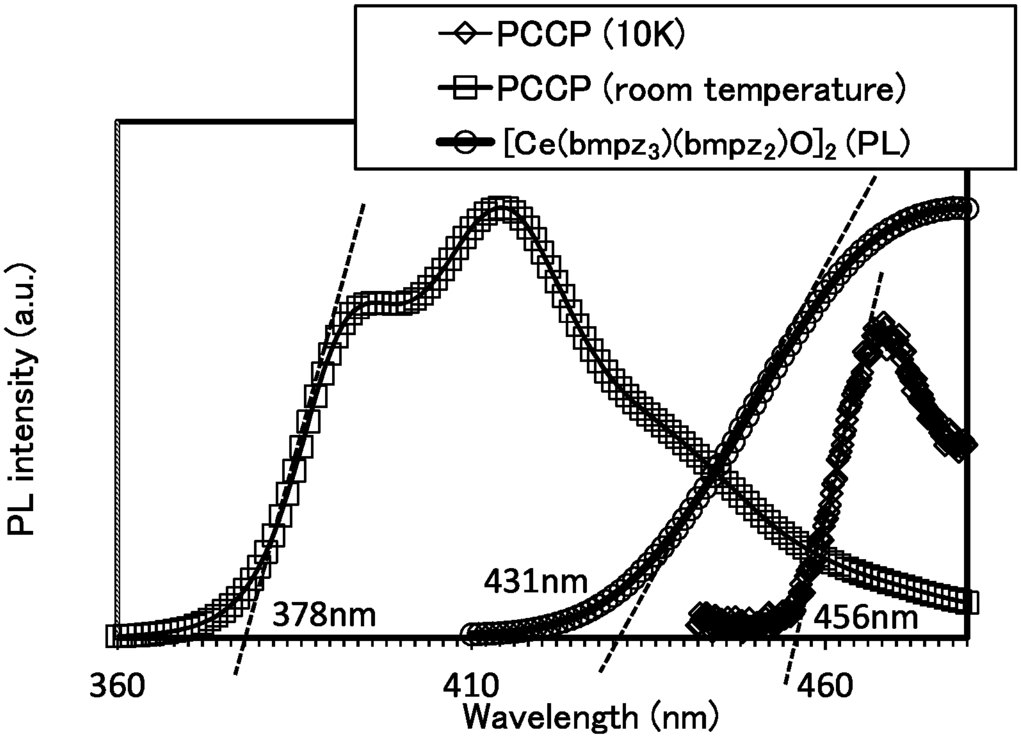
FIGS. 30A and 30B show a method for calculating a $S_1$ level, a $T_1$ level, and a D* level.
Figure 30B:
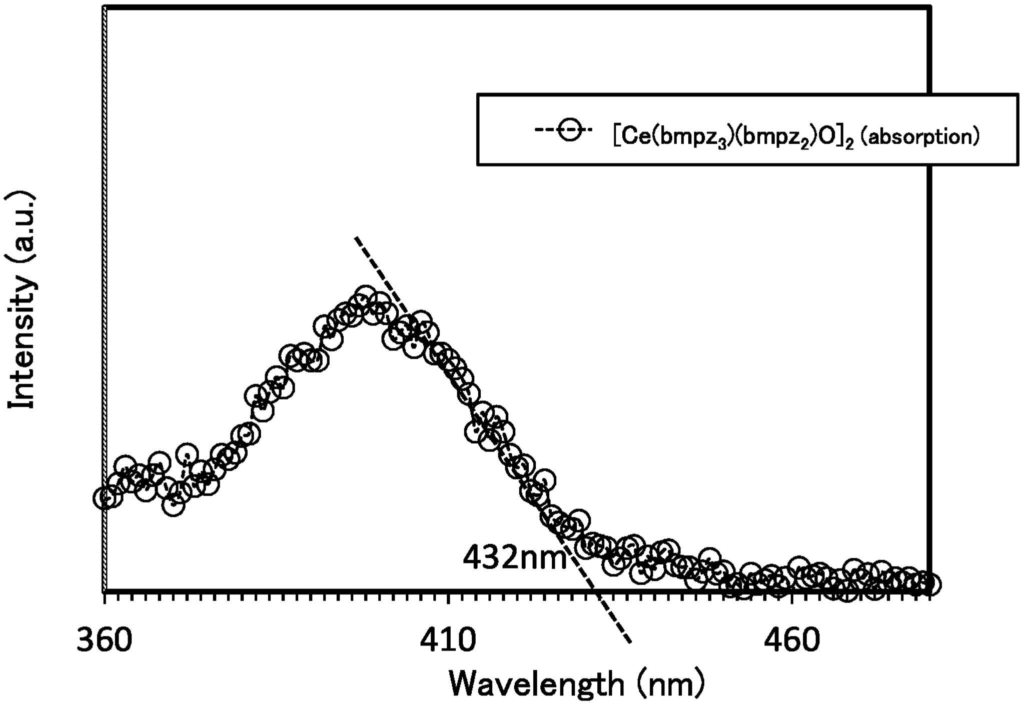

Specific examples of drawing a tangent to the spectrum shown in FIG. 27 are shown in FIGS. 30A and 30B. A tangent is drawn at a point on a phosphorescent or fluorescent spectrum where the slope of the crest line on the short wavelength side of a peak is the steepest. The wavelength at a point where the tangent and the horizontal axis intersect with each other corresponds to the emission edge of the phosphorescent spectrum or the fluorescent spectrum. From the wavelength value, the $T_1$ level or the $S_1$ level can be calculated. For example, in the case of the PCCP fluorescent spectrum (PCCP (room temperature)) shown in FIG. 30A, a tangent is drawn at a point where the slope of the spectrum on the shorter wavelength side than the shortest-wavelength-side peak (395 nm) is steepest, and a point where the tangent and the horizontal axis intersect with each other (378 nm) is regarded as the emission edge. From this value, 378 nm, the $S_1$ level of PCCP can be determined to be 3.28 eV. Similarly, in the case of the PCCP phosphorescent spectrum (PCCP (10 K)), a tangent is drawn at a point where the slope of the spectrum on the shorter wavelength side than the shortest-wavelength-side peak (466 nm) is steepest, and a point where the tangent and the horizontal axis intersect with each other (456 nm) is regarded as the emission edge. From this value, 456 nm, the $T_1$ level of PCCP can be determined to be 2.72 eV. Similarly, in the case of the fluorescent spectrum of $[Ce(bmpz_3)(bmpz_2)O]_2$ ($[Ce(bmpz_3)(bmpz_2)O]_2$), a tangent is drawn at the point where the slope of the spectrum on the shorter wavelength side than the shortest-wavelength-side peak (481 nm) is steepest, and a point where the tangent and the horizontal axis intersect with each other (431 nm) is regarded as the emission edge. From this value, 431 nm, the D* level of $[Ce(bmpz_3)(bmpz_2)O]_2$ can be determined to be 2.88 eV.

The wavelength at an absorption edge of an absorption spectrum can be calculated as the intersection of the base line and a tangent at the point to the absorption spectrum where the slope of the spectrum on a longer wavelength side than the longest-wavelength peak or shoulder peak is most negative. For example, in the case of the absorption spectrum of $[Ce(bmpz_3)(bmpz_2)O]_2$ ($[Ce(bmpz_3)(bmpz_2)O]_2$ (absorption)) shown in FIG. 30B, a tangent is drawn at the point where the slope of the spectrum on a longer wavelength side than the longest-wavelength peak (400 nm) is most negative, and the intersection (432 nm) of the tangent and the horizontal axis is regarded as the emission edge. Form this value, 432 nm, the D* level of $[Ce(bmpz_3)(bmpz_2)O]_2$ can be determined.

According to FIG. 28, in the comparative light-emitting device 1, the emission spectrum (fluorescent spectrum) of $[Ce(bmpz_3)(bmpz_2)O]_2$ that is the light-emitting substance at room temperature exhibits the emission edge on the short wavelength side (431 nm) that is located at a longer wavelength than the emission edge on the short wavelength side (414 nm) of the emission spectrum (phosphorescent spectrum) of oCP of the host material at 10 K and the emission edge on the short wavelength side (337 nm) of the emission spectrum (fluorescent spectrum) of oCP at room temperature. In other words, in the comparative light-emitting device 1, the D* level of the light-emitting substance (431 nm, corresponding to 2.88 eV) is lower than the $S_1$ level (337 nm, corresponding to 3.68 eV) and the $T_1$ level (414 nm, corresponding to 2.99 eV) of the host material.

Furthermore, in the comparative light-emitting device 1, the absorption spectrum of $[Ce(bmpz_3)(bmpz_2)O]_2$ of the light-emitting substance exhibits the absorption edge (432 nm) that is located at a longer wavelength than the emission edge on the short wavelength side (414 nm) of the emission spectrum (phosphorescent spectrum) of oCP of the host material at 10 K and the emission edge on the short wavelength side (337 nm) of the emission spectrum (fluorescent spectrum) of oCP at room temperature. In other words, in the comparative light-emitting device 1, the D* level of the light-emitting substance (432 nm, corresponding to 2.87 eV) is lower than the $S_1$ level (337 nm, corresponding to 3.68 eV) and the $T_1$ level (414 nm, corresponding to 2.99 eV) of the host material.

According to FIG. 29, in the comparative light-emitting device 2, the emission spectrum (fluorescent spectrum) of $[Ce(bmpz_3)(bmpz_2)O]_2$ that is the light-emitting substance at room temperature exhibits the emission edge on the short wavelength side (431 nm) that is located at a longer wavelength than the emission edge on the short wavelength side (417 nm) of the emission spectrum (phosphorescent spectrum) of Cz4BP of the host material at 10 K and the emission edge on the short wavelength side (360 nm) of the emission spectrum (fluorescent spectrum) of Cz4BP at room temperature. In other words, in the comparative light-emitting device 2, the D* level of the light-emitting substance (431 nm, corresponding to 2.88 eV) is lower than the $S_1$ level (360 nm, corresponding to 3.44 eV) and the $T_1$ level (417 nm, corresponding to 2.97 eV) of the host material.

Furthermore, in the comparative light-emitting device 2, the absorption spectrum of $[Ce(bmpz_3)(bmpz_2)O]_2$ of the light-emitting substance exhibits the absorption edge (432 nm) that is located at a longer wavelength than the emission edge on the short wavelength side (417 nm) of the emission spectrum (phosphorescent spectrum) of Cz4BP of the host material at 10 K and the emission edge on the short wavelength side (360 nm) of the emission spectrum (fluorescent spectrum) of Cz4BP at room temperature. In other words, in the comparative light-emitting device 2, the D* level of the light-emitting substance (432 nm, corresponding to 2.87 eV) is lower than the $S_1$ level (360 nm, corresponding to 3.44 eV) and the $T_1$ level (417 nm, corresponding to 2.97 eV) of the host material.

As described above, the light-emitting device 1 that is the light-emitting device of one embodiment of the present invention has such a structure that the $S_1$ level of the host material is higher and the $T_1$ level thereof is lower than the D* level of a substance causing light emission from a doublet excited state, which allows a host material whose excited energy is not too high to be used. Thus, the light-emitting device 1 was able to have better reliability than the comparative light-emitting devices 1 and 2.

Example 2

In this example, fabrication methods and characteristics of light-emitting devices 2 to 4 of one embodiment of the present invention will be described in detail. Structural formulae of organic compounds used for the light-emitting devices 2 to 4 are shown below.

[Chemical Formula 10]

(i)

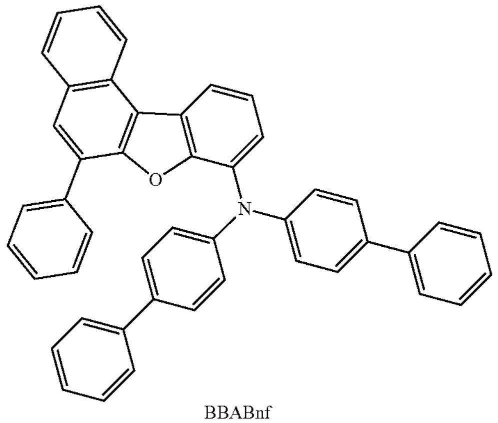

BBABnf (ii)

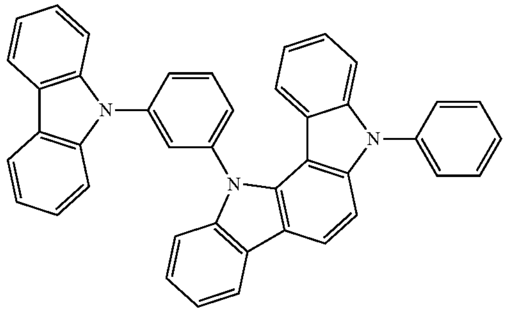

MCzPICz (iii)

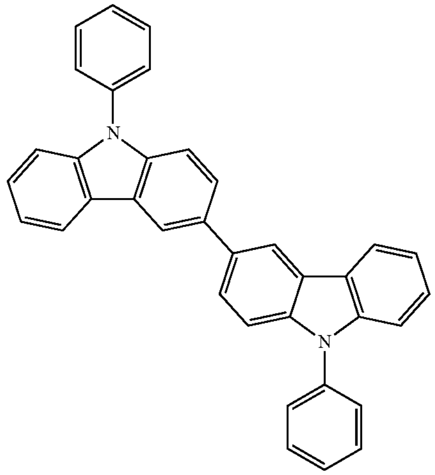

PCCP

-continued (iv)

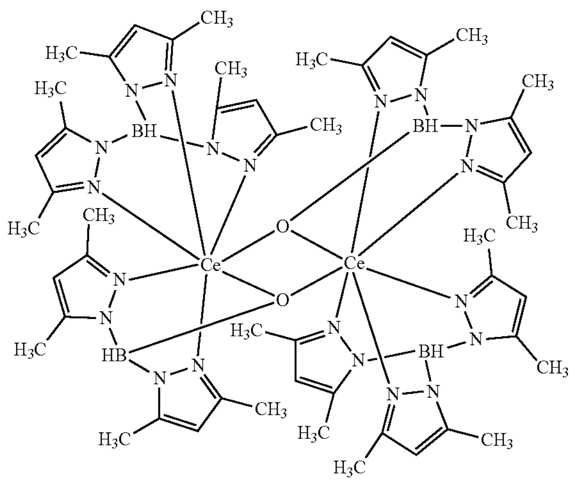

[Ce9bmpz$_3$)(bmpz$_2$)O]$_2$ (v)

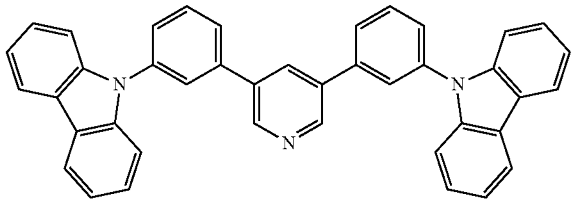

3,5DCzPPY (vi)

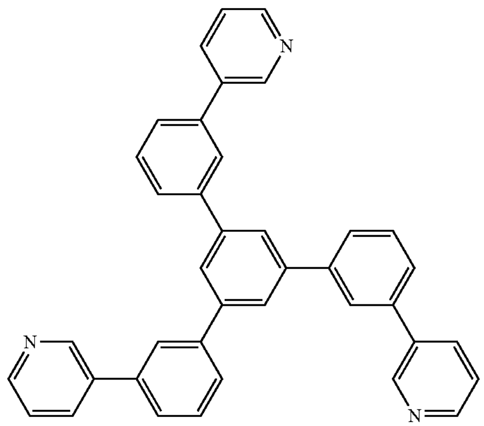

TmPyPB

-continued (ix)

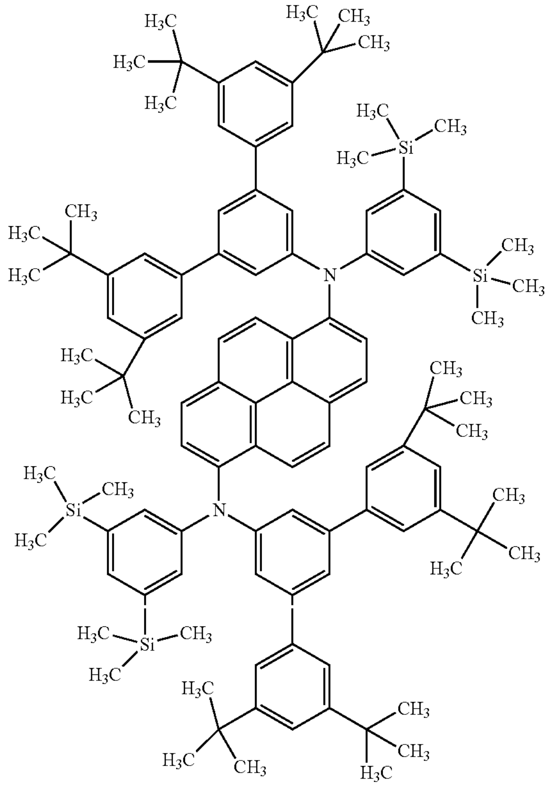

1,6mmtBuTMSDPhAPm-02

(x)

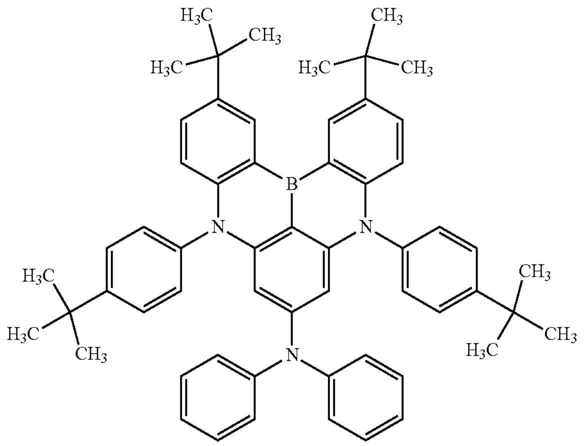

DPhA-tBu4DABNA (Fabrication Method of Light-Emitting Device 2)

First, indium tin oxide containing silicon oxide (ITSO) was deposited over a glass substrate to a thickness of 70 nm by a sputtering method, so that the first electrode 101 having a size of 2 mm×2 mm was formed. Note that the ITSO served as an anode.

Then, pretreatment for formation of the light-emitting device over the substrate was performed by washing the substrate surface with water.

After that, the substrate was transferred into a vacuum evaporation apparatus where the pressure was reduced to approximately $1\times10^{-4}$ Pa, and was subjected to vacuum baking at 170° C. for 30 minutes in a heating chamber of the vacuum evaporation apparatus and then, the substrate was cooled down for approximately 30 minutes.

Next, the substrate was fixed to a holder provided in the vacuum evaporation apparatus such that the side on which the first electrode 101 was formed faced downward. Then, N,N-bis(4-biphenyl)-6-phenylbenzo[b]naphtho[1,2-d]furan-8-amine (abbreviation: BBABnf) represented by Structural Formula (i) above and a fluorine (four or more atoms)-containing electron acceptor material (OCHD-003) with a molecular weight of 672 were deposited by co-evaporation over the first electrode 101 to a thickness of 10 nm such that the weight ratio of BBABnf to OCHD-003 was 1:0.1; thus, the hole-injection layer 111 was formed.

Over the hole-injection layer 111, BBABnf was deposited by evaporation to a thickness of 25 nm and 12-[3-(9H-carbazol-9-yl)phenyl]-5,12-dihydro-5-phenyl-indolo[3,2-a]carbazole (abbreviation: mCzPICz) represented by Structural Formula (ii) above was subsequently deposited by evaporation to a thickness of 10 nm, so that the hole-transport layer 112 was formed.

Next, over the hole-transport layer, 3,3'-bis(9-phenyl-9H-carbazole) (abbreviation: PCCP) represented by Structural Formula (iii) above, di-μ-oxobis[bis(3,5-dimethyl-1H-pyrazolato-κN1)hydroborato(1-)-κN2,κN2']bis[tris(3,5-dimethyl-1H-pyrazolato-κN1)hydroborato(1-)-κN2,κN2',κN2'']dicerium(III) (abbreviation: $[Ce(bmpz_3)(bmpz_2)O]_2$), and N,N'-bis(3,5-di-trimethylsilyl)-N,N'-bis[3,5-bis(3,5-di-tert-butylphenyl)phenyl]pyrene-1,6-diamine (abbreviation: 1,6mmtBuTMSDPhAPrn-02) represented by Structural Formula (ix) above were deposited by co-evaporation to a thickness of 35 nm with a weight ratio of PCCP to $[Ce(bmpz_3)(bmpz_2)O]2$ to 1,6mmtBuTMSDPhAPrn-02 being 1:0.1:0.01, so that the light-emitting layer 113 was formed.

After that, 3,5-bis[3-(9H-carbazol-9-yl)phenyl]pyridine (abbreviation: 35DCzPPy) represented by Structural Formula (v) above was deposited by evaporation to a thickness of 10 nm and 1,3,5-tri[(3-pyridyl)-phenyl-3-yl]benzene (abbreviation: TmPyPB) represented by Structural Formula (vi) above was then deposited by evaporation to a thickness of 15 nm, so that the electron-transport layer 114 was formed.

Then, lithium fluoride (LiF) was deposited by evaporation to a thickness of 1 nm to form the electron-injection layer 115. Aluminum (Al) was deposited by evaporation to a thickness of 200 nm to form the second electrode 102. Through the above, the light-emitting device 2 of one embodiment of the present invention was formed.

Then, the light-emitting device was sealed using a glass substrate in a glove box containing a nitrogen atmosphere so as not to be exposed to the air. Specifically, a UV curable sealing material was applied to surround the device, only the sealing material was irradiated with UV while the light-emitting device was not irradiated with the UV, and heat treatment was performed at 80° C. under an atmospheric pressure for one hour. In this manner, the light-emitting device 2 was fabricated.

(Fabrication Method of Light-Emitting Device 3)

The light-emitting device 3 was fabricated in a manner similar to that for the light-emitting device 2 except that PCCP, $[Ce(bmpz_3)(bmpz_2)O]2$, and 2,12-di(tert-butyl)-5,9-di(4-tert-butylphenyl)-N,N'-diphenyl-5H,9H-[1,4]benzazaborino[2,3,4-kl]phenazaborin-7-amine (abbreviation: DPhA-tBu4DABNA) represented by Structural Formula (x) above were deposited by co-evaporation to a thickness of 35 nm with a weight ratio of PCCP to $[Ce(bmpz_3)(bmpz_2)O]_2$ to DPhA-tBu4DABNA being 1:0.1:0.01 to form the light-emitting layer 113.

(Fabrication Method of Light-Emitting Device 4)

The light-emitting device 4 was fabricated in a manner similar to that for the light-emitting device 2 except that PCCP and $[Ce(bmpz_3)(bmpz_2)O]_2$ were deposited by co-evaporation to a thickness of 35 nm with a weight ratio of PCCP to $[Ce(bmpz_3)(bmpz_2)O]_2$ being 1:0.1 to form the light-emitting layer 113.

Device structures of the light-emitting devices 2 to 4 are shown below.

TABLE 3

| | | Thickness (nm) | Light-emitting device 2 | Light-emitting device 3 | Light-emitting device 4 |
|---|---|---|---|---|---|
| Second electrode | | 200 | | Al | |
| Electron-injection layer | | 1 | | LiF | |
| Electron-transport layer | 2 | 15 | | TmPyPB | |
| | 1 | 10 | | 35DCzPPy | |
| Light-emitting layer | | 35 | | PCCP:$[Ce(bmpz_3)(bmpz_2)O]_2$:*2 (1:0.1:*3) | |
| Hole-tansport layer | 2 | 10 | | mCzPICz | |
| | 1 | 25 | | BBABnf | |
| Hole-injection layer | | 10 | | BBABnf:OCHD-003 (1:0.1) | |
| First electrode | | 70 | | ITSO | |

TABLE 4

| | *2 | *3 |
|---|---|---|
| Light-emitting device 2 | 1,6mmtBuTMSDPhAPrn-02 | 0.01 |
| Light-emitting device 3 | DPhA-tBu4DABNA | 0.01 |
| Light-emitting device 4 | NA | 0 |

Figure 31:
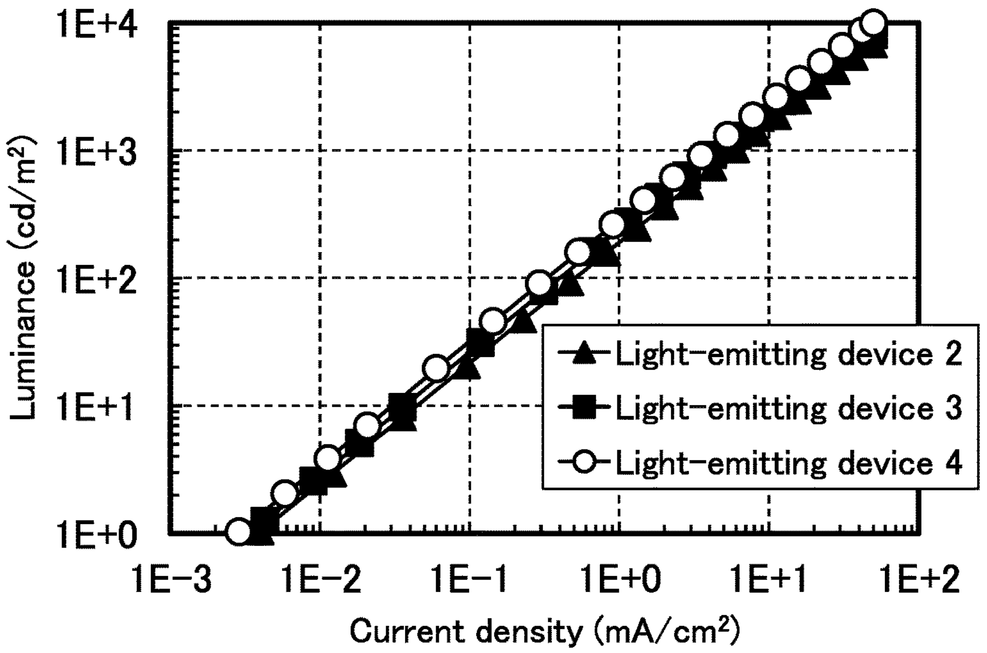
FIG. 31 is a graph showing luminance-current density characteristics of light-emitting devices 2 to 4.
Figure 32:
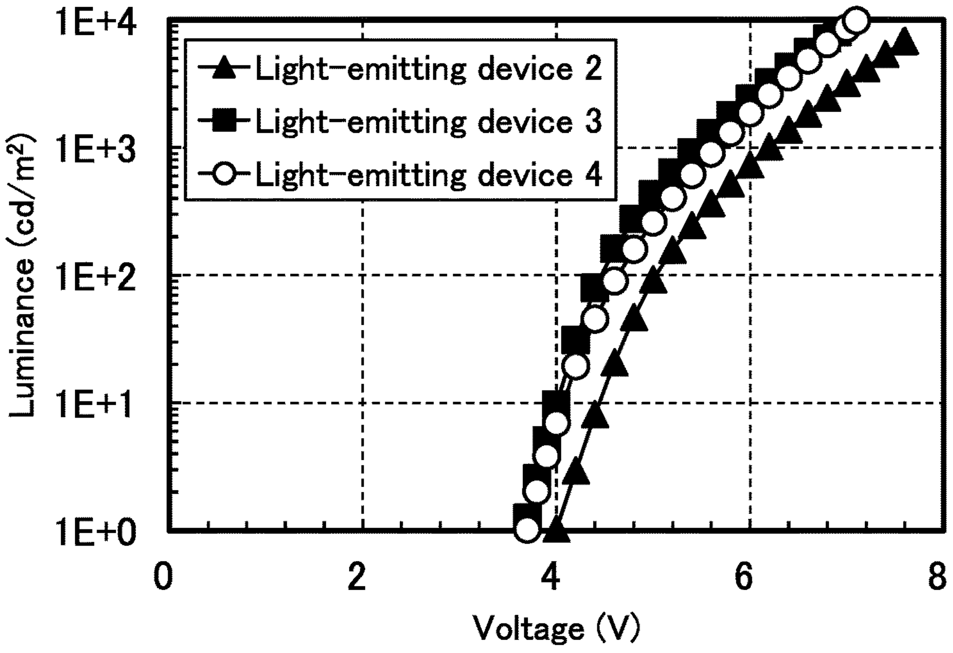
FIG. 32 is a graph showing luminance-voltage characteristics of the light-emitting devices 2 to 4.
Figure 33:
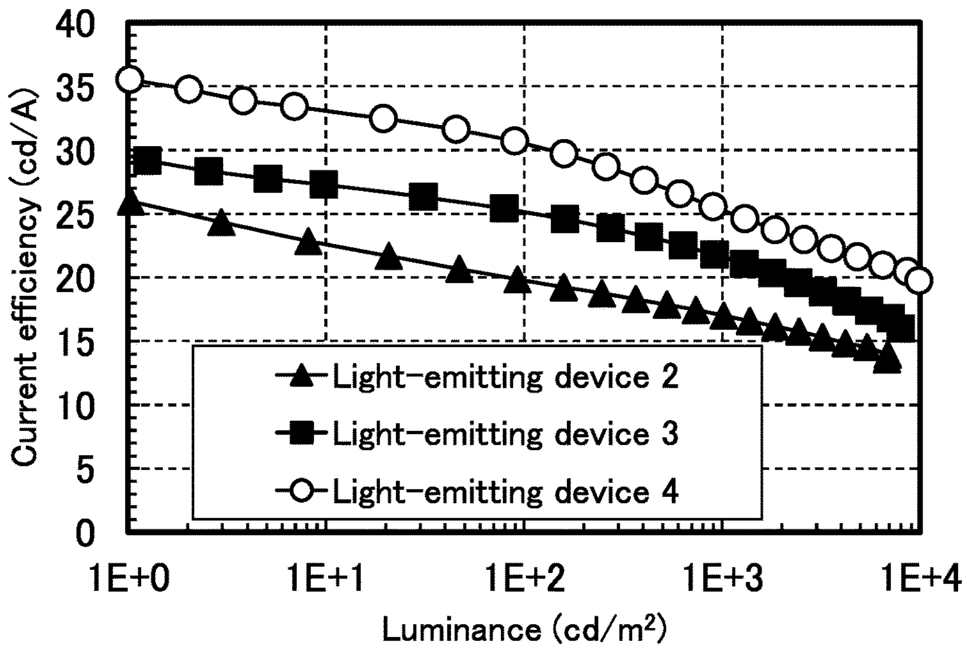
FIG. 33 is a graph showing current efficiency-luminance characteristics of the light-emitting devices 2 to 4.
Figure 34:
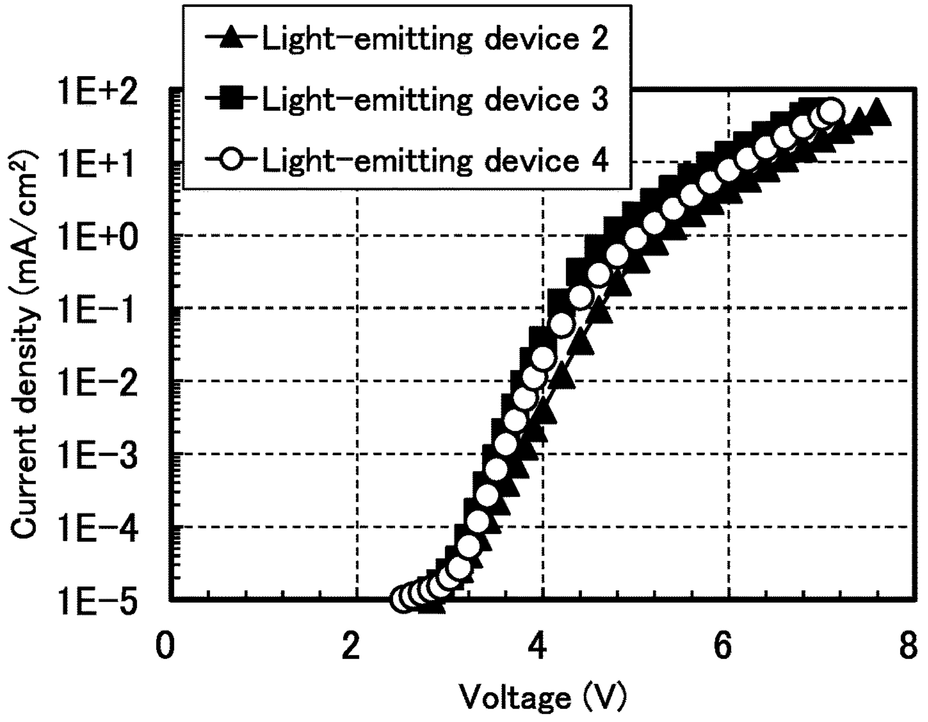
FIG. 34 is a graph showing current density-voltage characteristics of the light-emitting devices 2 to 4.
Figure 35:
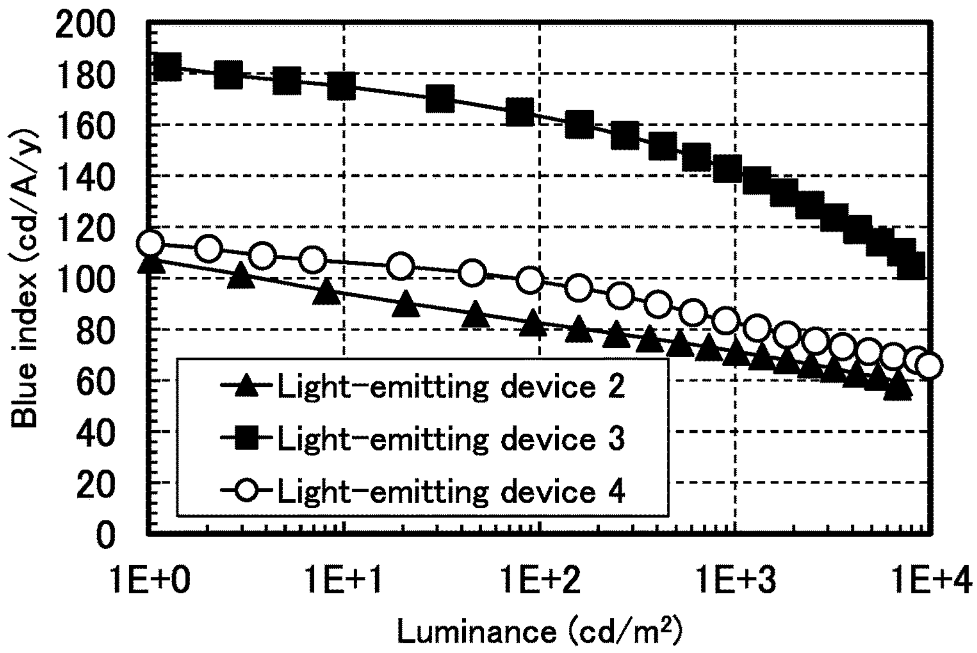
FIG. 35 is a graph showing blue index-luminance characteristics of the light-emitting devices 2 to 4.
Figure 36:
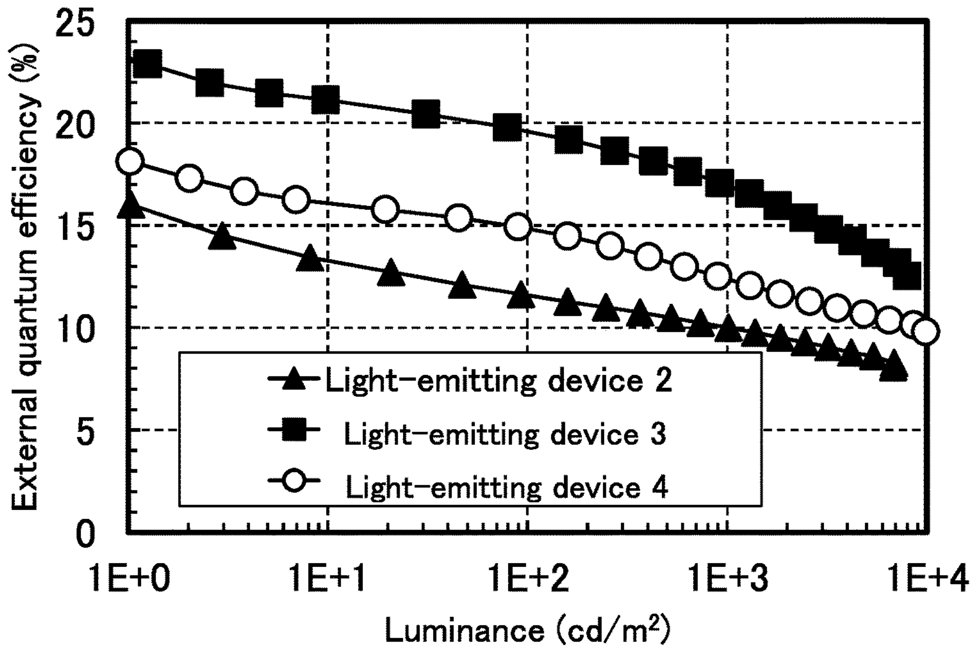
FIG. 36 is a graph showing external quantum efficiency-luminance characteristics of the light-emitting devices 2 to 4.
Figure 37:
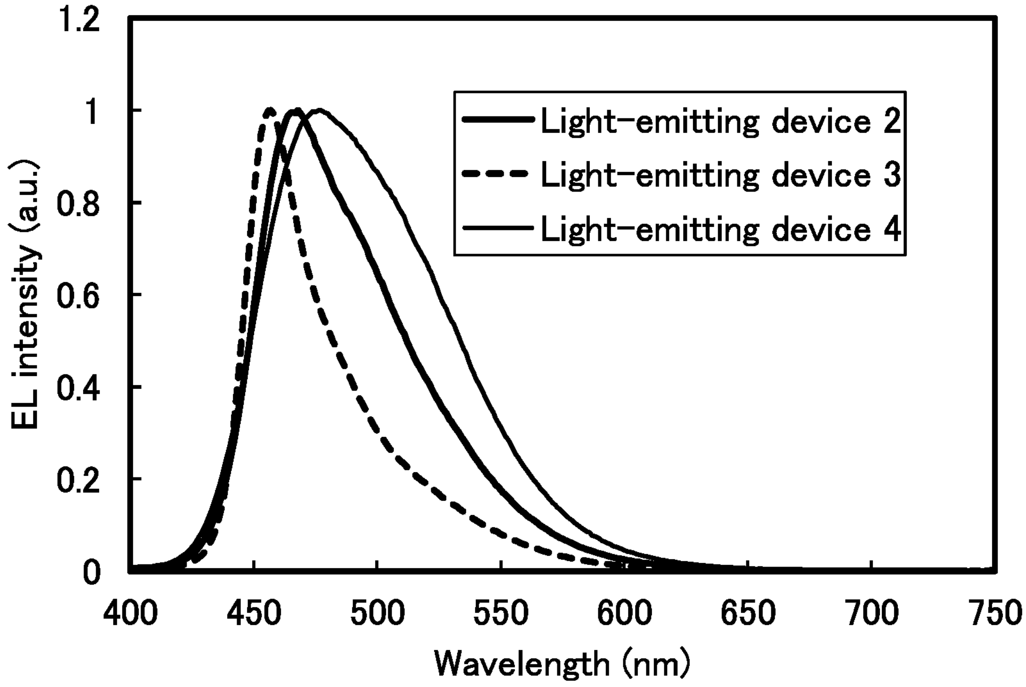
FIG. 37 shows emission spectra of the light-emitting devices 2 to 4.

FIG. 31 shows luminance-current density characteristics of the light-emitting devices 2 to 4. FIG. 32 shows luminance-voltage characteristics thereof. FIG. 33 shows current efficiency-luminance characteristics thereof. FIG. 34 shows current density-voltage characteristics thereof. FIG. 35 shows blue index-luminance characteristics. FIG. 36 shows external quantum efficiency-luminance characteristics thereof. FIG. 37 shows emission spectra thereof. The main values of the characteristics at around 1000 $cd/cm^2$ are shown below. The luminance, CIE chromaticity, and electroluminescence spectra were measured at room temperature with a spectroradiometer (SR-UL1R manufactured by TOPCON TECHNOHOUSE CORPORATION). The external quantum efficiency was calculated from the luminance and the electroluminescence spectra measured with the spectroradiometer, on the assumption that the light-emitting devices had isotropic (Lambertian) light-distribution characteristics.

TABLE 5

| | Voltage (V) | Current (mA) | Current density (mA/cm²) | Chromaticity x | Chromaticity y | Current efficiency (cd/A) | External quantum efficiency (%) | BI value (cd/A/y) |
|---|---|---|---|---|---|---|---|---|
| Light-emitting device 2 | 6.2 | 0.239 | 5.98 | 0.15 | 0.24 | 17 | 10 | 71 |
| Light-emitting device 3 | 5.4 | 0.169 | 4.22 | 0.15 | 0.15 | 22 | 17 | 143 |
| Light-emitting device 4 | 5.6 | 0.141 | 3.53 | 0.16 | 0.31 | 26 | 13 | 83 |

According to FIGS. 31 to 37, each of the light-emitting devices 2 to 4 has good characteristics.

Figure 38A:
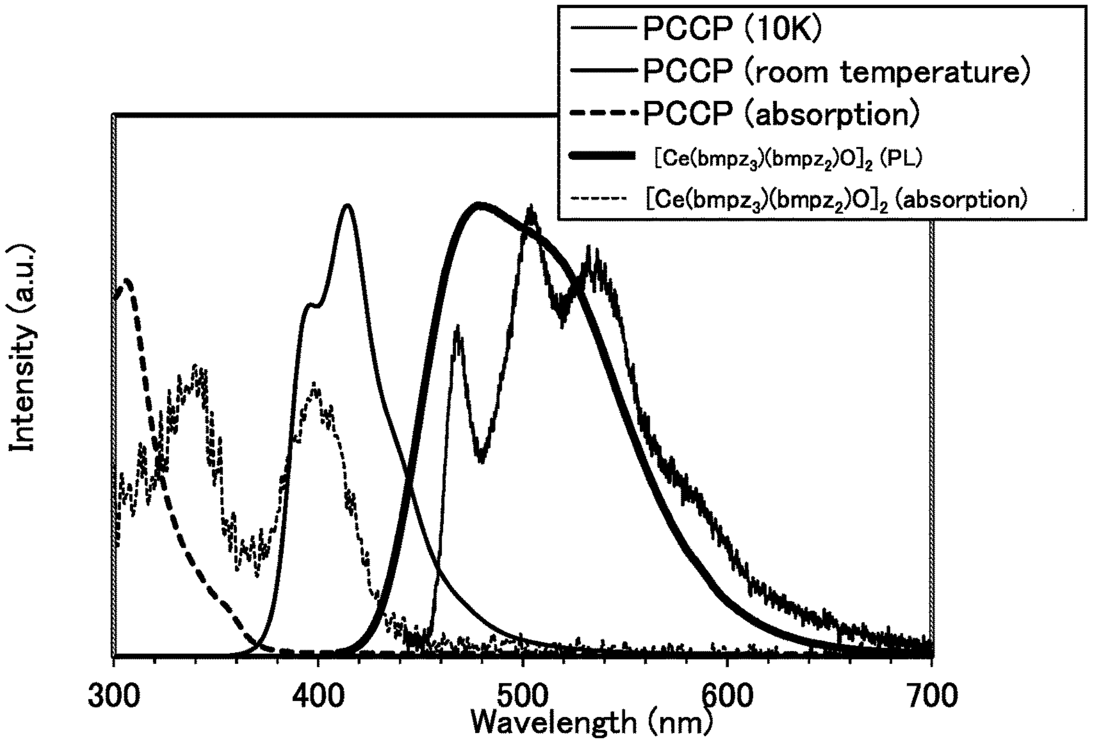
FIGS. 38A and 38B are graphs showing absorption spectra and photoluminescence (PL) spectra (at room temperature) of a light-emitting substance and an energy donor of the light-emitting device 2, and PL spectra (at room temperature and 10 K) of a host material of the light-emitting device 2.
Figure 38B:
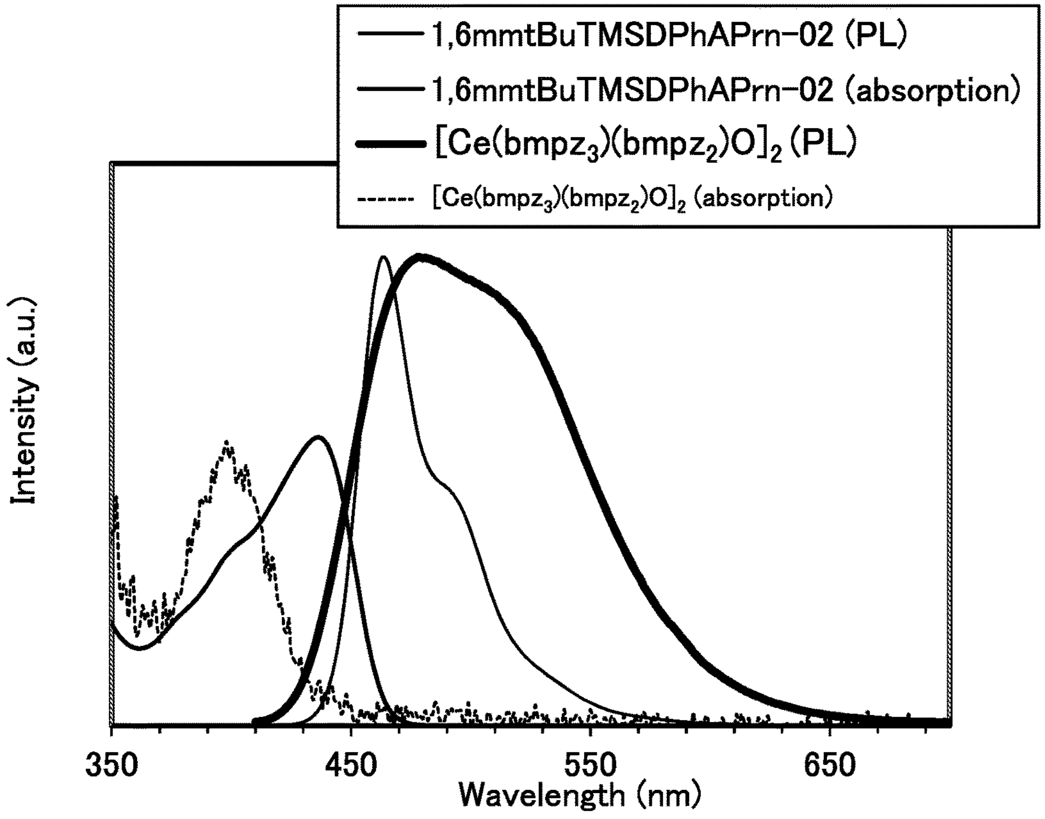
Figure 39A:
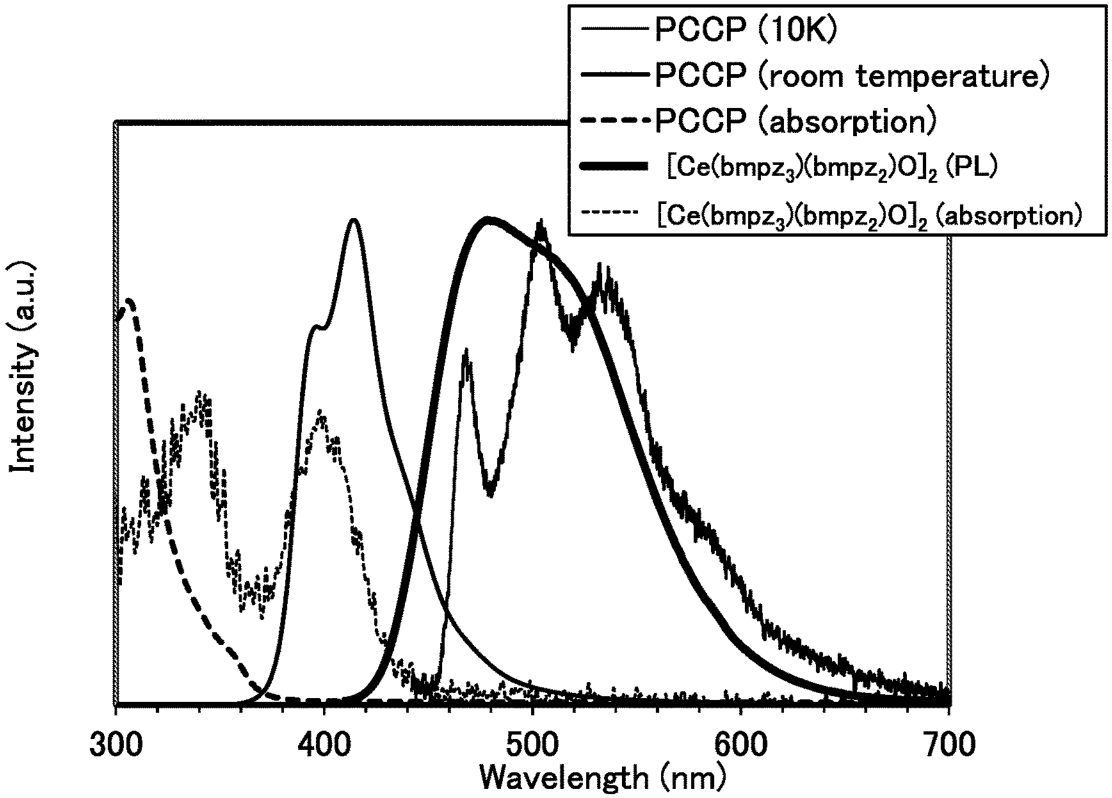
FIGS. 39A and 39B are graphs showing absorption spectra and photoluminescence (PL) spectra (at room temperature) of a light-emitting substance and an energy donor of the light-emitting device 3, and PL spectra (at room temperature and 10 K) of a host material of the light-emitting device 3.
Figure 39B:
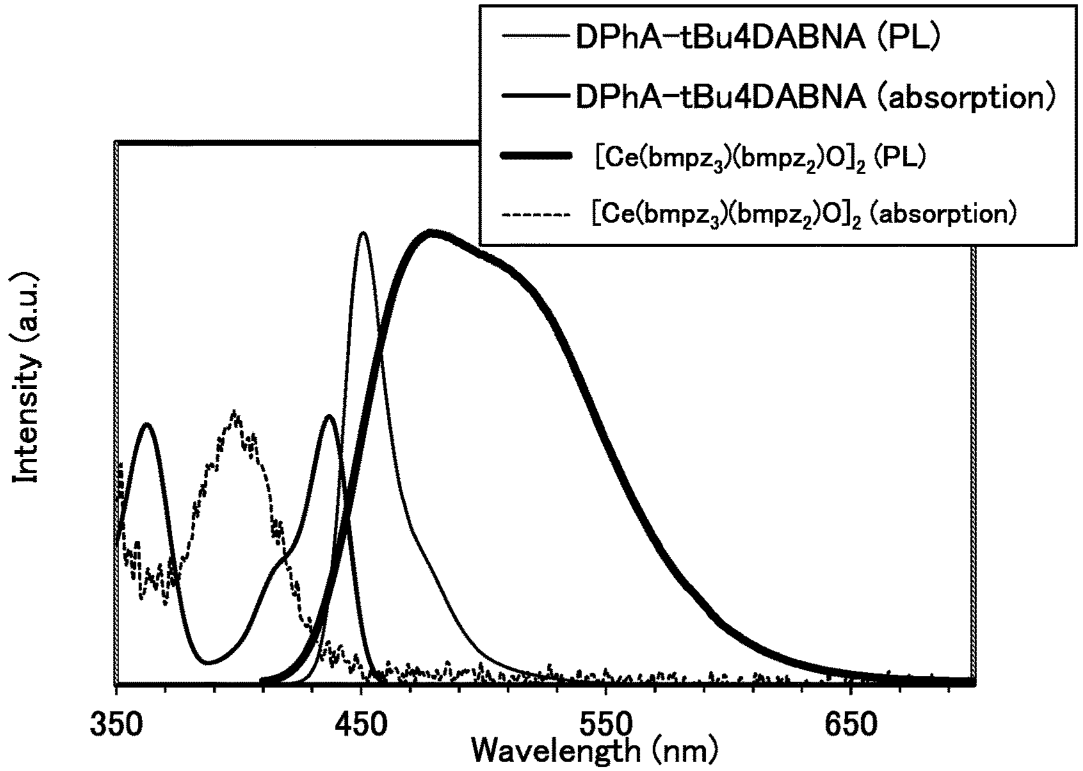
Figure 40:
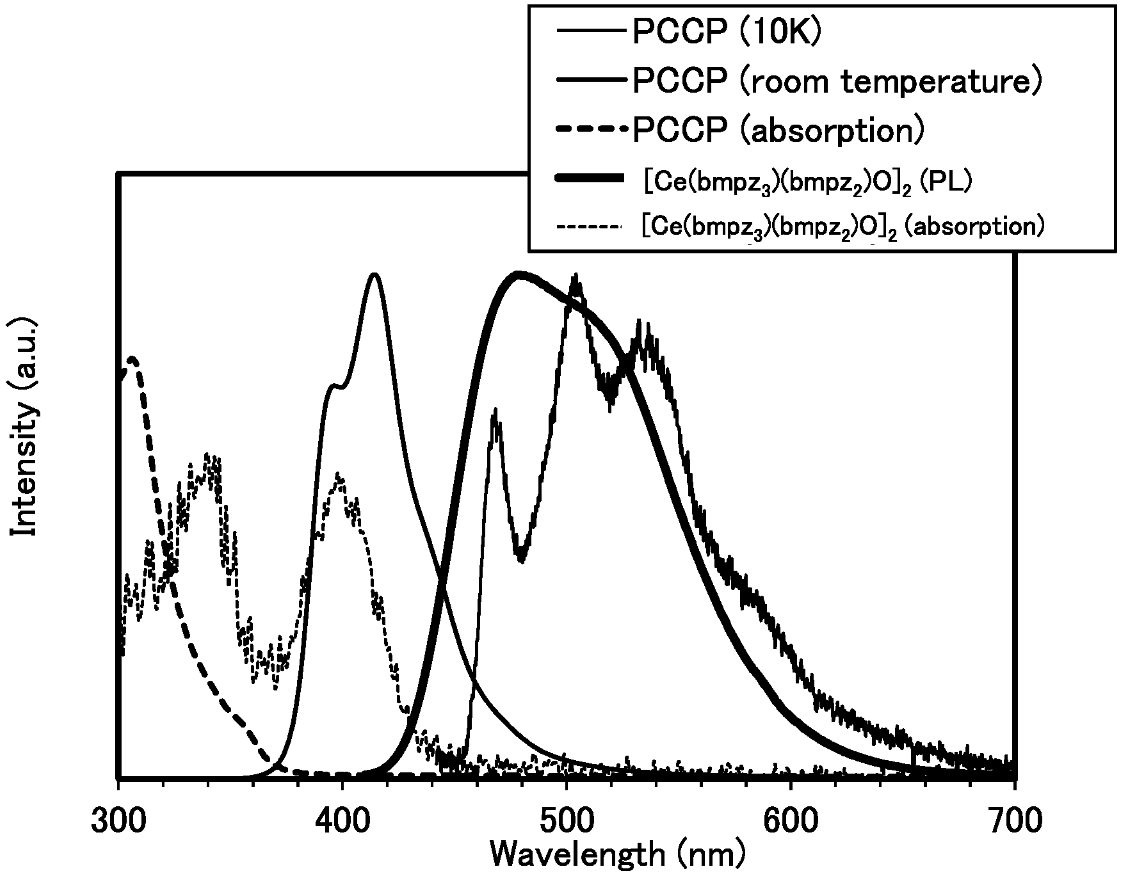
FIG. 40 is a graph showing an absorption spectrum and a photoluminescence (PL) spectrum (at room temperature) of a light-emitting substance of the light-emitting device 4, and PL spectra (at room temperature and 10 K) of a host material of the light-emitting device 4.

FIGS. 38A and 38B show the absorption spectrum and photoluminescence (PL) spectrum (room temperature) of the light-emitting substance and the PL spectra (room temperature and 10 K) of the host material used in the light-emitting device 2. FIGS. 39A and 39B show the absorption spectrum and PL spectrum (room temperature) of the light-emitting substance and the PL spectra (room temperature and 10 K) of the host material used in the light-emitting device 3. FIG. 40 shows the absorption spectrum and PL spectrum (room temperature) of the light-emitting substance and the PL spectra (room temperature and 10 K) of the host material used in the light-emitting device 4. For measuring the spectra, 1,6mmtBuTMSDPhAPrn-02 and DPhA-tBu4DABNA were each subjected to the measurement in a toluene solution, and the other materials were subjected to the measurement in a thin-film state (50-nm-thick evaporated film). In the absorption spectrum measurement, an ultraviolet-visible light spectrophotometer, V-550DS (produced by JASCO Corporation) was used for the solution state, and an ultraviolet-visible spectrophotometer, U-4100 (produced by Hitachi High-Tech Corporation) was used for the thin-film state. In the fluorescent spectrum measurement, a spectrofluorometer, FP-8600DS (produced by JASCO Corporation) was used, and in the phosphorescent spectrum measurement, a PL microscope, LabRAM HR-PL (produced by HORIBA, Ltd.) was used.

According to FIG. 38A, in the light-emitting device 2, the emission spectrum (fluorescent spectrum) of $[Ce(bmpz_3)(bmpz_2)O]_2$ that is an energy donor at room temperature exhibits the emission edge on the short wavelength side (431 nm) that is located at a shorter wavelength than the emission edge on the short wavelength side (456 nm) of the emission spectrum (phosphorescent spectrum) of PCCP in the host material at 10 K and at a wavelength longer than the emission edge on the short wavelength side (378 nm) of the emission spectrum (fluorescent spectrum) of PCCP at room temperature. According to FIG. 38B, the emission spectrum (fluorescent spectrum) of 1,6mmtBuTMSDPhAPrn-02 that is the light-emitting substance at room temperature exhibits the emission edge on the short wavelength side at 443 nm that is located at a longer wavelength than the emission edge on the short wavelength side (431 nm) of the emission spectrum (fluorescent spectrum) of $[Ce(bmpz_3)(bmpz_2)O]_2$ at room temperature.

Furthermore, according to FIG. 38A, in the light-emitting device 2, the absorption spectrum of $[Ce(bmpz_3)(bmpz_2)O]_2$ of the energy donor exhibits the longest-wavelength absorption edge (432 nm) that is located at a shorter wavelength than the emission edge on the short wavelength side (456 nm) of the emission spectrum (phosphorescent spectrum) of PCCP in the host material at 10 K and at a longer wavelength than the longest-wavelength absorption edge (370 nm) of the absorption spectrum of PCCP. According to FIG. 38B, the absorption spectrum of 1,6mmtBuTMSDPhAPrn-02 that is the light-emitting substance exhibits the longest-wavelength absorption edge at 463 nm that is located at a longer wavelength than the longest-wavelength absorption edge (432 nm) of the absorption spectrum of $[Ce(bmpz_3)(bmpz_2)O]_2$.

Moreover, according to FIG. 38B, the longest-wavelength absorption edge of the absorption spectrum of 1,6mmtBuTMSDPhAPrn-02 is at 463 nm, and the emission edge on the short wavelength side of the PL spectrum (fluorescent spectrum) of $[Ce(bmpz_3)(bmpz_2)O]_2$ at room temperature is at 431 nm. Thus, the absorption of 1,6mmtBuTMSDPhAPrn-02 overlaps with the light emission of $[Ce(bmpz_3)(bmpz_2)O]_2$, which indicates that the excitation energy can be transferred efficiently from $[Ce(bmpz_3)(bmpz_2)O]_2$ that is the energy donor to 1,6mmtBuTMSDPhAPrn-02 that is the light-emitting substance. According to FIG. 37, the shape of the electroluminescence spectrum of the light-emitting device 2 is significantly different from that of the light-emitting device 4 including $[Ce(bmpz_3)(bmpz_2)O]_2$ as the light-emitting substance, which indicates that in the light-emitting device 2, 1,6mmtBuTMSDPhAPrn-02 emits light. Thus, the light-emitting device 2 was able to exhibit blue light emission with good color purity and a narrow-half-width spectrum.

Since the emission spectrum of $[Ce(bmpz_3)(bmpz_2)O]_2$ is broad, an overlap with the absorption of 1,6mmtBuTMSDPhAPrn-02 is large, and the energy can be transferred efficiently from $[Ce(bmpz_3)(bmpz_2)O]2$ to 1,6mmtBuTMSDPhAPrn-02. The PL spectrum of $[Ce(bmpz_3)(bmpz_2)O]_2$ that is the energy donor has a peak wavelength at 481 nm that is located at a wavelength longer than the peak wavelength of the light-emitting substance (464 nm). Thus, the light-emitting device 2 can drive with low voltages and have good reliability.

Table 6 shows the above-described wavelengths of the emission edges of the fluorescent, absorption, and phosphorescent spectra. Values obtained by converting the wavelengths into energies are also shown.

TABLE 6

| | Fluorescent spectrum | | Absorption spectrum | | Phosphorescent spectrum | |
|---|---|---|---|---|---|---|
| | Emission edge (nm) | Energy (eV) | Absorption edge (nm) | Energy (eV) | Emission edge (nm) | Energy (eV) |
| $[Ce(bmpz_3)(bmpz_2)O]_2$ | 431 | 2.88 | 432 | 2.87 | — | — |
| PCCP | 378 | 3.28 | 370 | 3.35 | 456 | 2.72 |
| 1,6mmtBuTMSDPhAPrn-02 | 443 | 2.80 | 463 | 2.68 | — | — |

The energy of the emission edge on the short wavelength side of the fluorescent spectrum or the energy of the absorption edge at the longest wavelength of the absorption spectrum can be regarded as the energy of the $D_1$ level or $S_1$ level of a compound. The energy on the short wavelength side of the phosphorescent spectrum can be regarded as the energy of the $T_1$ level of the compound.

In other words, according to Table 6, the $D_1$ level of $[Ce(bmpz_3)(bmpz_2)O]_2$ that is the energy donor is lower than the $S_1$ level and higher than the $T_1$ level of the host material in the light-emitting device 2. In addition, the absorption of 1,6mmtBuTMSDPhAPrn-02 that is the light-emitting substance overlaps with the light emission of $[Ce(bmpz_3)(bmpz_2)O]_2$, and thus, energy transfer from the energy donor to the light-emitting substance occurs efficiently in the light-emitting device 2. Since the energy donor is a substance causing light emission from a doublet excited state, only a singlet excited state of the light-emitting substance is generated in the energy transfer from the energy donor to the light-emitting substance. The substance causing light emission from the doublet excited state generates the doublet excited state at 100% when being subjected to current excitation. Thus, the light-emitting device 2 can have high emission efficiency. According to FIG. 36, the maximum value of the external quantum efficiency of the light-emitting device 2 exceeds 15%, which indicates that the light-emitting device 2 has high emission efficiency.

Although there is a little difference between values of the $S_1$ level estimated at the emission edge of the fluorescent spectrum and the $S_1$ level estimated at the absorption edge of the absorption spectrum, the difference is not so large that the magnitude correlation with the $D_1$ level of the light-emitting substance changes. Either value can be used for determination. When the $D_1$ level is compared with the $S_1$ level, values to be compared are preferably estimated by the same method.

According to FIG. 39A, in the light-emitting device 3, the emission spectrum (fluorescent spectrum) of $[Ce(bmpz_3)(bmpz_2)O]_2$ that is the energy donor at room temperature exhibits the emission edge on the short wavelength side (431 nm) that is located at a shorter wavelength than the emission edge on the short wavelength side (456 nm) of the emission spectrum (phosphorescent spectrum) of PCCP in the host material at 10 K and at a wavelength longer than the emission edge on the short wavelength side (378 nm) of the emission spectrum (fluorescent spectrum) of PCCP at room temperature. According to FIG. 39B, the emission spectrum (fluorescent spectrum) of DPhA-tBu4DABNA that is the light-emitting substance at room temperature exhibits the emission edge on the short wavelength side at 436 nm that is located at a longer wavelength than the emission edge on the short wavelength side (431 nm) of the emission spectrum (fluorescent spectrum) of $[Ce(bmpz_3)(bmpz_2)O]_2$ at room temperature.

Furthermore, in the light-emitting device 3, the absorption spectrum of $[Ce(bmpz_3)(bmpz_2)O]_2$ that is the energy donor exhibits the largest-wavelength absorption edge (432 nm) that is located at a shorter wavelength than the emission edge on the short wavelength side (456 nm) of the emission spectrum (phosphorescent spectrum) of PCCP in the host material at 10 K and at a longer wavelength than the longest-wavelength absorption edge (370 nm) of the absorption spectrum of PCCP. Moreover, the longest-wavelength absorption edge of the absorption spectrum of DPhA-tBu4DABNA that is the light-emitting substance is at 452 nm that is located at a longer wavelength than the longest-wavelength absorption edge (432 nm) of the absorption spectrum of $[Ce(bmpz_3)(bmpz_2)O]_2$.

According to FIG. 39B, the longest-wavelength absorption edge of the absorption spectrum of DPhA-tBu4DABNA is at 452 nm, and the emission edge on the short wavelength side of the PL spectrum (fluorescent spectrum) of $[Ce(bmpz_3)(bmpz_2)O]_2$ at room temperature is at 431 nm. Thus, the absorption of DPhA-tBu4DABNA overlaps with the light emission of $[Ce(bmpz_3)(bmpz_2)O]_2$, which indicates that the excitation energy can be transferred efficiently from $[Ce(bmpz_3)(bmpz_2)O]_2$ that is the energy donor to DPhA-tBu4DABN that is the light-emitting substance. According to FIG. 37, the shape of the electroluminescence spectrum of the light-emitting device 3 is significantly different from that of the light-emitting device 4 including $[Ce(bmpz_3)(bmpz_2)O]_2$ as the light-emitting substance, which indicates that in the light-emitting device 3, DPhA-tBu4DABNA emits light. Thus, the light-emitting device 3 was able to exhibit blue light emission with extremely favorable color purity and a narrow-half-width spectrum.

Since the emission spectrum of $[Ce(bmpz_3)(bmpz_2)O]_2$ is broad, an overlap with the absorption of DPhA-tBu4DABNA is large, and the energy can be transferred efficiently from $[Ce(bmpz_3)(bmpz_2)O]_2$ to DPhA-tBu4DABNA. The PL spectrum of $[Ce(bmpz_3)(bmpz_2)O]_2$ that is the energy donor has a peak wavelength at 481 nm that is located at a wavelength longer than the peak wavelength of the light-emitting substance (451 nm). Thus, the light-emitting device 3 can drive with low voltages and have good reliability.

Table 7 shows the above-described wavelengths of the emission edges of the fluorescent, absorption, and phosphorescent spectra. Values obtained by converting the wavelengths into energies are also shown.

TABLE 7

| | Fluorescent spectrum | | Absorption spectrum | | Phosphorescent spectrum | |
|---|---|---|---|---|---|---|
| | Emission edge (nm) | Energy (eV) | Absorption edge (nm) | Energy (eV) | Emission edge (nm) | Energy (eV) |
| $[Ce(bmpz_3)(bmpz_2)O]_2$ | 431 | 2.88 | 432 | 2.87 | — | — |
| PCCP | 378 | 3.28 | 370 | 3.35 | 456 | 2.72 |
| DPhA-tBu4DABNA | 436 | 2.84 | 452 | 2.74 | — | — |

In other words, according to Table 7, the $D_1$ level of $[Ce(bmpz_3)(bmpz_2)O]_2$ that is the energy donor is lower than the $S_1$ level and higher than the $T_1$ level of the host material in the light-emitting device 3. In addition, the absorption of DPhA-tBu4DABNA that is the light-emitting substance overlaps with the light emission of $[Ce(bmpz_3)(bmpz_2)O]_2$, and thus, energy transfer from the energy donor to the light-emitting substance occurs efficiently in the light-emitting device 3. Since the energy donor is a substance causing light emission from a doublet excited state, only a singlet excited state of the light-emitting substance is generated in the energy transfer from the energy donor to the light-emitting substance. The substance causing light emission from the doublet excited state generates the doublet excited state at 100% when being subjected to current excitation. Thus, the light-emitting device 3 can have high emission efficiency. According to FIG. 36, the maximum value of the external quantum efficiency of the light-emitting device 3 exceeds 20%, which indicates that the light-emitting device 3 has high emission efficiency. The light-emitting device 3 exhibits a higher blue index than the light-emitting device 4. This is because use of the energy donor forming a doublet excited state and the fluorescent light-emitting substance whose emission spectrum has a narrow half width enables blue light emission with high external quantum efficiency, low CIE chromaticity y, and high color purity. Therefore, the light-emitting device 3 is suitable for blue pixels of a display.

According to FIG. 40, in the light-emitting device 4, the emission spectrum (fluorescent spectrum) of $[Ce(bmpz_3)(bmpz_2)O]_2$ at room temperature exhibits the emission edge on the short wavelength side (431 nm) that is located at a shorter wavelength than the emission edge on the short wavelength side (456 nm) of the emission spectrum (phosphorescent spectrum) of PCCP that is the host material at 10 K and at a wavelength longer than the emission edge on the short wavelength side (378 nm) of the emission spectrum (fluorescent spectrum) of PCCP at room temperature.

Furthermore, according to FIG. 40, in the light-emitting device 4, the absorption spectrum of $[Ce(bmpz_3)(bmpz_2)O]_2$ exhibits the longest-wavelength absorption edge (432 nm) that is located at a shorter wavelength than the emission edge on the short wavelength side (456 nm) of the emission spectrum (phosphorescent spectrum) of PCCP in the host material at 10 K and at a wavelength longer than the longest-wavelength absorption edge (370 nm) of the absorption spectrum of PCCP.

Table 8 shows the above-described wavelengths of the emission edges of the fluorescent, absorption, and phosphorescent spectra. Values obtained by converting the wavelengths into energies are also shown.

TABLE 8

| | Fluorescent spectrum | | Absorption spectrum | | Phosphorescent spectrum | |
|---|---|---|---|---|---|---|
| | Emission edge (nm) | Energy (eV) | Absorption edge (nm) | Energy (eV) | Emission edge (nm) | Energy (eV) |
| $[Ce(bmpz_3)(bmpz_2)O]_2$ | 431 | 2.88 | 432 | 2.87 | — | — |
| PCCP | 378 | 3.28 | 370 | 3.35 | 456 | 2.72 |

The energy of the emission edge on the short wavelength side of the fluorescent spectrum or the energy of the absorption edge at the longest wavelength of the absorption spectrum can be regarded as the energy of the $D_1$ level or $S_1$ level of a compound. The energy on the short wavelength side of the phosphorescent spectrum can be regarded as the energy of the $T_1$ level of the compound.

In other words, according to Table 8, the $D_1$ level of the light-emitting substance of the light-emitting device 4 is lower than the $S_1$ level and higher than the $T_1$ level of the host material.

Although there is a little difference between values of the $S_1$ level estimated at the emission edge of the fluorescent spectrum and the $S_1$ level estimated at the absorption edge of the absorption spectrum, the difference is not so large that the magnitude correlation with the $D_1$ level of the light-emitting substance changes. Either value can be used for determination. When the $D_1$ level is compared with the $S_1$ level, values to be compared are preferably estimated by the same method.

As described above, it is found that each of the light-emitting devices 2 to 4 that are one embodiment of the present invention is driven with low voltages and exhibits a good blue index. In addition, since in each of the light-emitting devices 2 to 4, the $S_1$ level of the host material can be higher than and the $T_1$ level can be lower than the $D_1$ level of the light-emitting substance, a host material whose excitation energy is not too high can be used. As a result, a highly reliable light-emitting device can be provided. In particular, each of the light-emitting devices 2 and 3 including $[Ce(bmpz_3)(bmpz_2)O]_2$ as the energy donor and the fluorescent light-emitting substance was able to exhibit blue light emission whose spectrum has a narrow half width and an emission peak wavelength at a shorter wavelength and color purity is favorable.

This application is based on Japanese Patent Application Serial No. 2022-173651 filed with Japan Patent Office on Oct. 28, 2022, the entire contents of which are hereby incorporated by reference.

What is claimed is:

1. A light-emitting device comprising:

a first electrode;

a second electrode; and a light-emitting layer between the first electrode and the second electrode, wherein the light-emitting layer comprises a first substance and a second substance, wherein the second substance causes light emission from a doublet excited state, and wherein an emission edge on a short wavelength side of a PL spectrum of the second substance at a room temperature is located at a shorter wavelength than an emission edge on a short wavelength side of a PL spectrum of a phosphorescent component in the first substance at a temperature within a range from 4 K to 77 K and is located at a longer wavelength than an emission edge on a short wavelength side of a PL spectrum of the first substance at the room temperature.

2. A light-emitting device comprising:

a first electrode;

a second electrode; and a light-emitting layer between the first electrode and the second electrode, wherein the light-emitting layer comprises a first substance and a second substance, wherein the second substance causes light emission from a doublet excited state, and wherein an absorption edge of an absorption spectrum of the second substance is located at a shorter wavelength than an emission edge on a short wavelength side of a PL spectrum of a phosphorescent component in the first substance at a temperature within a range from 4 K to 77 K and is located at a longer wavelength than an emission edge on a short wavelength side of a PL spectrum of the first substance at a room temperature.

3. A light-emitting device comprising:

a first electrode;

a second electrode; and a light-emitting layer between the first electrode and the second electrode, wherein the light-emitting layer comprises a first substance, a second substance, and a third substance, wherein the second substance causes light emission from a doublet excited state, wherein a doublet excited level of the second substance is lower than a singlet excited level of the first substance and higher than a triplet excited level of the first substance, wherein the third substance causes light emission from a singled excited state, wherein a singlet excited level of the third substance is lower than the doublet excited level of the second substance, and wherein emission is obtained from the third substance.

4. The light-emitting device according to claim 3, wherein a triplet excited level of the third substance is higher than the triplet excited level of the first substance.

5. A light-emitting device comprising:

a first electrode;

a second electrode; and a light-emitting layer between the first electrode and the second electrode, wherein the light-emitting layer comprises a first substance, a second substance, and a third substance, wherein the second substance causes light emission from a doublet excited state, wherein an emission edge on a short wavelength side of a PL spectrum of the second substance at a room temperature is located at a shorter wavelength than an emission edge on a short wavelength side of a PL spectrum of a phosphorescent component in the first substance at a temperature within a range from 4 K to 77 K and is located at a longer wavelength than an emission edge on a short wavelength side of a PL spectrum of the first substance at the room temperature, wherein the third substance causes light emission from a singlet excited state, wherein an emission edge on a short wavelength side of a PL spectrum of the third substance at the room temperature is located at a longer wavelength than the emission edge on the short wavelength side of the PL spectrum of the second substance at the room temperature, and wherein emission is obtained from the third substance.

6. The light-emitting device according to claim 5, wherein an emission edge on a short wavelength side of a PL spectrum of a phosphorescent component in the third substance at a temperature within a range from 4 K to 77 K is located at a shorter wavelength than the emission edge on the shorter wavelength side of the PL spectrum of the phosphorescent component in the first substance at a temperature within a range from 4K to 77 K.

7. The light-emitting device according to claim 1, wherein the second substance causes light emission from the doublet excited state based on f-d transition.

8. The light-emitting device according to claim 1, wherein the second substance is an organic complex containing trivalent cerium.

9. A display device comprising the light-emitting device according to claim 1.

10. An electronic device comprising:

the light-emitting device according to claim 1; and at least one of a sensor, an operation button, a speaker, and a microphone.

11. The light-emitting device according to claim 2, wherein the second substance causes light emission from the doublet excited state based on f-d transition.

12. The light-emitting device according to claim 2, wherein the second substance is an organic complex containing trivalent cerium.

13. A display device comprising the light-emitting device according to claim 2.

14. An electronic device comprising:

the light-emitting device according to claim 2; and at least one of a sensor, an operation button, a speaker, and a microphone.

15. The light-emitting device according to claim 3, wherein the second substance causes light emission from the doublet excited state based on f-d transition.

16. The light-emitting device according to claim 3, wherein the second substance is an organic complex containing trivalent cerium.

17. A display device comprising the light-emitting device according to claim 3.

18. An electronic device comprising: the light-emitting device according to claim 3; and at least one of a sensor, an operation button, a speaker, and a microphone.

* * * * *